(12) United States Patent
Lee et al.

(10) Patent No.: US 11,258,538 B2
(45) Date of Patent: Feb. 22, 2022

(54) INTELLIGENT CONTROLLER AND SENSOR NETWORK BUS, SYSTEM AND METHOD INCLUDING AN ERROR AVOIDANCE AND CORRECTION MECHANISM

(71) Applicant: Vulcan Technologies Shanghai Co., Ltd., Shanghai (CN)

(72) Inventors: Eugene Lee, San Jose, CA (US); Dongmei Wang, San Jose, CA (US); Ke Lu, Hangzhou (CN); Junti Yang, Hangzhou (CN)

(73) Assignee: Vulcan Technologies Shanghai Co., Ltd., Shanghai (CN)

( * ) Notice: Subject to any disclaimer, the term of this patent is extended or adjusted under 35 U.S.C. 154(b) by 0 days.

(21) Appl. No.: 17/066,915

(22) Filed: Oct. 9, 2020

(65) Prior Publication Data

US 2021/0036806 A1 Feb. 4, 2021

Related U.S. Application Data

(63) Continuation-in-part of application No. 16/863,898, filed on Apr. 30, 2020, which is a continuation-in-part of application No. 16/741,332, filed on Jan. 13, 2020, now Pat. No. 11,086,810, which is a continuation-in-part of application No. 16/653,558, filed on Oct. 15, 2019, which is a continuation-in-part of application No. 16/572,358, filed on Sep. 16, 2019, (Continued)

(51) Int. Cl.
*H04L 1/00* (2006.01)
*H03M 13/09* (2006.01)

(52) U.S. Cl.
CPC ........ *H04L 1/0063* (2013.01); *H03M 13/093* (2013.01); *H03M 13/098* (2013.01); *H04L 1/0076* (2013.01)

(58) Field of Classification Search
CPC ... H04L 1/0063; H04L 1/0076; H04L 1/1685; H04L 41/27; H03M 13/09; H03M 13/098; G06F 2213/40; G06F 13/20; G06F 13/40
See application file for complete search history.

(56) References Cited

U.S. PATENT DOCUMENTS 4,809,362 A 2/1989 Claus
5,423,006 A 6/1995 Brown
(Continued)

FOREIGN PATENT DOCUMENTS

CN 104378225 B 7/2018
GN 202331122 U 7/2012

OTHER PUBLICATIONS

The International Search Report with Written Opinion dated Feb. 19, 2021 for PCT Patent Appl No. PCT/US2020/053589.
(Continued)

*Primary Examiner* — Raymond N Phan
(74) *Attorney, Agent, or Firm* — Haverstock & Owens, A Law Corporation

(57) ABSTRACT

A machine automation system for controlling and operating an automated machine. The system includes a controller and sensor bus including a central processing core and a multi-medium transmission intranet for implementing a dynamic burst to broadcast transmission scheme where messages are burst from nodes to the central processing core and broadcast from the central processing core to all of the nodes.

46 Claims, 29 Drawing Sheets

Related U.S. Application Data now Pat. No. 11,089,140, which is a continuation-in-part of application No. 16/529,682, filed on Aug. 1, 2019, now Pat. No. 10,841,230.

(56) References Cited

U.S. PATENT DOCUMENTS

| | | | |
|---|---|---|---|
| 5,726,786 | A | 3/1998 | Heflinger |
| 5,978,578 | A | 11/1999 | Azarya et al. |
| 6,013,108 | A | 1/2000 | Karolys |
| 6,034,798 | A | 3/2000 | Oberg |
| 6,091,527 | A | 7/2000 | Brisse et al. |
| 6,356,968 | B1 | 3/2002 | Kishon |
| 7,440,697 | B1 | 10/2008 | Smuk |
| 7,484,008 | B1 | 1/2009 | Gelvin |
| 8,380,036 | B2 | 2/2013 | Smith |
| 9,071,352 | B2 | 6/2015 | Margaritis |
| 9,674,432 | B2 | 6/2017 | Masugi et al. |
| 10,812,194 | B2 | 10/2020 | Zhu |
| 10,841,230 | B1 | 11/2020 | Lee |
| 11,086,810 | B2 | 8/2021 | Li et al. |
| 11,089,140 | B2 | 8/2021 | Lee |
| 2002/0046309 | A1 | 4/2002 | Boesinger |
| 2002/0046380 | A1* | 4/2002 | Tomaru ............... H03M 13/35 714/751 |
| 2002/0109883 | A1 | 8/2002 | Schemmann |
| 2003/0135686 | A1 | 7/2003 | Vorbach et al. |
| 2004/0081178 | A1 | 4/2004 | Fujimori |
| 2007/0078736 | A1 | 4/2007 | Chand et al. |
| 2008/0107269 | A1 | 9/2008 | Gehrmann |
| 2010/0031297 | A1 | 2/2010 | Klein et al. |
| 2011/0142448 | A1 | 6/2011 | Zou |
| 2013/0250807 | A1 | 9/2013 | Dai |
| 2014/0297785 | A1 | 10/2014 | Galles |
| 2014/0304511 | A1 | 10/2014 | Lewis |
| 2014/0346532 | A1 | 11/2014 | Kim |
| 2015/0033305 | A1 | 1/2015 | Shear |
| 2015/0063368 | A1 | 3/2015 | Sharma |
| 2016/0057098 | A1 | 2/2016 | Han |
| 2016/0204849 | A1 | 7/2016 | Behroozi et al. |
| 2016/0359625 | A1 | 12/2016 | Tanizawa |
| 2017/0249099 | A1 | 8/2017 | Jun |
| 2017/0359128 | A1 | 12/2017 | Xi |
| 2019/0007234 | A1 | 1/2019 | Takada et al. |
| 2019/0052396 | A1* | 2/2019 | Skarby ............... H04L 1/1867 |
| 2019/0054834 | A1 | 2/2019 | Bardot |
| 2021/0034039 | A1 | 2/2021 | Lee |
| 2021/0034042 | A1 | 2/2021 | Lee |
| 2021/0034557 | A1 | 2/2021 | Lee et al. |
| 2021/0034564 | A1 | 2/2021 | Li et al. |
| 2021/0036806 | A1 | 2/2021 | Lee et al. |
| 2021/0037120 | A1 | 2/2021 | Lee |
| 2021/0056058 | A1 | 2/2021 | Lee et al. |
| 2021/0194724 | A1 | 6/2021 | Lee |

OTHER PUBLICATIONS

Kraus et al."Approach for an Optical Network Design for Autonomous Vehicles."ICTON 2019. Sep. 2019 Retrieved from the Internet:http://ieeexplore.ieee.org/document/8840176.

Kraus et al.,"Replace of the Controller Area Network (CAN) Protocol for Future Automotive Bus System Solutions by Substitution via Optical Networks," ICTON 2016.Aug. 25, 2016, Retrieve from the internet: https://ieeexplore.ieee.org/documents/7550335.

The International Search Report with Written Opinion dated Feb. 19, 2021 for PCT Patent Appl. No. PCT/US2021/013052.

Zhou et al., "Communication buses and protocols for sensor networks.", In Sensors. Jul. 4, 2002, Retrieved on Sep. 17, 2020 from<https://www.mdpi.com/1424-8220/2/7/244/pdf>entire document.

The Written Opinion and International Search Report for the International Application PCT/US2020/042894 dated Oct. 6, 2020.

The International Search Report with Written Opinion dated Nov. 30, 2020 for PCT Patent Appl. No PCT/US20/49935.

* cited by examiner

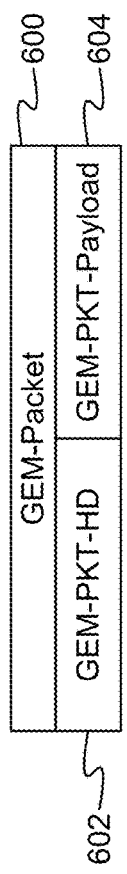

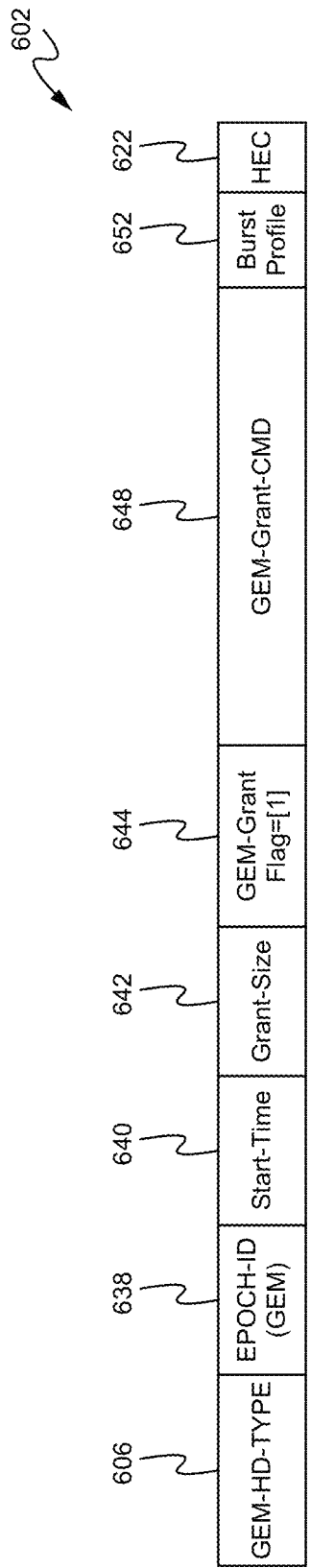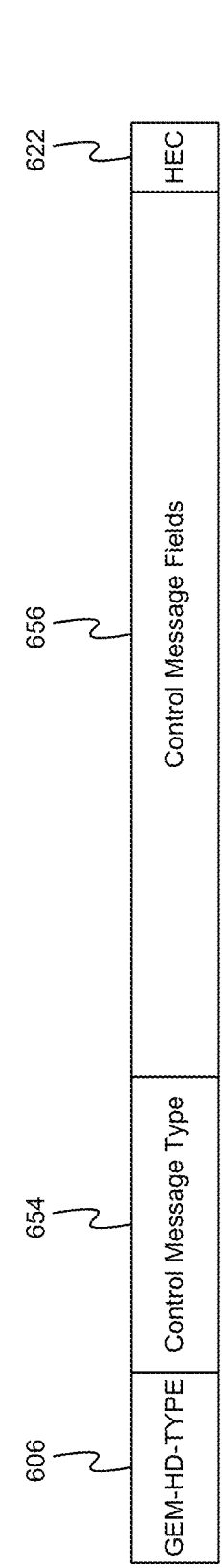
Fig. 6E
Fig. 6F

INTELLIGENT CONTROLLER AND SENSOR NETWORK BUS, SYSTEM AND METHOD INCLUDING AN ERROR AVOIDANCE AND CORRECTION MECHANISM

RELATED APPLICATIONS

This application is a continuation-in-part of the co-pending U.S. patent application Ser. No. 16/863,898, filed Apr. 30, 2020, entitled "INTELLIGENT CONTROLLER AND SENSOR NETWORK BUS, SYSTEM AND METHOD INCLUDING A MESSAGE RETRANSMISSION MECHANISM," which is a continuation-in-part of the co-pending U.S. patent application Ser. No. 16/741,332, filed Jan. 13, 2020, entitled "INTELLIGENT CONTROLLER AND SENSOR NETWORK BUS, SYSTEM AND METHOD INCLUDING MULTI-LAYER PLATFORM SECURITY ARCHITECTURE," which is a continuation-in-part of the co-pending U.S. patent application Ser. No. 16/653,558, filed Oct. 15, 2019, entitled "INTELLIGENT CONTROLLER AND SENSOR NETWORK BUS, SYSTEM AND METHOD INCLUDING SMART COMPLIANT ACTUATOR MODULE," which is a continuation-in-part of the co-pending U.S. patent application Ser. No. 16/572,358, filed Sep. 16, 2019, entitled "INTELLIGENT CONTROLLER AND SENSOR NETWORK BUS, SYSTEM AND METHOD INCLUDING GENERIC ENCAPSULATION MODE," which is a continuation-in-part of U.S. patent application Ser. No. 16/529,682, filed Aug. 1, 2019, entitled "INTELLIGENT CONTROLLER AND SENSOR NETWORK BUS, SYSTEM AND METHOD," all of which are hereby incorporated by reference.

FIELD OF THE INVENTION

The present invention relates to the field of buses. More particularly, the present invention relates to a controller and sensor network bus architecture.

BACKGROUND OF THE INVENTION

The field of machine automation is expanding rapidly with the development of self-driving cars, intelligent robots and factory automation. However, due to their varied and high-speed needs, there is no bus or network architecture that is able to efficient handle all of the demands of these emerging technologies. Instead, the current networks latency is high, bandwidth is low, cabling is complex, with large electromagnetic interference (EMI), high cost, unsecured data and complex system integration. For example, networks do not have enough speed and throughput to carry sensor data like camera and light detection and ranging (LIDAR) data across the network to CPU Cores. Further, existing cable systems are complex, short-reach, and cannot deal with EMI without expensive shielding due to the use of copper cabling systems. There is no all-in-one "Controller and Sensor Network" system Bus solution that can support and carry internet L2/L3 Ethernet packets, Motor & Motion control messages, sensor data and CPU-CMD across a system from edge node to edge nodes.

SUMMARY OF THE INVENTION

A machine automation system for controlling and operating an automated machine. The system includes a controller and sensor bus including a central processing core and a multi-medium transmission intranet for implementing a dynamic burst to broadcast transmission scheme where messages are burst from nodes to the central processing core and broadcast from the central processing core to all of the nodes.

A first aspect is directed to a machine automation system for controlling and operating an automated machine including transmitting packets each having one or more destinations. The system comprises a controller and sensor bus including one or more transmission networks each including a plurality of leaf nodes, the leaf nodes each including a node forward error correction (FEC) engine and a node memory, wherein each of the one or more destinations is one of the leaf nodes, at least one central processing core including one or more root ports and a plurality of virtual output queues that are each assigned to a different assigned one of the destinations, each of the root ports having a root FEC engine and a root memory storing a mini-frame table and a plurality of input/output ports each coupled with one of the leaf nodes and a plurality of external machine automation devices each coupled to one of the leaf nodes via one or more of the ports coupled with the one of the leaf nodes, wherein the central processing core receives the packets from the leaf nodes and adds the packets to the virtual output queues whose assigned one of the destinations matches one of the destinations of the packet, and further wherein the root FEC engine of one of the root ports combines a plurality of the packets into a payload of a single broadcast message, logically divides the payload into a plurality of mini-frames, each of the mini-frames including at least a portion of one or more of the plurality of the packets, populates the mini-frame table of the root port by, for each of the mini-frames, storing in the mini-frame table a unique mini-frame identifier paired with one or more node identifiers of the leaf nodes that are the destinations of the one or more of the plurality of the packets within the mini-frame, receives a mini-frame status message from at least one of the leaf nodes indicating which of the mini-frames had one or more uncorrectable FEC errors as received by the at least one of the nodes and suspends transmission of the packets within the virtual output queues whose assigned destination is one of the leaf nodes identified by the node identifiers paired with the unique mini-frame identifiers that identify one of the mini-frames having at least one of the uncorrectable FEC errors.

In some embodiments, the root FEC engine of the one of the root ports suspends filling with more packets of the virtual output queues whose assigned destination is the one of the leaf nodes identified by the node identifiers paired with the unique mini-frame identifiers that identify the one of the mini-frames having the at least one of the uncorrectable FEC errors. In some embodiments, the root FEC engine of the one of the root ports logically divides each of the mini-frames into a plurality of FEC blocks, applies an FEC algorithm to each of the FEC blocks and adds an FEC parity value to each of the FEC blocks resulting from the application of the FEC algorithm to that FEC block. In some embodiments, the root FEC engine of the one of the root ports selects the FEC algorithm from a plurality of stored FEC algorithms based on a quantity of packet data errors reported to the one of the root ports by the leaf nodes during a predetermined period.

In some embodiments, the root FEC engine of the one of the root ports applies a Cyclic Redundancy Check (CRC) algorithm to each of the mini-frames and adds a CRC value resulting from the application of the CRC algorithm to that mini-frame. In some embodiments, for each of the mini-frames, one of the FEC blocks to which the FEC algorithm was applied includes the CRC value such that errors in the CRC value are indicated by the FEC parity value of the one of the FEC blocks. In some embodiments, the node FEC engine of one of the leaf nodes: combines a set of additional packets into another payload of a single burst message; logically divides the another payload into a plurality of additional mini-frames, each of the additional mini-frames including at least a portion of one or more of the set of the additional packets; logically divides each of the additional mini-frames into a plurality of additional FEC blocks; applies another FEC algorithm to each of the additional FEC blocks; and adds another FEC parity value to each of the additional FEC blocks resulting from the application of the another FEC algorithm to that additional FEC block.

In some embodiments, the node FEC engine of the one of the leaf nodes selects the another FEC algorithm from the plurality of stored FEC algorithms based on a size of a burst window granted to the one of the leaf nodes by the core, the burst window being a time period within which the single burst message is able to be transmitted to the core. In some embodiments, the uncorrectable FEC errors are errors indicated by one of the FEC parity values that cannot be corrected using the one of the FEC parity values. In some embodiments, a payload of at least one of the packets is divided between two or more of the mini-frames. In some embodiments, a payload of at least one of the packets is divided between two or more of the FEC blocks of one of the mini-frames.

A second aspect is directed to a controller and sensor bus for receiving and transmitting packets each having one or more destinations. The bus comprises one or more transmission networks each including a plurality of leaf nodes, the leaf nodes each including a node forward error correction (FEC) engine and a node memory, wherein each of the one or more destinations is one of the leaf nodes and at least one central processing core including one or more root ports and a plurality of virtual output queues that are each assigned to a different assigned one of the destinations, each of the root ports having a root FEC engine and a root memory storing a mini-frame table, wherein the central processing core receives the packets from the leaf nodes and adds the packets to the virtual output queues whose assigned one of the destinations matches one of the destinations of the packet, and further wherein the root FEC engine of one of the root ports combines a plurality of the packets into a payload of a single broadcast message, logically divides the payload into a plurality of mini-frames, each of the mini-frames including at least a portion of one or more of the plurality of the packets, populates the mini-frame table of the root port by, for each of the mini-frames, storing in the mini-frame table a unique mini-frame identifier paired with one or more node identifiers of the leaf nodes that are the destinations of the one or more of the plurality of the packets within the mini-frame, receives a mini-frame status message from at least one of the leaf nodes indicating which of the mini-frames had one or more uncorrectable FEC errors as received by the at least one of the nodes and suspends transmission of the packets within the virtual output queues whose assigned destination is one of the leaf nodes identified by the node identifiers paired with the unique mini-frame identifiers that identify one of the mini-frames having at least one of the uncorrectable FEC errors.

In some embodiments, the root FEC engine of the one of the root ports suspends filling with more packets of the virtual output queues whose assigned destination is the one of the leaf nodes identified by the node identifiers paired with the unique mini-frame identifiers that identify the one of the mini-frames having the at least one of the uncorrectable FEC errors. In some embodiments, the root FEC engine of the one of the root ports logically divides each of the mini-frames into a plurality of FEC blocks, applies an FEC algorithm to each of the FEC blocks and adds an FEC parity value to each of the FEC blocks resulting from the application of the FEC algorithm to that FEC block. In some embodiments, the root FEC engine of the one of the root ports selects the FEC algorithm from a plurality of stored FEC algorithms based on a quantity of packet data errors reported to the one of the root ports by the leaf nodes during a predetermined period. In some embodiments, the root FEC engine of the one of the root ports applies a Cyclic Redundancy Check (CRC) algorithm to each of the mini-frames and adds a CRC value resulting from the application of the CRC algorithm to that mini-frame.

In some embodiments, for each of the mini-frames, one of the FEC blocks to which the FEC algorithm was applied includes the CRC value such that errors in the CRC value are indicated by the FEC parity value of the one of the FEC blocks. In some embodiments, the node FEC engine of one of the leaf nodes: combines a set of additional packets into another payload of a single burst message; logically divides the another payload into a plurality of additional mini-frames, each of the additional mini-frames including at least a portion of one or more of the set of the additional packets; logically divides each of the additional mini-frames into a plurality of additional FEC blocks; applies another FEC algorithm to each of the additional FEC blocks; and adds another FEC parity value to each of the additional FEC blocks resulting from the application of the another FEC algorithm to that additional FEC block. In some embodiments, the node FEC engine of the one of the leaf nodes selects the another FEC algorithm from the plurality of stored FEC algorithms based on a size of a burst window granted to the one of the leaf nodes by the core, the burst window being a time period within which the single burst message is able to be transmitted to the core. In some embodiments, the uncorrectable FEC errors are errors indicated by one of the FEC parity values that cannot be corrected using the one of the FEC parity values. In some embodiments, a payload of at least one of the packets is divided between two or more of the mini-frames. In some embodiments, a payload of at least one of the packets is divided between two or more of the FEC blocks of one of the mini-frames.

A third aspect is directed to a central processing core of a controller and sensor bus for receiving and transmitting packets each having one or more destinations and including one or more transmission networks each including a plurality of leaf nodes. The central core comprises at least one central processing unit and a non-transitory computer readable memory storing one or more root ports and a plurality of virtual output queues that are each assigned to a different assigned one of the destinations, each of the root ports having a root forward error correction (FEC) engine and a mini-frame table, wherein when executed by the central processing unit the root FEC engine receives the packets from the leaf nodes, adds the packets to the virtual output queues whose assigned one of the destinations matches one of the destinations of the packet, combines a plurality of the packets into a payload of a single broadcast message, logically divides the payload into a plurality of mini-frames, each of the mini-frames including at least a portion of one or more of the plurality of the packets, populates the mini-frame table by, for each of the mini-frames, storing in the mini-frame table a unique mini-frame identifier paired with one or more node identifiers of the leaf nodes that are the destinations of the one or more of the plurality of the packets within the mini-frame, receives a mini-frame status message from at least one of the leaf nodes indicating which of the mini-frames had one or more uncorrectable FEC errors as received by the at least one of the nodes and suspends transmission of the packets within the virtual output queues whose assigned destination is one of the leaf nodes identified by the node identifiers paired with the unique mini-frame identifiers that identify one of the mini-frames having at least one of the uncorrectable FEC errors.

In some embodiments, the root FEC engine of the one of the root ports suspends filling with more packets of the virtual output queues whose assigned destination is the one of the leaf nodes identified by the node identifiers paired with the unique mini-frame identifiers that identify the one of the mini-frames having the at least one of the uncorrectable FEC errors. In some embodiments, the root FEC engine of the one of the root ports logically divides each of the mini-frames into a plurality of FEC blocks, applies an FEC algorithm to each of the FEC blocks and adds an FEC parity value to each of the FEC blocks resulting from the application of the FEC algorithm to that FEC block. In some embodiments, the root FEC engine of the one of the root ports selects the FEC algorithm from a plurality of stored FEC algorithms based on a quantity of packet data errors reported to the one of the root ports by the leaf nodes during a predetermined period. In some embodiments, the root FEC engine of the one of the root ports applies a Cyclic Redundancy Check (CRC) algorithm to each of the mini-frames and adds a CRC value resulting from the application of the CRC algorithm to that mini-frame.

In some embodiments, for each of the mini-frames, one of the FEC blocks to which the FEC algorithm was applied includes the CRC value such that errors in the CRC value are indicated by the FEC parity value of the one of the FEC blocks. In some embodiments, the uncorrectable FEC errors are errors indicated by one of the FEC parity values that cannot be corrected using the one of the FEC parity values. In some embodiments, a payload of at least one of the packets is divided between two or more of the mini-frames. In some embodiments, a payload of at least one of the packets is divided between two or more of the FEC blocks of one of the mini-frames.

A fourth aspect is directed to a leaf node of a controller and sensor bus for transmitting packets each having one or more destinations and including one or more transmission networks coupling a central processing core with a plurality of input/output (IO) ports, the leaf node comprises at least one node switch and a non-transitory computer readable memory storing a node forward error correction (FEC) engine, wherein when executed by the node switch the node FEC engine receives the packets from the IO ports, combines a plurality of the packets into a payload of a single burst message, logically divides the payload into a plurality of FEC blocks, applies an FEC algorithm to each of the FEC blocks and adds an FEC parity value to each of the FEC blocks resulting from the application of the FEC algorithm to that FEC block.

In some embodiments, when executed by the node switch the node FEC engine receives a burst window from the central processing core indicating time period within which the single burst message is able to be transmitted to the core and selects the FEC algorithm from the plurality of stored FEC algorithms based on a size of the burst window. In some embodiments, when executed by the node switch the node FEC engine selects the FEC algorithm from a plurality of stored FEC algorithms based on a quantity of packet data errors reported to the node FEC engine by the central processing core during a predetermined period. In some embodiments, when executed by the node switch the node FEC engine logically divides the payload into a plurality of mini-frames, each of the mini-frames including at least a portion of one or more of the plurality of the packets and applies an Cyclic Redundancy Check (CRC) algorithm to each of the mini-frames and adds a CRC value resulting from the application of the CRC algorithm to that mini-frame. In some embodiments, for each of the mini-frames, one of the FEC blocks to which the FEC algorithm was applied includes the CRC value such that errors in the CRC value are indicated by the FEC parity value of the one of the FEC blocks. In some embodiments, a payload of at least one of the packets is divided between two or more of the mini-frames. In some embodiments, a payload of at least one of the packets is divided between two or more of the FEC blocks of one of the mini-frames.

A fifth aspect is directed to a method of operating a controller and sensor bus for transmitting packets each having one or more destinations, the bus including a central processing core and one or more transmission networks, the networks each including a plurality of leaf nodes having a node forward error correction (FEC) engine and a node memory, the core including one or more root ports and a plurality of virtual output queues that are each assigned to a different assigned one of the destinations, wherein each of the root ports having a root FEC engine and a root memory storing a mini-frame table and each of the one or more destinations is one of the leaf nodes. The method comprises receiving the packets from the leaf nodes and adding the packets to the virtual output queues whose assigned one of the destinations matches one of the destinations of the packet with the central processing core and with the root FEC engine of one of the root ports combining a plurality of the packets into a payload of a single broadcast message, logically dividing the payload into a plurality of mini-frames, each of the mini-frames including at least a portion of one or more of the plurality of the packets, populating the mini-frame table of the root port by, for each of the mini-frames, storing in the mini-frame table a unique mini-frame identifier paired with one or more node identifiers of the leaf nodes that are the destinations of the one or more of the plurality of the packets within the mini-frame, receiving a mini-frame status message from at least one of the leaf nodes indicating which of the mini-frames had one or more uncorrectable FEC errors as received by the at least one of the nodes and suspending transmission of the packets within the virtual output queues whose assigned destination is one of the leaf nodes identified by the node identifiers paired with the unique mini-frame identifiers that identify one of the mini-frames having at least one of the uncorrectable FEC errors.

In some embodiments, the method further comprises, with the root FEC engine of the one of the root ports, suspending filling with more packets of the virtual output queues whose assigned destination is the one of the leaf nodes identified by the node identifiers paired with the unique mini-frame identifiers that identify the one of the mini-frames having the at least one of the uncorrectable FEC errors. In some embodiments, the method further comprises, with the root FEC engine of the one of the root ports logically dividing each of the mini-frames into a plurality of FEC blocks, applying an FEC algorithm to each of the FEC blocks and adding an FEC parity value to each of the FEC blocks resulting from the application of the FEC algorithm to that FEC block. In some embodiments, the method further comprises, with the root FEC engine of the one of the root ports, selecting the FEC algorithm from a plurality of stored FEC algorithms based on a quantity of packet data errors reported to the one of the root ports by the leaf nodes during a predetermined period.

In some embodiments, the method further comprises, with the root FEC engine of the one of the root ports, applying a Cyclic Redundancy Check (CRC) algorithm to each of the mini-frames and adds a CRC value resulting from the application of the CRC algorithm to that mini-frame. In some embodiments, for each of the mini-frames, one of the FEC blocks to which the FEC algorithm was applied includes the CRC value such that errors in the CRC value are indicated by the FEC parity value of the one of the FEC blocks. In some embodiments, the method further comprises, with the node FEC engine of one of the leaf nodes combining a set of additional packets into another payload of a single burst message, logically dividing the another payload into a plurality of additional mini-frames, each of the additional mini-frames including at least a portion of one or more of the set of the additional packets, logically dividing each of the additional mini-frames into a plurality of additional FEC blocks; applies another FEC algorithm to each of the additional FEC blocks and adding another FEC parity value to each of the additional FEC blocks resulting from the application of the another FEC algorithm to that additional FEC block. In some embodiments, the method further comprises, with the node FEC engine of one of the leaf nodes, selecting the another FEC algorithm from the plurality of stored FEC algorithms based on a size of a burst window granted to the one of the leaf nodes by the core, the burst window being a time period within which the single burst message is able to be transmitted to the core.

BRIEF DESCRIPTION OF THE DRAWINGS

FIG. 6A illustrates an exemplary GEM packet format according to some embodiments.

FIG. 6B illustrates a detailed view of a GEM packet header format according to some embodiments.

FIG. 6C illustrates a detailed view of a GEM header format for a node report message according to some embodiments.

FIG. 6D illustrates a detailed view of a first variant of a GEM header format for a root port bandwidth grant message according to some embodiments.

FIG. 6E illustrates a detailed view of a second variant of a GEM header format for a root port bandwidth grant message according to some embodiments.

FIG. 6F illustrates a detailed view of a GEM header format for a control message according to some embodiments.

DETAILED DESCRIPTION OF THE INVENTION

Embodiments described herein are directed to a machine automation system, method and device for controlling and operating an automated machine. The system, method and device including a controller and sensor bus including a central processing core and a multi-medium transmission intranet for implementing a dynamic burst to broadcast transmission scheme where messages are burst from nodes to the central processing core and broadcast from the central processing core to all of the nodes. As a result, the system, method and device provides the advantage of high speed performance despite combining lower speed network medium as well as one unified software image for the full intranet system including all gate, node and root ports enabling simplified software architecture, shorter product development cycle, and easier system level debug, monitoring and troubleshooting remotely. In particular, the system, method and device provides a unique intranet system architecture specially defined and optimized for machine automation applications.

Figure 1:
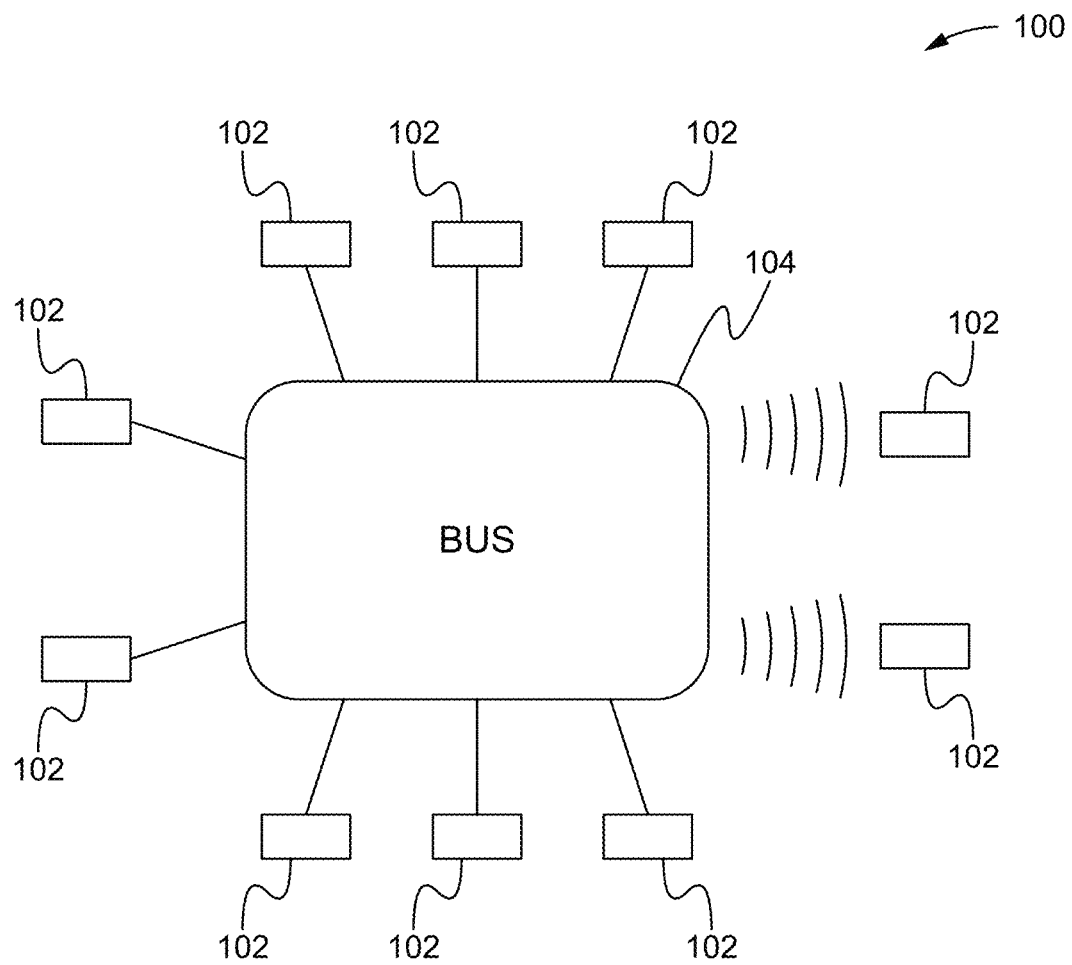
FIG. 1 illustrates a machine automation system according to some embodiments.

FIG. 1 illustrates a machine automation system 100 according to some embodiments. As shown in FIG. 1, the system 100 comprises one or more external devices 102 operably coupled together with an intelligent controller and sensor intranet bus 104. In some embodiments, the system 100 is able to be a part of an automated device such as a self-driving vehicle, an automated industrial machine or an automated self-controlled robot. Alternatively, the system 100 is able to be a part of other machine automation applications. The devices 102 are able to comprise one or more of sensor devices (e.g. ultrasonic, infrared, camera, light detection and ranging (LIDAR), sound navigation and ranging (SONAR), magnetic, radio detection and ranging (RADAR)), internet devices, motors, actuators, lights, displays (e.g. screens, user interfaces), speakers, a graphics processing units, central processing units, memories (e.g. solid state drives, hard disk drives), controllers/microcontrollers or a combination thereof. Each of the devices 102 is able to be operably wired and/or wirelessly coupled with the bus 104 via one or more bus input/output (IO) ports (see FIG. 2). Although as shown in FIG. 1, the system 100 comprises a discrete amount of external devices 102 and buses 104, more or less devices 102 and/or buses 104 are contemplated.

Figure 2:
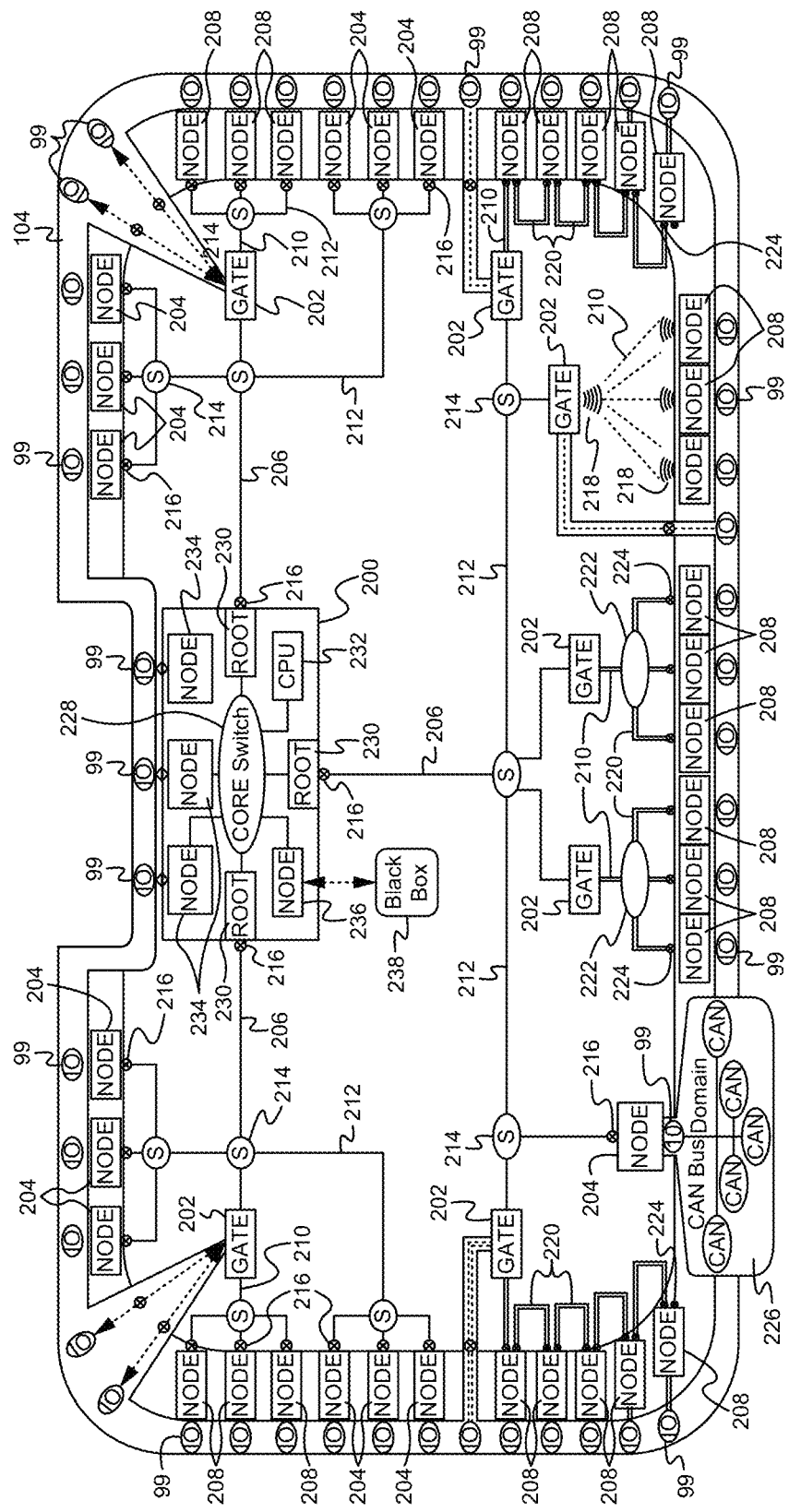
FIG. 2 illustrates an intelligent controller and sensor intranet bus according to some embodiments.
Figure 3:
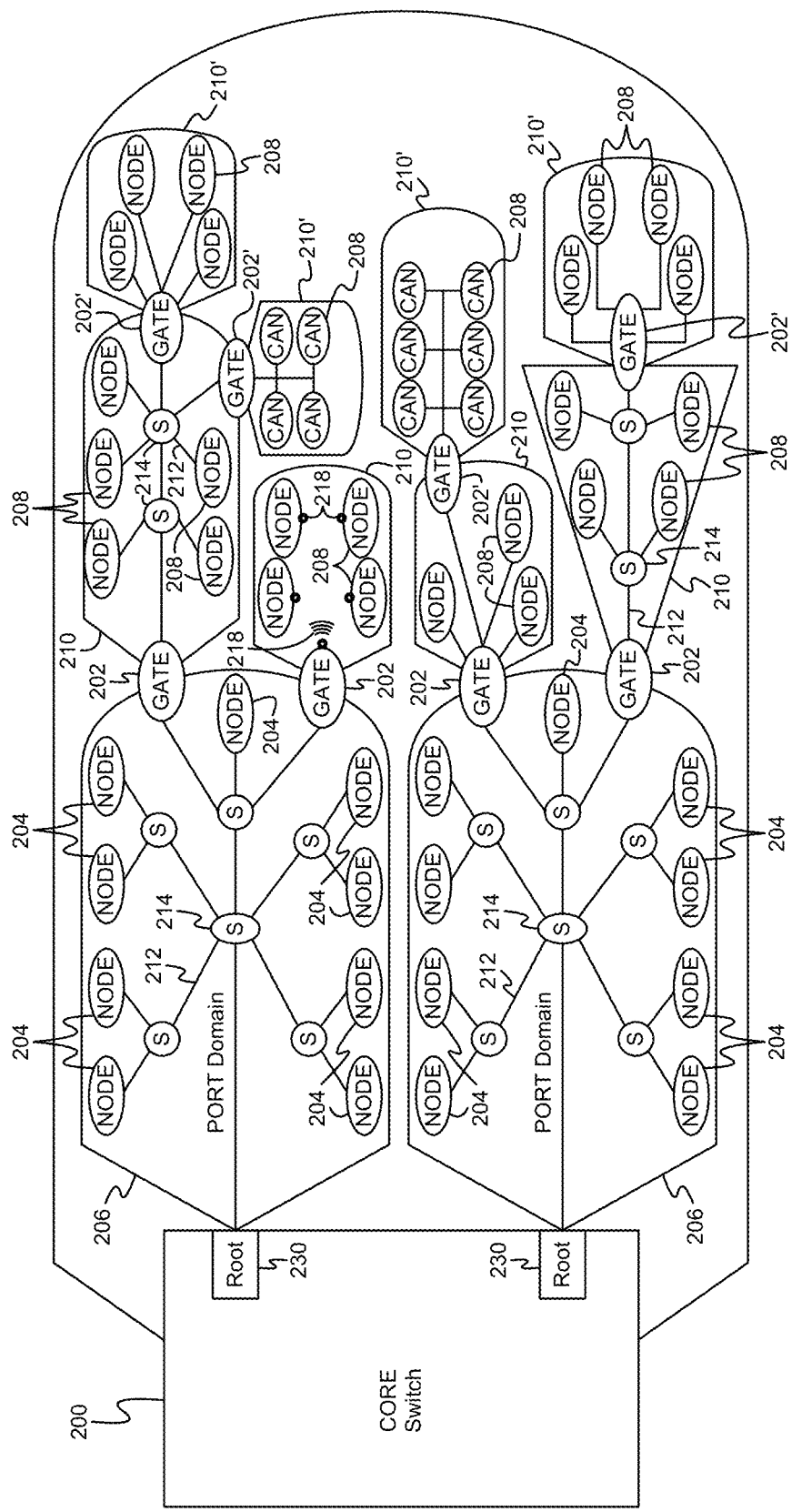
FIG. 3 illustrates a tree topology of an intelligent controller and sensor intranet bus according to some embodiments.

FIG. 2 illustrates the intelligent controller and sensor intranet bus 104 according to some embodiments. As shown in FIG. 2, the bus 104 comprises an intranet formed by a central core 200 that is coupled with one or more gates 202 and a plurality of edge nodes 204 (each having one or more external IO ports 99) via one or more central transmission networks 206, and coupled with one or more edge sub-nodes 208 (each having one or more external IO ports 99) via one or more sub-networks 210 that extend from the gates 202. As a result, as shown in FIG. 3, the bus 104 forms a network tree topology where the central networks 206 branch from the core 200 (e.g. root ports 230 of the core) to edge nodes 204 and gates 202, and the subnetworks 210 branch from the gates 202 to sub-nodes 208 and/or sub-gates 202'. In this way, the core 200 is able to see all of the nodes 204 and sub-nodes 208 (as the gates 202 and sub-gates 202' are transparent to the core 200). In some embodiments, one or more of the gates 202 are directly coupled with IO ports 99 without a node (e.g. to couple with external CPU, GPU, AI cores and/or solid state drives (SSD)).

The ports 99 are able to be any kind of interface port such as peripheral component interconnect express (PCIe), mobile industry processor interface (MIPI), Ethernet, universal serial bus (USB), general purpose input output (GPIO), universal asynchronous receiver/transmitter (UART), inter-integrated circuit (I²C) and/or other types of ports. Although as shown in FIG. 2, the bus 104 comprises a discrete amount of ports 99, cores 200, nodes 204, 208, gates 202, networks 206, 210, other elements and components thereof, more or less ports 99, cores 200, nodes 204, 208, gates 202, networks 206, 210, other elements and/or components thereof are contemplated.

The central transmission networks 206 are able to comprise connection media that is faster/lower latency than the connection media of the subnetworks 210 coupled to a gate 202 of that central transmission network 206. Similarly, the subnetworks 210 are able to comprise connection media that is faster/lower latency than the connection media of the subnetworks 210' coupled to a gate 202' of the subnetwork 210 and so on for each iterative subnetwork. This network/subnetwork connection media speed/latency relationship enables the bus 104 to prevent the slowing of the processing of the entire bus 104 despite still including the slower connection media as describe in detail below. Alternatively, one or more of the subnetworks 210, 210' and/or the central networks 206 are able to have the same or other connection media speed/latency relationships.

In some embodiments, the connection media of the central transmission networks 206 comprises optical fiber cables 212 split using optical splitters 214 (e.g. 2-to-1 splitters) and having optical transceivers 216 to couple to and received data from the nodes 204, 208. In some embodiments, the connection media of the subnetworks 210 comprises optical connection media (e.g. like the central transmission networks 206, but possibly slower rating), wireless connections (e.g. radio frequency transceivers 218), copper connections (e.g. twisted-pair copper wires 220 optionally split using analog splitters 222 (e.g. fan-outs/multiplexers) and having serializer/deserializers (SERDES) 224 to couple to and received data from the nodes 204, 208), and/or combinations thereof (e.g. hybrid optical fiber, copper and/or wireless connection media). As a result, the bus 104 supports multi-rate traffic transmissions where depending on the latency/speed, connectivity and/or distance requirements of the data/traffic/external devices 102, different nodes/networks are able to be used to couple to the bus 104 while still providing the desired throughput. For example, for high speed, low latency and long-distance requirements the optical connection media of the central network is able to be used by coupling to the nodes 204. Otherwise, the other networks 210 are able to be used depending on cost, speed, connection and/or distance requirements. In some embodiments, the central networks 206 are passive optical networks and/or the copper subnetworks 210 are active networks. In some embodiments as shown in FIG. 2, one or more of the nodes 204 is coupled to a controller area network (CAN) 226 such that the node inputs data from each of the controllers coupled to the controller are network. Alternatively, as shown in FIG. 3, one or more of the subnetworks 210 are able to be a CAN coupled with the core 200 via one of the gates 202.

Multi-Layer Bus Addressing

The bus 104 is able to utilize a multi-layered addressing scheme where the root ports 230, IO ports 99, nodes 204, 208, 234 and/or gates 202 are able to use node, epoch and GEM identifying addresses for directing messages through the bus 104. In particular, each of the root ports 230, nodes 204, 208, 234 and gates 202 are able to be assigned a node identifier (node-ID), with the nodes 204, 208 and gates 202 also being assigned at least one epoch identifier (epoch-ID) and at least one GEM identifier (GEM-ID). The epoch-IDs are able to be used to identify the source/destination of messages in the network 206, 210 (e.g. node/gate devices and their IO ports, embedded CPUs and/or other types of services) while at the same time the GEM-IDs are able to be used to identify the targets of messages (e.g. sets and subsets of the node/gate devices and their IO ports, embedded CPUs and/or other types of services). As a result, the epoch-IDs are able to be used for the transmission/routing of messages throughout the network 206, 210 while the GEM-IDs are able to be used by the devices themselves (via the ports 99) to determine whether to capture received/broadcast messages as being targeted to them.

Depending on the service level agreement (SLA) profile of the node/gate (which is able to correspond to the devices coupled to the port(s) 99 of the node/gate), the nodes/gates are able to be assigned multiple epoch-IDs and multiple GEM-IDs. As a result, the node-ID of each of the nodes 204, 208 and gates 202 is able to map to one or a plurality of epoch-IDs which are able to map to one or a plurality of GEM-IDs. For example, a node 204, 208 coupled with two IO ports 99 is able to have a single node-ID, two epoch-IDs (one for each port 99) and ten GEM-IDs (one associated with the first epoch-ID and first port 99 and nine associated with the second epoch-ID and second port 99). Further, although the node-IDs and epoch-IDs are unique to each node/gate/port, the GEM-IDs are able to be shared between nodes/gates/ports. For example, ports 99 of the same node 204, 208 or different ports 99 of different nodes 204, 208 are able to both be associated with matching or overlapping sets GEM-IDs.

The gates 202 are also able to be assigned one or more virtual node-IDs for the ports 99 directly coupled with the gate 202. Like the regular nodes, these virtual nodes represented by the gates 202 are able to be assigned multiple epoch-IDs and multiple GEM-IDs depending on the SLA profile of the gate 202 (which is able to correspond to the devices coupled to the port(s) 99 of the virtual node/gate).

The other nodes 234 and cores 232 (that are directly coupled to the core 200 such as IO devices and embedded CPU cores) are each able to have one or more GEM-IDs along with a global node-ID, but do not need to be assigned epoch-IDs, which are not required because messages to and from these nodes 234 to the core 200 are wholly within the core 200. Like nodes 204, 208, the number of GEM-IDs assigned to each of the nodes 234 and cores 232 is able to be determined based on the SLA profile for that node 234 or core 232 (which is able to correspond to the devices coupled to the port(s) 99 of the node 234). Each of the core switch 220, root ports 230, nodes 204, 208, 234, and/or gates 202 are able to maintain and update a local SLA table that indicates the mapping between each of the node-IDs, epoch-IDs and GEM-IDs. As a result, the bus addressing provides the advantage of using epoch-IDs and/or node-IDs to facilitate simplified burst/broadcast messaging between nodes, gates and the core within the network 100, while at the same time using GEM-IDs facilitate any desired more complex messaging between the devices/IO ports 99 and/or the core themselves.

Generic Encapsulation Mode

The bus 104 is able to encapsulate all input data and internally generated data (e.g. control, operation and management messages) into a generic encapsulation mode (GEM) for transport across the bus 104 intranet. Thus, the GEM acts as a unique standardized data and message container for transmitting data between nodes and/or to the core 200 via the bus 104 intranet. As a result, the input data is able to be encapsulated into the GEM format at each of the nodes as it enters the bus 104 and is routed through the core 200 (where it is decapsulated for processing and re-encapsulated for transmission) and onto its destination node which decapsulates the data back to the original format for egress to the target external device 102 or other destination. This input data is able to be from various sources (e.g. devices 102, CAN 226) input via the ports 99 at the nodes 204, 208, 234 or gates 202 and/or the embedded CPU cores 232.

There are two types of GEM formats: GEM packet and GEM control. The GEM packet format comprises a GEM header plus a GEM payload (e.g. length from 8 bytes to 4 kilobytes). Typically, the GEM packet format is what is used to encapsulate the input port data, packets and messages at the ingress (e.g. nodes, ports). The following are some of the IO port data, packet and message examples that are able utilize the GEM packet format:

Use GEM packet format to carry Ethernet packets from local gate 202 and/or node 204, 208 through bus 104 after GEM encapsulation to far-end gate 202 and/or node 204 (e.g. this is able to be for internet and Wi-Fi interfaces through Ethernet Port or PCIe Ports);

Use GEM packet format to carry sensor data from local gate 202 and/or node 204, transmit through bus 104 after GEM encapsulation to far-end gate 202 and/or node 204 (e.g. CAN bus data, Camera (MIPI) Frame data, Lidar (Ethernet) data, Magnetic Encoder data (ADC) and other type of Sensors data;

Use GEM packet format to carry jumbo size data and packets and transmit through fragmentation and de-fragmentation scheme, from local node 204, 208 to far-end node 204, 208. This is able to include fragmentation, defragmentation and re-ordering/re-transmission functions;

Use GEM packet format to carry the network control, operation and management messages between core 200 and nodes 204, 208 (and/or gates), including physical layer operation, administration and maintenance (PLOAM), node management control interface (NMCI) and operations, administration and maintenance (OAM) messages;

Use GEM packet format to carry CPU/PCIe access CMD/DATA from core 200 and local gate 202 and/or node 204 through bus 104 after GEM encapsulation, to far-end local gate 202 and/or node 204 (e.g. CPU 232 access target device 102 from NODE-to-NODE through PCIe, USB, I2C, UART and GPIO interfaces).

Finally, use GEM packet format for VPN channel application between local-nodes 204, 208 to far nodes 204, 208 through bus 104.

The GEM control message format comprises the message plus an extended message (e.g. length 8 bytes+8 bytes . . . ). The GEM control message format is able to be used in the bus 104 for internal network management and control purposes, including messages of dynamic bandwidth allocation (DBA) reporting, DBA-Granting, GEM RX-Acknowledge, GEM Flow-Control, GEM Power-Management, GEM-Sniffer, GEM-Remote messages and/or other types of control messages. As described above, nodes 204 are responsible for encapsulating/decapsulating data to/from GEM packet and GEM control message format. This scheme is able to expand PCIe interface protocol from point-to-point topology to point-to-multi-point topology and extend the interface distance from short reach to long reach.

FIGS. 6A-F illustrate an exemplary GEM packet format and GEM header formats according to some embodiments. As shown in FIG. 6A, a GEM packet 600 is able to comprise a header 602 and a corresponding payload 604. As described above, for message packets the header is able to be a set size (e.g. 8 bytes) and the payload is able to vary in length (e.g. length from 8 bytes to 4 kilobytes) and for control packet the header is able to be, for example, 8 bytes with or without one or more 8 byte extensions.

FIG. 6B illustrates a detailed view of a GEM packet header format according to some embodiments. As shown in FIG. 6B, the header 602 comprises a GEM type field 606, a payload length indication field 608, an encryption key index field 610 (e.g. AES Key Index), a node/epoch ID field 612, a GEM-ID field 614, a GEM packet type field 616, a transmission sequence identifier field 618, an acknowledgment required field 620, a last fragment indication field 622 and a header error correction/check (HEC) field 622. Alternatively, one or more of the fields are able to be omitted and/or one or more additional fields are able to be added. In some embodiments, the GEM type field 606 is two bits, the payload length indication field 608 is twelve bits, the encryption key index field 610 is two bits, the node/epoch ID field 612 is twelve bits, the GEM-ID field 614 is twelve bits, the GEM packet type field 616 is three bits, the transmission sequence identifier field 618 is six bits, the acknowledgment required field 620 is one bit, the last fragment indication field 622 is one bit and the header error correction/check (HEC) field 622 is thirteen bits. Alternatively, one or more of the fields are able to be larger or smaller.

The GEM type field 606 indicates which type of header 602 (and thus which type of packet) the GEM packet 600 is. For example, the GEM type field is able to indicate that the header 602 is one or more of a packet header, a bandwidth grant message header (e.g. transmitted from a root port 230 to a gate/node), a bandwidth report message header (e.g. transmitted from a gate/node to a root port 230) and/or a control message (e.g. between one or more of the root ports 230, the gates 202 and/or the nodes 204, 208, 234). The payload length indication field 608 indicates the length of the payload 604 of the packet 600. The encryption key index field 610 indicates the type of encryption to use on the packet 600. For example, the encryption key index field 610 is able to be used as an index value within an encryption table to identify one or more of: whether to encrypt the packet or not, which key to use to encrypt the packet, and/or which method of encryption to use.

The node/epoch ID field 612 is able to identify either the source node or the destination node of the packet 600. For example, for a GEM packet 600 being burst from a node to the core, the field 612 is able to be or represent the node's epoch-ID to indicate the source of the packet 600. As another example, for a GEM packet 600 being broadcast from a root port 230 to the nodes/gates within its network 206, 210, the field 612 is able to be or represent the destination's node-ID (including a unicast node-ID, a multicast node-ID and/or a broadcast node-ID). The GEM-ID field 614 is able to be or represent the source node's data/packet/message identifier for a point to point message, or is able to be or represent the destination node's GEM-ID (e.g. including CAN message GEM-IDs, sensor data GEM-IDs and/or Ethernet packet GEM-IDs) for point to multi-point messages. As a result, the GEM format provides the advantage of enabling the bus 104 to identify both the immediate source and/or destination nodes via the node/epoch ID field 612 while also enabling the target devices/port/services to be identified using the GEM-ID field 614.

The GEM packet type field 616 is able to indicate the type and format of the header of the message encapsulated within the GEM format (e.g. as received from the devices 102 and/or through the ports 99). For example, the field 616 is able to indicate that the message header is a PLOAM message, a node management and control interface (NMCI) message, a CAN command message, sensor data, an Ethernet packet, CPU-IO (e.g. PCIe/USB) message and/or a node operation and control report (NOCR) message. The acknowledgment required field 620 is able to indicate if an acknowledgment message in response to the message is require and the transmission sequence identifier field 618 is able to identify the transmission sequence number of the packet 600 within a set of packets from the source node and/or an epoch-ID thereof (for a packet being burst from the node to the core 200). In some embodiments, it requires an acknowledgment message from the receiving root port 230 when indicated by the acknowledgment required field 620. For a packet broadcast from the root port 230 to a node/gate, the transmission sequence identifier field 618 is able to identify the transmission sequence number of the unicast/broadcast/multi-cast GEM-ID (e.g. CAN Message GEM-ID, sensor Data GEM-ID, Ethernet Packet GEM-ID and CPU/PCIe/USB Data-Message GEM-ID). In some embodiments, it requires acknowledge from receiving root port 230 and/or node when indicated by the acknowledgment required field 620. The last fragment indication field 622 is able to indicate if this packet 600 is the last fragment of a series of fragments of a large packet and the header error correction/check (HEC) field 622 is able to be used to check the header 602 for errors.

FIG. 6C illustrates a detailed view of a GEM header format for a node report message according to some embodiments. As shown in FIG. 6C, the header 602 comprises a GEM type field 606, a report message type field 624, a source epoch-ID field 626, a report total size field 628, a report threshold size field 630, a report sequence number field 632, one or more source node virtual output queue (VOQ) status fields 634 (e.g. CPU-IO, PLOAM, NMCI, CAN, Sensor, Ethernet, or other types), a report priority field 636 and a header error correction/check (HEC) field 622. Alternatively, one or more of the fields are able to be omitted and/or one or more additional fields are able to be added. In some embodiments, the GEM type field 606 is two bits, the report message type field 624 is two bits, the source epoch-ID field 626 is twelve bits, the report total size field 628 is fourteen bits, the report threshold size field 630 is eight bits, the report sequence number field 632 is five bits, the one or more source node virtual output queue status fields 634 are each one bit (or a single field of six bits), the report priority field 636 is two bits and the header error correction/check (HEC) field 622 is thirteen bits. Alternatively, one or more of the fields are able to be larger or smaller.

The report message type field 624 indicates which type of report header 602 (and thus which type of report message) the GEM packet 600 is. For example, the report message type field 624 is able to indicate that the header 602 is one or more of an invalid report message, a node report message for itself (e.g. where the epoch-ID of the source of the packet is mapped to the node-ID of the source of the packet), a node report message for another node (e.g. where the epoch-ID of the source of the packet is not mapped to the node-ID of the source of the packet), and/or a dying gasp report message (e.g. a message that needs/requests top priority). The source epoch-ID field 626 is able to be or represent: the source node's epoch-ID (e.g. for a report for PLOAM and NMCI plus CAN/sensor/Ethernet queue flags), the CAN's epoch-ID (e.g. for a report for the CAN), the epoch-ID of one of the sensors/nodes (e.g. for a report for the sensor), the Ethernet epoch-ID (e.g. for a report for Ethernet packets) and/or a PCIe/USB epoch-ID (e.g. for a PCIe/USB report message). The report total size field 628 is able to indicate the total size of the GEM data within the VOQ (for that epoch-ID and/or Node-ID), whereas the report threshold size field 630 is able to indicate the GEM packet boundary (ies) within the VOQ (e.g. for use when determining the size of burst windows granted for the epoch and/or node).

The report sequence number field 632 is able to indicate which number in the sequence that the message is (e.g. if there are a sequence of related report messages in order to determine if one is lost or mis-sequenced). The one or more source node virtual output queuing (VOQ) status fields 634 are each able to indicate a status of the source node with respect to a particular function/type of data (e.g. CPU/IO, PLOAM, NMCI, CAN, sensor, Ethernet). The report priority field 636 is able to indicate what priority to give the message (e.g. best efforts, normal bandwidth request priority, CAN message request priority, dying gasp request priority).

FIGS. 6D and E illustrate a detailed view of two variants of a GEM header format for a root port bandwidth grant message according to some embodiments. As shown in FIG. 6D, for a node grant message where the node-ID is the same as the epoch-ID, the header 602 is able to comprise a GEM type field 606, an epoch-ID field 638, a start time field 640, a grant size field 642, a grant flag field 644, a report command field 646, a grant command field 648, a force wake-up indicator (FWI) field 650, a burst profile field 652 and a header error correction/check (HEC) field 622. Alternatively, one or more of the fields are able to be omitted and/or one or more additional fields are able to be added. In some embodiments, the GEM type field 606 is two bits, the epoch-ID field 638 is twelve bits, the start time field 640 is fourteen bits, the grant size field 642 is fourteen bits, the grant flag field 644 is one bit, the report command field 646 is three bits, the grant command field 648 is two bits, the force wake-up indicator field 650 is one bit, the burst profile field 652 is two bits and the header error correction/check (HEC) field 622 is thirteen bits. Alternatively, one or more of the fields are able to be larger or smaller.

The epoch-ID field 638 is able to be or represent the epoch-ID of the node or node-ID that the message is for. The start time field 640 is able to indicate a starting time of the grant window that is being granted to the target node (e.g. epoch of that node) and the grant size field 642 is able to indicate the size/duration of the grant window. The grant flag field 644 is able to indicate whether the window was granted. The report command field 646 is able to indicate what reporting is requested from the node/epoch/port. For example, the report command field 646 is able to indicate one or more of: no node request to send (RTS) status report or force node to report RTS message to port for blackbox and diagnostic test; combined with one or more of: PLOAM and NMCI reporting only forced reporting of CPU-IO messages, CAN messages and sensor data plus PLOAM/NMCI; forced reporting for Ethernet packets plus CPU-IO/CAN/sensor and PLOAM/NMCI; and/or forced full report of PLOAM/NMCI/CPU-IO/CAN/sensor/Ethernet plus a node operation and control report (NOCR). The grant command field 648 is able to indicate what type of messages/data are granted the burst window. For example, the grant command field 648 is able to indicate one or more of: the window is not for PLOAM and NMCI messages; the grant window is only for PLOAM messages; the grant window is only for NMCI messages; and/or the grant is for PLOAM, NMCI and NOCR messages. The FWI field 650 is to indicate whether to force a sleeping node to wake-up and the burst profile field 652 is able to indicate a burst configuration (e.g. length, pattern and/or other characteristics of the SOB delimiter, EOB delimiter and/or preamble).

As shown in FIG. 6E, for a GEM grant message where the node-ID is not the same as the epoch-ID, the header 602 is able to be substantially the same as the header of FIG. 6D except without the report command field 646 and the FWI field 650. Further, unlike in FIG. 6D, the grant command field 648 is able to be six bits. Alternatively, the grant command field 648 is able to be larger or smaller. Also unlike in FIG. 6D, the grant command field 648 is able to indicate a GEM bandwidth grant of different types. For example, the field 648 is able to indicate a bandwidth grant for: all VOQ/CoS (class of service) based on the node's output scheduling settings, for CAN messages only, for sensor data only, dying gasp messages only and/or for both CAN messages and sensor data. Additionally, the field 648 is able to force power saving for the node-ID where the node replies with an acknowledge message.

FIG. 6F illustrates a detailed view of a GEM header format for a control message according to some embodiments. As shown in FIG. 6F, the header 602 comprises a GEM type field 606, a control message type field 654, one or more control message fields 656 and a header error correction/check (HEC) field 622. Alternatively, one or more of the fields are able to be omitted and/or one or more additional fields are able to be added. In some embodiments, the GEM type field 606 is two bits, the control message type field 654 is four bits, the one or more control message fields together are forty-five bits and the header error correction/check (HEC) field 622 is thirteen bits. Alternatively, one or more of the fields are able to be larger or smaller.

The control message type field 654 is able to indicate what type of control message the message is (e.g. so the control message fields 656 and their offsets are known for processing). In some embodiments, the control message type field 654 indicates one or more of: a report acknowledgment message; a CAN acknowledgment message; a flow control message; a power saving message; and IO event message (e.g. dying gasp); a run-time status message; and/or a timestamp update (e.g. from port to node). The control message fields 656 are able to include various control message fields based on the type of control message (as indicated in control message type field 654).

Accordingly, the GEM format provides the benefit of enabling the bus 104 to encapsulate varying input data and messages of significantly different types of networks (e.g. controller area networks, optical networks, sensor device broadcasting networks, wireless networks, CPU access networks) to one unique format (GEM). This unique format is then able to facilitate high speed standardized processing and transmission of the varied data input in both burst and broadcast messages thereby enabling the efficient operation of the multi-network multi-device bus architecture required for modern machine automation applications.

Burst/Broadcast Frame Format

In some embodiments, the broadcast messages are formatted into a Broadcast-PHY-Frame defined by: Preamble+Start-of-Frame-Delimiter+Frame-Payload, wherein the frame payload includes multiple GEM-Packet data and GEM-Control messages. The Broadcast-PHY-Frame is able be a fixed frame size (e.g. between 25-125 µs). Alternatively, greater or smaller frame sizes are able to be used. For example, for central networks 206 and subnetworks 210 with less node devices 204, 208, the frame size is able to be smaller (e.g. 25 µs or 50 µs). In some embodiments, the Broadcast-PHY-Frame is constructed to carry GEM-Packet and GEM-Control messages from the root ports 230 to the gate 202 and/or nodes 204, 208, 234 through the networks 206, 210 including optical, copper and wireless networks.

In some embodiments, the burst messages are formatted into a Burst-PHY-Frame defined by: Preamble+Start-of-Frame-Delimiter+Frame Payload+End-of-Frame-Delimiter, wherein the frame payload includes one or more GEM-Packet data and GEM-Control messages. The Burst-PHY-Frame size is able to vary depending on the total Burst-Window size of node/gate granted by root port HDBA and/or gate DBA. In some embodiments, the max size of Burst-PHY-Frame (from a gate 202 or a node 204, 208, 234) cannot exceed the max Broadcast-PHY-Frame size (e.g.

between 25-125 µs). In some embodiments, the Burst-PHY-Frame is constructed to carry GEM-Packet and GEM-Control messages from gates 202 and/or nodes 204, 208, 234 to the root ports 230 and/or gates 202 via the networks 206, 210 including optical, copper and wireless networks.

Figure 7A:
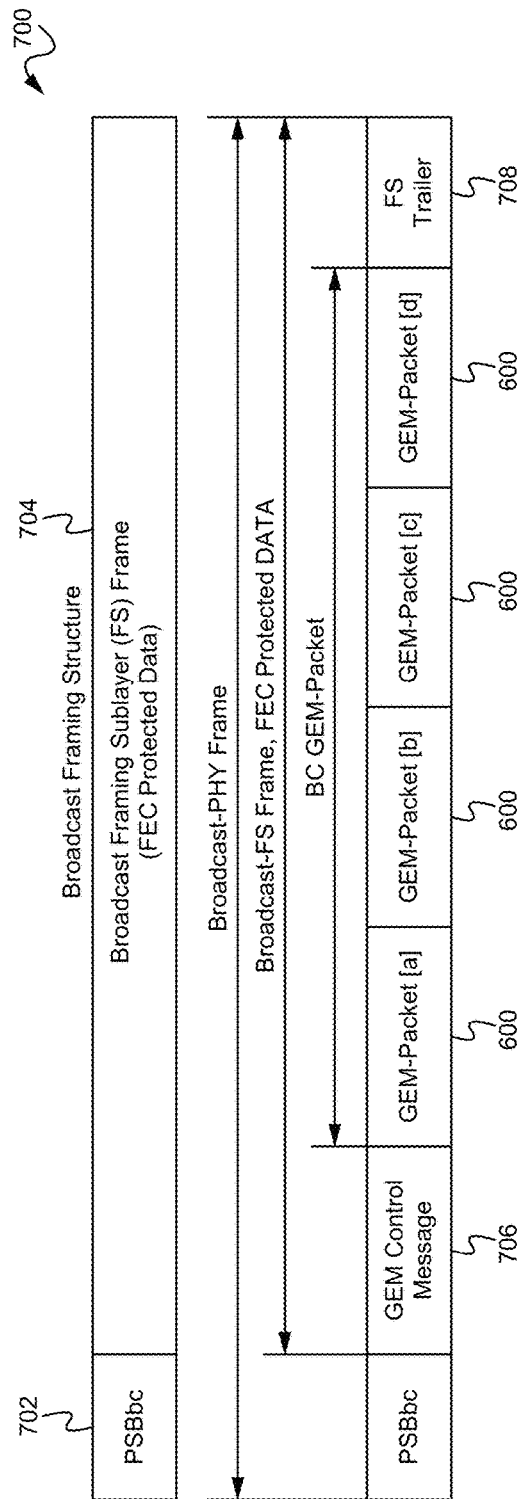
FIG. 7A illustrates a Broadcast-PHY-Frame according to some embodiments.
Figure 7B:
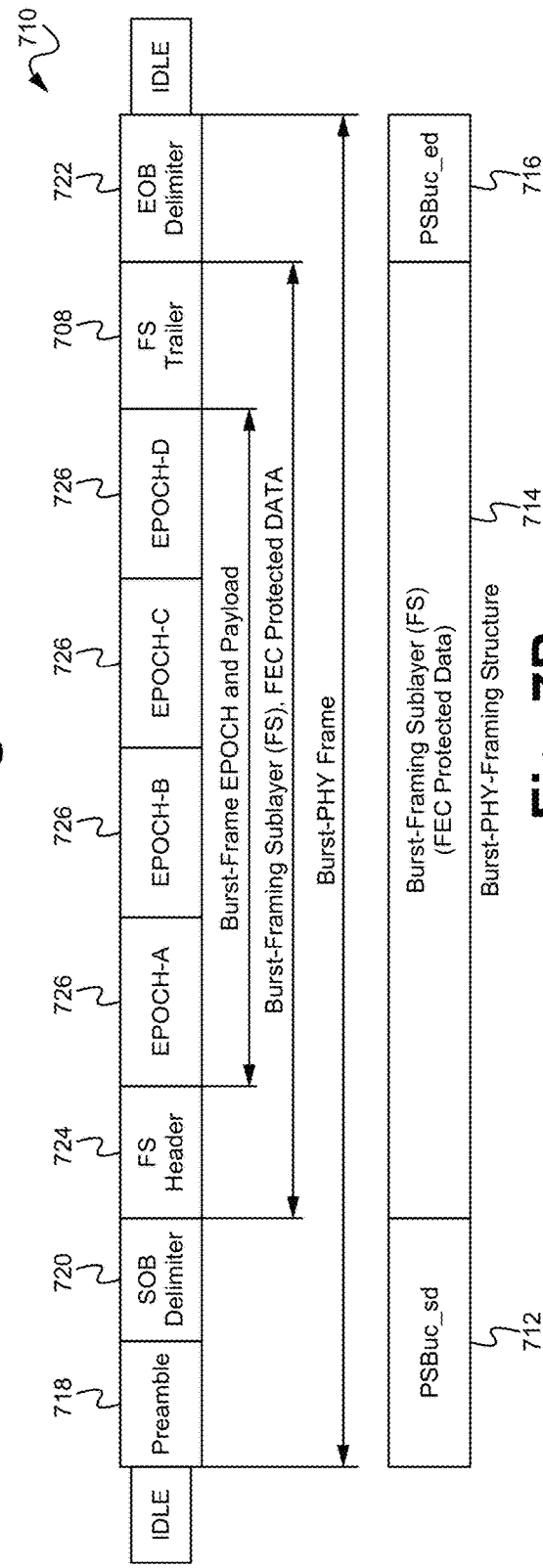
FIG. 7B illustrates a Burst-PHY-Frame according to some embodiments.

FIG. 7A illustrates a Broadcast-PHY-Frame 700 according to some embodiments. As shown in FIG. 7A, the Broadcast-PHY-Frame 700 comprises a physical synchronization block for broadcast (PSBbc) 702 and a broadcast framing sublayer frame 704 including a GEM control message 706, one or more GEM packets 600 and a framing sublayer (FS) trailer 708. Each of the GEM packets 600 include a header 602 and a payload 604 as described above. In some embodiments, the broadcast FS frame is FEC protected. FIG. 7B illustrates a Burst-PHY-Frame 710 according to some embodiments. As shown in FIG. 7B, the Burst-PHY-Frame 710 comprises a physical synchronization block unicast start of burst delimiter (PSBuc_sd) 712, a burst framing sublayer (FS) 714 and a physical synchronization block unicast end of burst delimiter (PSBuc_ed) 716. The PSBuc_sd 712 is able to include a preamble 718 and a start of burst (SOB) delimiter 720 and the PSBuc_ed 716 is able to include an end of burst (EOB) delimiter 722. The burst FS 714 is able to include a FS header 724, one or more epochs 726 and an FS trailer 708. Each of the epochs 726 are able to include one or more GEM packets 600 having a header 602 and a payload 604 as described above. In some embodiments, the burst FS frame is FEC protected. In particular, by including an EOB delimiter (in addition to the SOB delimiter and a size of the frame), the structure 710 enables a sniffer, analytics engine or other element to monitor the traffic within the bus 104 because it enables the element to determine the end of each burst frame based on the EOB delimiter despite not knowing/accessing the size of the frame.

Figure 7C:
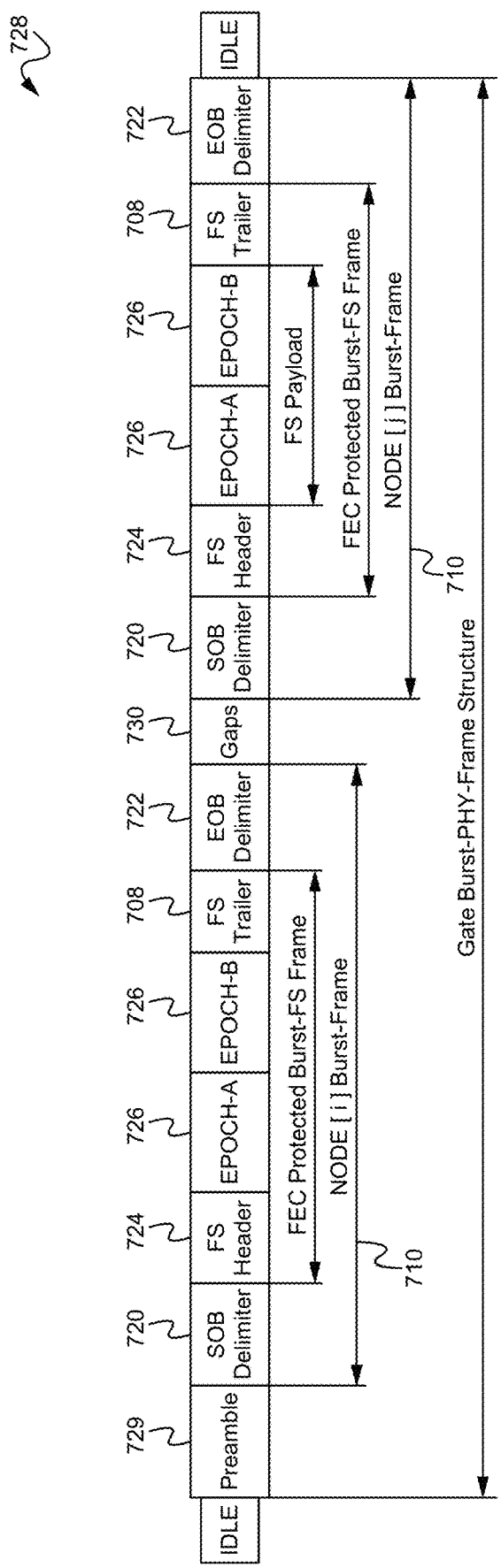
FIG. 7C illustrates a gate Burst-PHY-Frame according to some embodiments.

FIG. 7C illustrates a gate Burst-PHY-Frame 728 according to some embodiments. As shown in FIG. 7C, the gate Burst-PHY-Frame 728 is able to comprise one or more Burst-PHY-Frames 710 combined together into a single combined burst-PHY-frame having a single preamble 729 and one or more gaps 730. In particular, as described in detail below, the gates 202 are able to receive burst frames 728 from one or more subnodes 208 as well as one or more IO ports 99 (for which they serve as a virtual node) and combine those frames 728 into a combined gate Burst-PHY-Frame 728 as shown in FIG. 7C. As a result, the system 100 provides the advantage of more efficient message communication via combined burst frames as well as less overhead per frame by using only a single preamble for the combined frame as a whole instead of a separate preamble for each combined burst frame (whose preamble can be up to 256 bytes each or more).

Figure 8:
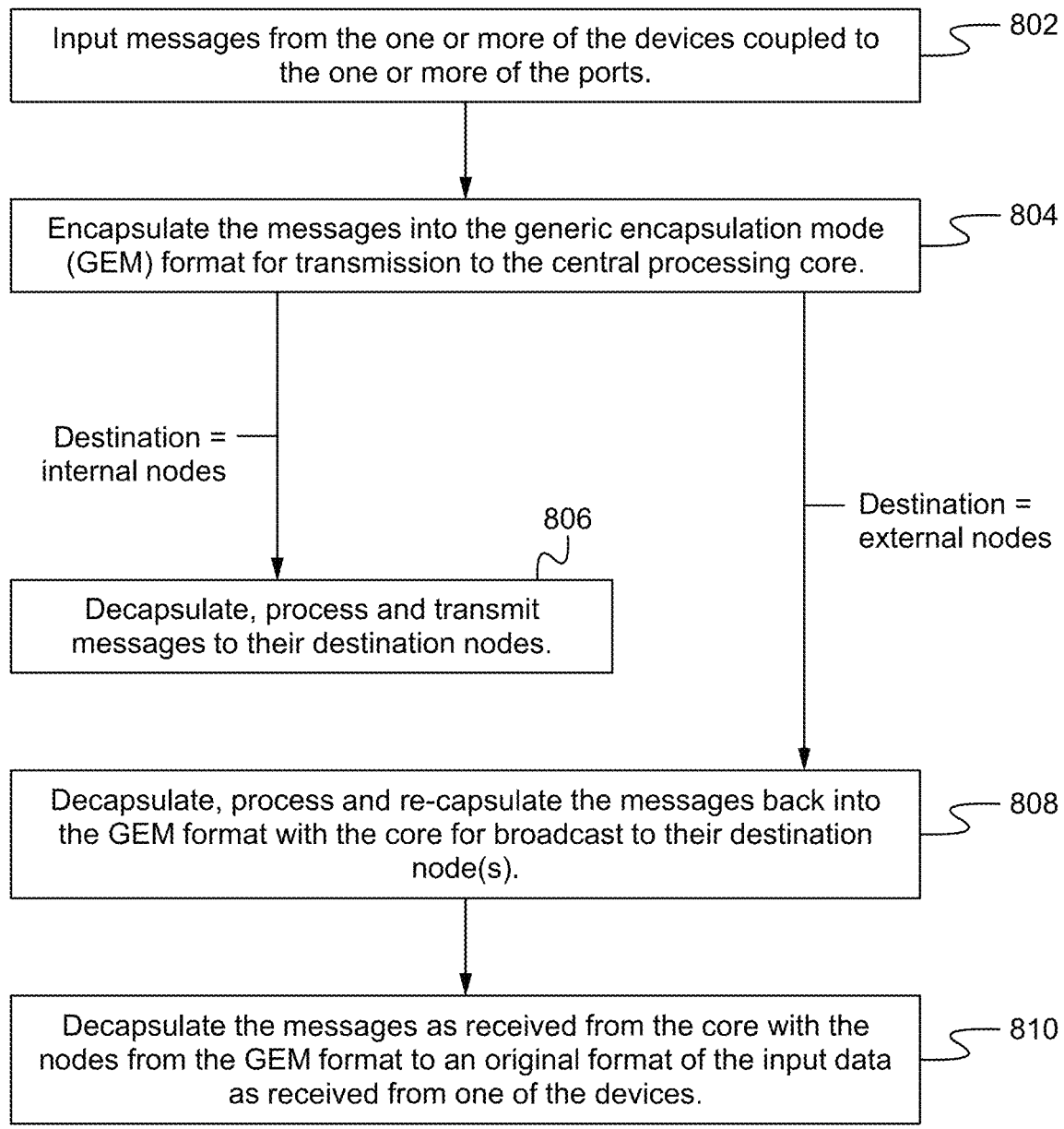
FIG. 8 illustrates a method of operating the intelligent controller and sensor intranet bus according to some embodiments.

FIG. 8 illustrates a method of operating the intelligent controller and sensor intranet bus 103 according to some embodiments. As shown in FIG. 8, one or more of the nodes 204, 208 input one or more messages from the one or more of the devices 102 coupled to the one or more of the ports 99 at the step 802. The nodes 204, 208 encapsulate the messages into the generic encapsulation mode (GEM) format for transmission to the central processing core 200 at the step 804. If the destination(s) of the input messages is a node 234 inside the core 200, the core decapsulates, processes and transmits the messages to their destination(s) without re-encapsulation at the step 806. Otherwise, if the destination(s) of the input messages is one or more other nodes 204, 208 (outside the core 200), the core 200 decapsulates, processes and re-encapsulates the messages back into the GEM format for broadcast to their destination(s) at the step 808. The nodes 204, 208 decapsulate the messages as received from the core 200 from the GEM format to an original format of the input data as received from one of the devices 102 at the step 810. Alternatively, if the input messages are input from nodes 234 inside the core 200 they are able to be input and processed by the core 200 (without being encapsulated) and only encapsulated by the core 200 for broadcast if their destination is one or more nodes 204, 208 outside the core 200. As a result, the method provides the advantage of enabling the communication of many different types of data (e.g. sensor, controller bus, Ethernet, or other types of data), more efficient message communication via combined burst frames, and less overhead per frame by using only a single preamble for the combined frame as a whole instead of a separate preamble for each combined burst frame.

Core

The core 200 is able to comprise a core switch 228, one or more root ports 230 (internal ports), a central processing unit 232 and one or more core nodes 234 having IO ports 99 (external ports). In some embodiments, the core 200 further comprises a secure memory (e.g. secure digital (SD) memory) node 236 for storing data in a black box memory 238. Alternatively, the SD node 236 and/or memory 238 are able to be omitted. The core nodes 234 enable a user to couple a user plug-in module (e.g. CPU core, WIFI LTE/5G, User Application software) directly to the core 200 bypassing the networks 206, 210.

The core switch 228 comprises a forwarding engine element, a queuing buffer manager and a traffic manager. Forwarding engine element is able to comprise a plurality of forwarding engines. For example, it is able to include one engine used for L2/L3/L4 Ethernet header parser, lookup and classification/access control list (ACL) function, including L2 medium access control (MAC) Address learning and forwarding functions, L3 internet protocol (IP) Address to GEM-ID Routing/mapping. Additional, one engine is able to be used for GEM Header message parser, lookup, ACL and forwarding and/or another is able to be used to support DOS attack functions to protect the bus 104 from external internet DOS attack. The GEM-Queuing-Buffer Manager is able to be a centralized buffering architecture, which employs link-list based buffer and queuing memory methods combining store-N-forward and cut-through forwarding schemes. For latency sensitive GEM-Packet and GEM-Messages, it is able to use a cut-through forwarding scheme and for congestion GEM-Packets it is able to use store-N-forward scheme. Both schemes are able to be dynamically mixed together and dynamically switched between each other depending on the run-time traffic congestion situations. The GEM-Traffic Manager supports GEM-ID and NODE-ID base dual-token policing, single-token rate-limiting and output shaping functions, including related management information base (MIB) counters. GEM-ID base weighted random early detection (WRED) and Tail-Drop functions are able to be supported as well as early traffic congestion detection and indication and feedback mechanisms to notify hybrid dynamic bandwidth allocation mechanisms (HDBA), root ports 230, gates 202 and nodes 204, 208, 234 to slow down traffic transmission in order to avoid traffic congestion from occurring.

As a result, the core switch 228 is able to provide the functions of on ingress, the switch 228 receives GEMs from one or more of the root ports 230, local nodes 234, computer 232 and/or other IO ports, processes the GEMs and on egress, forwards and transmits the received GEMs to one or more of the root ports 230, local nodes 234, computer 232 and/or other IO ports. In other words, the switch 228 is able to accept GEM-Packets from multiple sources; perform GEM and Ethernet L2/L3/L4 header parsing, L2 MAC lookup and learning, GEM message and 5-tuple ACL and classification; modify GEM-Header and GEM payload Ethernet header (if necessary); and store and forward GEM-Packet (or cut-through buffer memory) to one or multiple hybrid automatic repeat request (HARQ) functional blocks and the broadcast-MAC of one or more root ports 230.

In performing this processing and/or forwarding function, the switch 228 is able to support hybrid store-and forward and cut-through forwarding schemes in order to reduce propagation latency for latency sensitive GEMs and provide big enough buffering for over burst GEM traffic. Additionally, the switch 228 is able to support instant-flow-control mechanisms within the bus 104, including hybrid dynamic bandwidth allocation and granting to ensure overall quality of service (QoS) across the bus 104. Further, the switch 228 is able to support L2/L3/L4 ACL and classification, L2 MAC address learning and forwarding, L3 IP address to GEM-ID routing/mapping, as well as DOS attack protection. Finally, the switch 228 is able to support QoS scheduling, GEM buffering WRED/Tail dropping, node and/or GEM policing and output shaping functions.

Root Ports

The root ports 230 are able to comprise a root transmission MAC, a root reception MAC, a security engine (e.g. advanced encryption standard (AES)), a forward error correction (FEC) engine, a hybrid dynamic bandwidth allocation (HDBA) engine, an activation processor (e.g. activation state machine) and a burst-mode SERDES IP. Alternatively, one or more of the above elements are able to be omitted. The transmission MAC (Tx-MAC) of each of the root ports 230 is responsible for accepting GEMs ready for egress from switch 228 and/or HARQ; map and pack the GEMs into a broadcast frame format (e.g. Broadcast PHY-Frame structure); and broadcast the GEMs to all of the gates 202 and/or nodes 204 on the central transmission network 206 to which the root port 230 is coupled (e.g. through root SERDES and optical/copper network broadcast domains). Conversely, the reception MAC (Rx-MAC) of each of the root ports 230 is responsible for receiving GEMs in a burst frame format (e.g. Burst-PHY-Frame structure) from Burst-Mode SERDES and gates 202 and/or nodes 204, 208; extracting the GEMs from burst frame format; parsing the GEM-header of the GEMs; and accepting the GEMs addressed to it (e.g. based on the GEM-Header and system service level agreement (SLA) profile settings), then outputting the GEMs/data to the switch 228 for further processing and forwarding. In other words, the root ports 230 are each able to receive burst traffic from the nodes 204 and/or gates 202 (forwarded from nodes 208 in the subnetwork 210 of the gate 202), convert the burst traffic to the correct format for processing by the switch 228 and then reformat and broadcast output traffic to all of the nodes 204 and nodes 208 (via the gates 202) to destinations as directed by the switch 228.

The hybrid dynamic bandwidth allocation (HDBA) engine is responsible for receiving reports about bandwidth usage, traffic congestion and other factors (e.g. NODE-DBA Reports); performing HDBA analysis based on an SLA profile for the node/port/device associated with each report, the DBA-Report data itself and committed information rate (CIR)/peak information rate (PIR) feedback; and granting burst windows to each NODE device and assigned port/EPOCH-ID. In other words, the HDBA engine inputs data from each of the nodes 204, 208 (of the network 206 associated with the root port 230 and subnetworks 210 thereof) and/or other sources about bandwidth usage/traffic congestion and dynamically allocates burst transmission window start times and/or sizes to each of those nodes 204, 208. In performing this allocation for the nodes 208 within the subnetworks 210, the gate 202 that provides access to the nodes 208 is transparent to the HDBA engine. As a result, as described in detail below, the gate 202 receives the desired data and performs the burst transmission within the assigned windows for each of the nodes 208 of the gate's 202 subnetwork 210. The HDBA engine is also able issue reporting acknowledgment messages (GEM-Report-ACK message) to nodes 204, 208 to confirm that the report messages (GEM-DBA Reports) were received.

The root Activation State-Machine is responsible for performing and completing node 204, 208, 234 device activation and registration through activation processes and procedures by exchanging physical layer operations, administration and maintenance (PLOAM) GEM messages between nodes 204, 208, 234 and the root port 230. The security engine is able to be an AES-128/256 encryption and decryption functional block used for both the reception and transmission MACs. Alternatively, other encryption is able to be used.

The forward error correction (FEC) engine is used for controlling errors in data transmission over unreliable or noisy communication channels. In some embodiments, the FEC engine uses Reed Solomon FEC coding schemes of RS (255,216) and RS (225,232) for 10G and 2.5G data rates, respectively. Alternatively, the FEC engine is able to user low-density parity-check (LDPC) schemes and/or other FEC algorithms. The burst-mode SERDES uses fast clock and data recovery (CDR) locking mode to ensure proper burst messages (e.g. burst-PHY-Frames) are received correctly. In some embodiments, the fast locking function of CDR is required in fiber-cut, fast fail-over and protection switch recovery. A more detailed discussion of the operation of the FEC engine as implemented by the root/node MAC and/or the core/node engine in some embodiments is found in the error avoidance mechanism section below.

Finally, after a registration process, the root ports 230 receive broadcast data distribution service (DDS) messages from nodes 204, 208 that notify the root port 230 that new nodes/devices have joined and registered to bus 104. Accordingly, the root ports 230 are configured to always listen and accept these data distribution service (DDS) messages from the switch 228 and new node's 204, 208 declaration of joining the bus 104, and update the Root-Port SLA profile database and settings to reflect the newly added nodes/devices.

Nodes

The edge nodes 204, 208, 234 provide a bridge function within the bus 104 to interface with external devices 102 via the IO ports 99 on one side and connect to bus intranet 104 on the other side. In order to provide data from the devices 102 coupled to the ports 99 of the nodes 204, 208, the nodes 204, 208, 234 construct and transmit burst messages (e.g. Burst-PHY-Frames of the data encapsulated as GEMs) through the bus 104 to the other nodes 204, 208 via the root port 230 (of the network 206 of which they are a part or a subnetwork 210 thereof). Further, in order to provide data to the devices 102 coupled to the ports 99 of the nodes 204, 28, the nodes 204, 208, 234 receive broadcast message (e.g. Broadcast-PHY-Frames of the data encapsulated as GEMs) from other nodes 204, 208 via the root port 230 (of the network 206 of which they are a part or a subnetwork 210 thereof), extract the data from the broadcast messages (e.g.

GEMs from RX BC-PHY-Frames), and filter and accept the data that belongs (is addressed to) the node 204, 208.

To perform these and other functions, the edge nodes 204, 208 are able to comprise one or more IO ports 99, an encapsulation/decapsulation engine, a HARQ block and a node MAC. Each of the ports 99 is able to be one of a CPU interface (e.g. PCIe, USB and UART), a sensor interface (e.g. MIPI, analog to digital converter (ADC), GPIO), an internet interface (e.g. Ethernet, EtherCAT, and CAN-Bus), and a motor module interface (e.g. pulse width modulation (PWM), $I^2C$, ADC and GPIO). The encapsulation/decapsulation engine accepts input data from the ports 99 and encapsulates received data packets, commands (CMD) and messages received from the internet ports (e.g. Ethernet, Wi-Fi), sensor interfaces, motor module interface and CPU (e.g. PCIe and USB) to the GEM format at the ingress. The nodes 204, 208 then are able to output to the encapsulated messages (e.g. GEMs) to the HARQ and/or node transmission MAC (described below). At the egress, it accepts GEM-packets from the node reception MAC (received from the root port 230 and/or another node 204, 208, 234) and decapsulates the GEM back to the original data format (as received from the coupled device 102) for output to the device 102 via one of the ports 99. Like in the root ports 230, the HARQ of the nodes 204, 208 perform the hybrid automatic-repeat-request function to ensure that the GEM-Packets are delivered to their destination node or nodes 204, 208, 234 successfully. Specifically, the HARQ is able to be built-in with a repeat transmit timer, transmit GEM list flag table and receipt acknowledgment checking function (e.g. GEM RX-Acknowledge) to trigger GEM re-transmission when timer time-out occurs without receiving the acknowledgment.

The node MAC comprises a transmission MAC (TX MAC), a reception MAC (RX MAC), a security engine (e.g. AES), a forward error correction (FEC) engine, a DBA-Report engine and SERDES IP. The TX MAC is responsible for mapping/packing GEMs into a burst structure (e.g. Burst-PHY-Frame structure) and transmitting the burst messages to root ports 230 and/or nodes 204, 208, 234 during the burst window for the node granted by the dynamic burst allocation engine of the root port 230 for that node. The RX MAC is responsible for receiving and terminating broadcast messages (e.g. Broadcast-PHY-Frames) from root ports 230 and/or nodes 204, 208, 234, extracting GEMs from the broadcast message format, parsing and accepting GEMs addressed to it (e.g. addressed to one of its ports 99) based on the node's SLA Profile setting, and subsequently outputting the data to the encapsulation/decapsulation engine.

The DBA report engine reports total data packet and message in queues (e.g. EPOCH Queues) to the HDBA engine of the associated root port 230 through the burst reporting (as described above). Additionally, the DBA report engine accepts GEM-Grant messages from the HDBA of the associated root port 230 and/or the DBA of the associated gate 202, and prepares the node transmission MAC to build a burst message (e.g. Burst-PHY-Frame) with the GEMs stored in the queues (e.g. EPOCH Queues).

The node activation processor is responsible for performing and completing the node 204, 208, 234 activation process and procedures between nodes 204, 206, 234 and root ports 230. The security engine is able to be an AES-128/256 encryption and decryption functional block used for both the reception and transmission MACs. Alternatively, other encryption is able to be used. The FEC engine is used for controlling errors in data transmission over unreliable or noisy communication channels. In some embodiments, the FEC engine uses Reed Solomon FEC coding schemes of RS (255,216) and RS (225,232) for 10G and 2.5G data rates, respectively. The burst-mode SERDES uses fast clock and data recovery (CDR) locking mode to ensure fast fiber-cut, fast fail-over and protection switch recovery.

Finally, after activation processing (e.g. after the registration process is complete), the nodes 204, 206, 234 are able to broadcast a DDS message to entire bus 104 to inform and notice the root ports 230, switch 228, gates 202 and/or other nodes 204, 206, 234 that a new device has joined and registered to bus 104 at that node 204, 208, 234. Further, the nodes 204, 206, 234 are able to listen to DDS messages from the switch 228 and other new the nodes' 204, 206, 234 declaration of joining the bus 104 and update their global SLA profile database and settings based on the DDS messages.

Gates

The gates 202 are able to comprise a node MAC (with multiple Virtual node State-Machines and buffering), an adaptive domain bridge (ADB), a root port MAC (with built-in gate DBA functionality/gate DBA), a gate SLA profile database and a burst-mode SERDES. The node MAC comprises one or more of a transmission MAC, reception MAC, security engine (e.g. AES), FEC engine, DBA report functional module, SERDES functional module and/or multiple sets (e.g. one for each node within the subnetwork 210) of virtual node processors, virtual node profiles and settings, and related MIB counters and reporting logics. The transmission MAC receives GEMs from the gate ADB and maps and packs then into their associated virtual node burst structure (e.g. Burst-PHY-Frame structure) based on the gate's virtual node SLA Profile database settings. Further, the transmission MAC aggregates multiple virtual node burst structures (e.g. Burst-PHY-Frames) into one gate burst structure (e.g. GATE/Turbo Burst-PHY-Frame) and transmits burst message to the root port 230 through the network 206 based on the granted burst window for those nodes 208 received from the HDBA of the root port 230. The node reception MAC receives broadcast messages (e.g. Broadcast-PHY-Frames) from the root port 230, extracts GEMs from the messages, parses the headers of the GEMs, determines which messages are for nodes 208 within the subnetwork 210 of the gate 202 based on the GEM-Headers and virtual nodes SLA Profile database settings and outputs those messages to the ADB.

The ADB performs a bridging function between the node MAC and the root MAC of the gates 202. Specifically, in the broadcast direction (from the root port 230 to the nodes 208), the ADB receives GEMs from node reception MAC and performs a GEM header lookup, checking and filtering function based on the gate virtual node profile database in order to accept GEMs belonging to nodes 208 of the gate's 202 subnetwork 210. The ADB is then able to output those GEMs to root port transmission MAC of the gate 202. In the burst direction (from the nodes 208 to the root port 230), the ADB receives GEMs from root reception MAC, stores them in their associated virtual node buffer memory, and output them to the virtual node transmission MAC when their burst window start time arrives.

The root port MAC of the gates 202 comprise a transmission MAC, a reception MAC, a security engine (e.g. AES), an FEC engine, a gate DBA and burst mode SERDES modules. The transmission MAC is responsible for accepting GEMs from ADB, mapping and packing the GEMs into a broadcast format (e.g. Broadcast-PHY-Frame structure), and outputting the broadcast formatted frames to burst-mode SERDES. The reception MAC is responsible for receiving burst messages (e.g. Burst-PHY-Frames) from burst-mode SERDES (e.g. a far end node), extracting the GEMs from the messages, parsing and accept only GEMs targeted for nodes 208 within the gate's 202 subnetwork 210 (as indicated based on the parsed GEM headers and the SLA Profile settings), and then outputting the GEMs to the ADB of the gate 202. The DBA of the gate 202 is an extension HDBA of the root ports 230. The gate DBA grants and allocates node burst windows based on the gate DBA SLA profile settings (which is a subset of the root HDBA). The gate SLA profile database includes a list of node identifiers belonging to this gate 202 (e.g. located within the subnetwork 210 of the gate 202), an SLA profile table of node identifiers for a gate DBA function and GEM forwarding information. The burst mode SERDES accepts broadcast messages (e.g. Broadcast-PHY-Frames) from the root transmission MAC and transmits to nodes 208 in the subnetwork 210 in the broadcast transmission direction. In reception direction, the burst-mode SERDES receives burst messages (e.g. Burst-PHY-Frames) from nodes 208 through the subnetwork 210 and outputs them to the root reception MAC for message/frame termination and GEM extraction.

The main function of gates 202 is to extend the central transmission network 206 of one of the root ports 230 by bridging to one or more subnetworks 210 (and the nodes 208 therein) through adaptive bridging. In particular, the gates 202 are able to burst messages from the nodes 208 and/or other gates 202' within their subnetwork 210 to the root port 230 of the network 206 they are in as if the burst traffic were coming from nodes within the central transmission network 206. Similarly, the gates 202 are able to broadcast messages received from other nodes 204, 208, 234, the switch 228 and/or root port 230 to the nodes 208 and/or other gates 202' within their subnetwork 210 they are in as if the nodes 208 and/or other gates 202' were within the central transmission network 206. As a result, the gates 202 are able to extend the central transmission networks 206 to additional nodes 208 and/or different types of subnetworks 210 while maintaining a burst/broadcast communication method within the central transmission networks 206.

In more detail, in the transmission Burst direction (e.g. from the nodes/gates to the root ports/switch/core), the burst window granting mechanism from node 208 to gate 202 to root 230 is able to comprise the following steps. First, the DBA of the gate 202 is a subset of the HDBA of the root port 230 (of the network 206 that the gate 202 is a part of) and therefore is transparent to the root port 230 and nodes 208. Second, when the gate 202 receives a burst window grant message (e.g. GEM-Grant message) broadcast from its root port 230, it uses the message header (e.g. GEM-Header) to lookup gate SLA profile database for GEM forwarding information. In other words, it uses the header data to determine if the grant message is for any of the nodes 208 within its subnetwork 210 as indicated in the gate SLA profile database. If the grant message is not for any of the nodes 208 of its subnetwork 210 the gate 202 drops the grant message, otherwise, the gate stores the message in its virtual node database, updates the database and broadcasts a new window grant message (e.g. GEM-Grant message) to all the nodes/gates in its subnetwork 210 that is directed to the node 208 to which the original grant message was directed. In response, the node 208 provides a burst message to the gate 202 and the gate 202 formats and/or otherwise prepares the message for bursting to the root port 230 at the burst window start indicated in the received window grant message for that node 208.

Third, in order to get best throughput bandwidth, high burst bandwidth efficiency and/or low transmission latency, gate 202 is able to adjust the grant window indicated in this new grant message to be at least a predetermined amount of time before the grant window indicated in the original grant message. In particular, this amount of time provides the gate 202 time to receive and format the burst data from the node 208 before bursting the data from the gate 202 to the root port 230 at the time indicated by the original window grant message. Indeed, by doing this for multiple nodes 208 at the same time, the gate 202 is able to aggregate the messages from multiple different nodes (e.g. multiple Burst-PHY-frames) into a single bigger burst message (e.g. GATE Burst-PHY-Frame).

Fourth, due to the protocols between gate traffic DBA reporting and the root port 230 window granting, root port 230 and gates 202 are able to maintain a group-membership list table and be aware of the virtual nodes 208 that each of the gates 230 belong to as a group. Thus, when a node 208 issues a report message (e.g. GEM-Report) to HDBA of the root port 230, the gate 203 is able to intercept the report message, modify it to include the GEMs data temporarily stored in gate's 202 virtual node buffer memory if there is any, and issue a new report message to HDBA of the root port 230. In other words, the gates 202 are able to combine reporting messages from the nodes in their subnetworks 210 in order to make the reporting more efficient.

Additionally, when HDBA of the root ports 230 are issuing a grant message (e.g. GEM-Grant message) to nodes 208 that are in a subnetwork 210, because they are aware of all of the nodes 208 that are in that subnetwork 210 (e.g. via the virtual node database), the HDBA of the root ports 230 are able to ensure that the grant windows for nodes 208 that belong to the same gate 202 and/or subnetwork 210 are in sequence/continuous order so that the gate 202 is able to combine and/or burst all the virtual node's burst messages (e.g. burst-PHY-Frames) without each having a preamble except for the first one. This provides the benefit of reducing preamble overhead and increasing the burst bandwidth efficiency (especially for small bursts of GEM-Control messages).

In other words, for the data-path, the gates 202 receive burst messages (e.g. burst-PHY-frames) from burst-mode SERDES and far-end nodes 208, extracts the GEMs from the messages in the root reception MAC of the gate 202, stores the GEMs in their associated virtual NODE buffer memory and waits for the virtual node burst window grant to come in from the root port 230 for those virtual nodes 208. Then, the gates 202 are able to map and pack the stored GEMs for that node 208 and other nodes 208 back into the burst message format thereby aggregating multiple burst messages together into one bigger burst message in the node transmission MAC of the gates 202. Finally, the gates 202 are able to transmit this bigger burst message to the SERDES and to the root port 230 through the network 206 based on granted burst windows (e.g. the multiple consecutive virtual node burst windows of that gate 202).

Now looking to the broadcast direction (e.g. from the root ports/switch/core to the nodes/gates), again the gates 202 are able to extend central networks 206 to the subnetworks 210 while being transparent to both the root port 230 for their network 206 and the nodes 208 in their subnetwork 210. In order to effectuate this, the gates 202 are able to act like virtual nodes and receive broadcast messages (e.g. Broadcast-PHY-Frames) from the root ports 230, extract the GEMs from the messages, drop any GEMs that are not directed to one of the nodes 208/gates 202' in their subnetwork 210 (e.g. as indicated by the message headers and the gate SLA profile database). Otherwise, the gates 202 are able to use store-and-forward and/or cut-through schemes to pack and map the GEMs back into the root port broadcast message structure (e.g. Broadcast-PHY-Frame structure) in a root transmission MAC of the gate 202 and broadcast the new broadcast message to all the nodes 208 and/or gates 202' in its subnetwork 210.

Data Transmission Operation

In operation, the bus 104 operates using a burst/broadcast communication scheme wherein all data messages from the nodes 204, 208, 234 (and gates 202) are funneled to the core 200 using a burst transmission method where transmission windows that are dynamically adjustable in size (by the core 200) are granted to the nodes 204, 208, 234 such that they (or a gate 202 on their behalf) are able transmit their data messages as a "burst" within the granted window. If the transmitting node is in a subnetwork 210, the gate 202 (acting as a root port of that network 210) receives the bursted message from the node 208 through the subnetwork 210 and then subsequently bursts the message through the central network 206 to the core 200 (as if the node 208 was a part of the central network 206). In doing this burst communication, the gate 202 is able to aggregate burst messages from multiple nodes 208 within the subnetwork 210 thereby increasing efficiency and reducing the effects of the subnetwork's 210 possibly increased latency relative to the central network 206. Indeed, this is able to be repeated for gates 202' within subnetworks 210 that provide a gateway to sub-subnetworks 210' and so on to support any number of "chained/gated" networks. Further, the gate 202 is able to be transparent to the core 200 and nodes 208 in this process such that messages do not need to be addressed to the gate 202.

The core 200 receives these messages (from one or more root ports 230 coupling the core 200 to each of the central networks 206), processes them (including modifying and/or determining their target destination), and broadcasts them (and any messages originating in the core 200) onto whichever central transmission network 206 the target node 204, 208, 234 (or gate 202 representing the target node 208) for that message is located. Like the burst communication above, if the target node 208 is within the subnetwork 210, the gate 202 bridging to that subnetwork 210 is able to receive/intercept the message from the core and rebroadcast the message to all of the node 208 (and/or gates 202') on the subnetwork 210. Any broadcast messages for target nodes 204 not on the subnetwork 210 (or a subnetwork thereof) are able to be discarded by the gate 202 in order to increase efficiency. Again, this process is transparent and able to be repeated by gates 202' within subnetworks 210 and so on for any number of chained networks to broadcast the messages through the networks. As a result, all the nodes 204, 208, 234 (and gates 202) on each of the networks 206 (and subnetworks 210 coupled thereto) receive all of the messages from the core 200 broadcast on that network 206 and merely need to look for which messages are directed to them while discarding the others.

In more detail, when the nodes 204, 208, 234 receive data from one or more external devices 102 through one or more of their IO ports 99, they store the data in a GEM-ID queue buffer memory and burst a report message (e.g. GEM-Report) to the root port 230 of the central network 206 that they are in (either directly or through one or more gates 202 if they are in a subnetwork 210 of the central network 206) and wait to be granted a burst window to transmit the input data. As described above, the gates 202 are able to collect and aggregate report messages from a plurality of the nodes 208 (and or gates 202') in their subnetwork 210 into a single bigger report message that the gate 202 is able to more efficiently burst to the root port 230 during the burst window for those ports 208.

At the same time, the nodes 204, 208, 234 are able to encapsulate the input data into the GEM format (fragmenting GEMs exceeding a predefined size into smaller GEMs), encrypt GEMs with the security key of the node 204, 208, 234, update the HARQ table, map and pack the GEMs into a burst format (e.g. Burst-PHY-Frame format) and perform encoding (e.g. FEC RS (255,216) encoding). Subsequently, upon grant and arrival of the burst window for each of the nodes, the nodes burst the GEMs including the input data to the associated root port 230.

The HDBA of the root ports 230 receive all of the report messages from the nodes 204, 208 (and/or gates 202) and perform a DBA analysis for each of the nodes 204, 208 based on the SLA profile database, latency sensitive level, traffic congestion feedback, committed information rate (CIR)/peak information rate (PIR) feedback and/or other factors to determine grant window burst size and start-time for each of the nodes 204, 208. Once the granted burst windows have been determined for one or more of the nodes 204, 208, the root port 230 broadcasts the windows to each of the nodes in a broadcast grant message (e.g. GEM-Grant) to all of the nodes 204, 208 in the associated central network 206 and/or any subnetworks 210 (via the gates 202). As described above, the broadcast messages from the root ports 230 are the same size, whereas the burst windows from the nodes 204, 208 to the root ports 230 are able to vary in size as dynamically assigned by the HDBA.

The gates 202, upon receipt of the broadcast grant messages targeting nodes 208 within their subnetwork 210 (or a subnetwork thereof), broadcast new grant messages to all of the nodes 208 with the subnetwork 210. Specifically, these new grant messages are able to specify burst windows that occur before the time indicated by the original/root port grant window. This is to ensure the gates 202 to receive (e.g. be "bursted") the input data/GEMs from the port 208 before the original/root port grant window, thereby giving the gates 202 time to aggregate the data/GEMs from multiple nodes 208 and/or ports 99 into single larger messages for burst to the root port 230 when the original/root port grant window arrives. As a result, the gates 202 are able to make up for inefficiencies and/or slower aspects of the subnetworks 210 such that they do not slow down the efficiency of the central transmission networks 206.

Upon receipt of the burst messages including the GEMs (including the input data from the external devices 102), the root ports 230 are able to perform decoding (e.g. FEC RS (255,216) decoding) and error correction on the burst messages to decode and correct any transmission errors. The root ports 230 are then able to extract the GEMs from the burst messages (e.g. the transmission frame format), decrypt the extracted GEMs (e.g. with AES-128/256 and a source-node security key), bypass the GEM fragmentation block and pass GEMs to the switch 228. For each of the GEMs, the switch 228 is then able to perform a GEM-Header lookup, parse and classify Ethernet L2/L3 address and headers, process GEM forward flow-chart and determine GEM forwarding destination info, store the GEM in (e.g. cut-through) buffer-memory, and output the GEM to HARQ and to the destination root port 230 (e.g. the root port 230 whose network 206 or subnetwork 210 thereof includes the destination node 204, 208) based on the SLA database QoS output scheduler.

The root ports 230 receive the GEMs, perform GEM encryption (e.g. AES-128/256 encryption) with target node's (or broadcast GEM's) security key, pack and map GEMs into a broadcast message structure (e.g. Broadcast-Frame structure), encode the message (e.g. FEC RS (255, 216) encoding), and finally broadcast the broadcast messages to all of the nodes 204, 208 in that root port's network 206 and subnetworks 210 thereof. If the node 208 is within a subnetwork 210, the gate 202 to that subnetwork receives the broadcast message and broadcasts the message to all of the nodes 208 within the subnetwork 210. In some embodiments, the gates 202 filter out any broadcast messages that are not targeted to nodes 208 within its subnetwork 210 (or a subnetwork thereof) and only broadcasts the broadcast messages that do target one of those nodes 208. Alternatively, the gates 202 are able to rebroadcast all of the broadcast messages to the nodes 208 within its subnetwork 210 without determining if the messages relate to one of those nodes 208.

All the nodes 204, 208 monitor the received broadcast messages, processing those intended for the node 204, 208 and discarding the others. Specifically, for the non-discarded messages, the nodes 204, 208 decode and error correct the messages (e.g. FEC RS (255,216) decoding), extract the GEMs from the broadcast message format (e.g. BC-PHY-Frame), decrypt the extracted GEM (e.g. with AES-128/256 and the destination node's security key), decapsulate the data from the GEM format back to original IO-Port data format, and output the data through the designated IO port 99 to the external device 102. As a result, the bus 104 and system 100 provides the benefit of being able to combine multiple different networks having varying input data, varying processing speeds and data constraints while still maintaining low latency and high throughput needed for machine automation systems. This is a unique intranet system architecture and specially defined and optimized for such machine automation applications.

Figure 4:
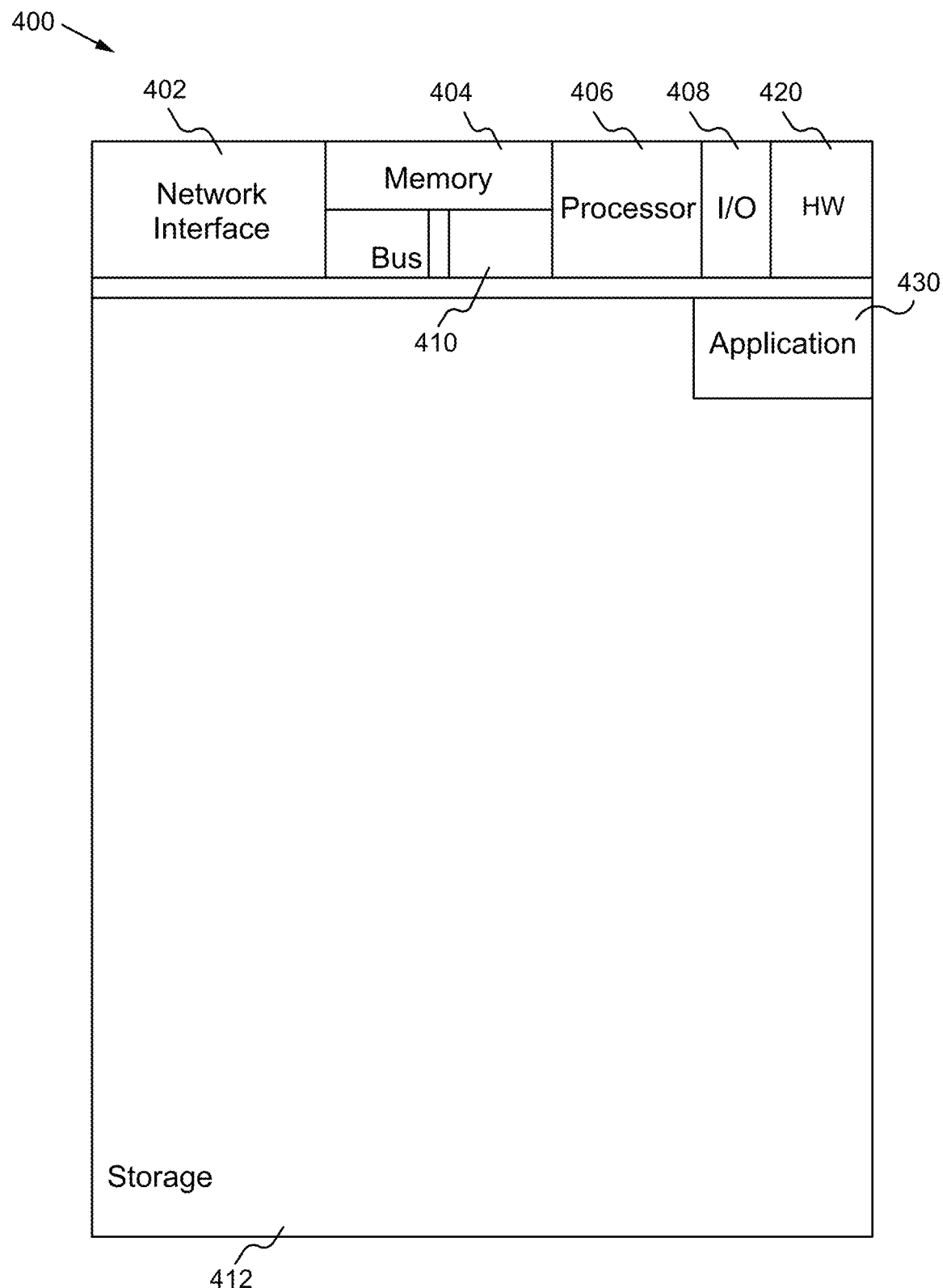
FIG. 4 illustrates a block diagram of an exemplary computing device configured to implement the system according to some embodiments.

FIG. 4 illustrates a block diagram of an exemplary computing device 400 configured to implement the system 100 according to some embodiments. In addition to the features described above, the external devices 102 are able to include some or all of the features of the device 400 described below. In general, a hardware structure suitable for implementing the computing device 400 includes a network interface 402, a memory 404, a processor 406, I/O device(s) 408 (e.g. a reader), a bus 410 and a storage device 412. Alternatively, one or more of the illustrated components are able to be removed or substituted for other components well known in the art. The choice of processor is not critical as long as a suitable processor with sufficient speed is chosen. The memory 404 is able to be any conventional computer memory known in the art. The storage device 412 is able to include a hard drive, CDROM, CDRW, DVD, DVDRW, flash memory card or any other storage device. The computing device 400 is able to include one or more network interfaces 402. An example of a network interface includes a network card connected to an Ethernet or other type of LAN. The I/O device(s) 408 are able to include one or more of the following: keyboard, mouse, monitor, display, printer, modem, touchscreen, button interface and other devices. The operating software/applications 430 or function(s)/module(s) thereof are likely to be stored in the storage device 412 and memory 404 and processed as applications are typically processed. More or fewer components shown in FIG. 4 are able to be included in the computing device 400. In some embodiments, machine automation system hardware 420 is included. Although the computing device 400 in FIG. 4 includes applications 430 and hardware 420 for the system 100, the system 100 is able to be implemented on a computing device in hardware, firmware, software or any combination thereof.

Figure 5:
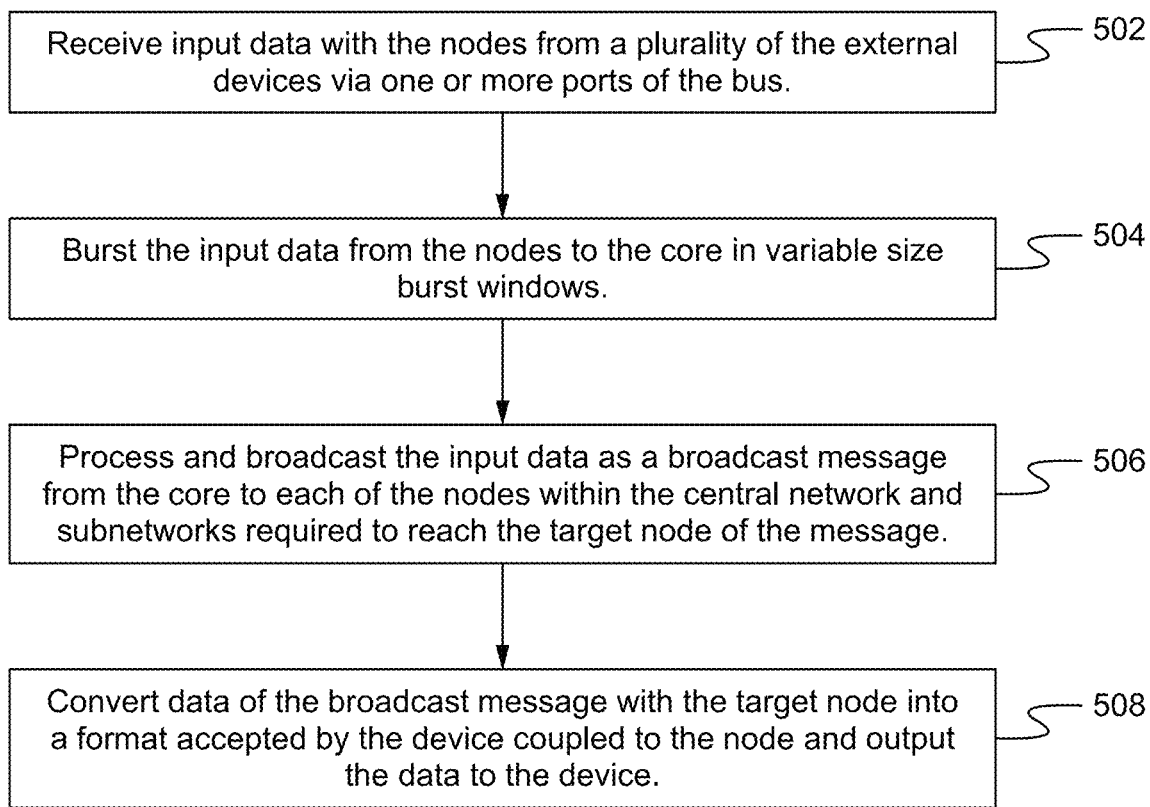
FIG. 5 illustrates a method of operating a machine automation system including an intelligent controller and sensor intranet bus according to some embodiments.

FIG. 5 illustrates a method of operating a machine automation system 100 including an intelligent controller and sensor intranet bus 104 according to some embodiments. As shown in FIG. 5, the nodes 204, 208 receive input data from a plurality of the external devices 102 via one or more ports 99 of the bus 104 at the step 502. The nodes 204, 208 burst the input data as burst messages to the core 200 in variable size burst windows at the step 504. In some embodiments, for each of the nodes 204, 208, the HDBA of the root ports 230 dynamically adjusts the burst window start time and size of the variable burst window and assign the adjusted window the corresponding node 204, 208 in a broadcast grant window message based on data traffic parameters reported from that one of the nodes 204, 208. In some embodiments, the gates 202 aggregate two or more burst messages including input data and/or traffic reporting received from the nodes 208 into single larger burst reporting or input data message for bursting to the core 200. In such embodiments, the gates 202 are able to omit portions of the received burst messages (e.g. preambles) in order to enhance the efficiency of the bus 104. In some embodiments, upon receiving the broadcast window grant messages from the core 200, the gates 202 adjust the original time of the burst window to an earlier time and broadcast the adjusted broadcast window grant messages to the nodes 208. As a result, the nodes 208 burst their data to the gates 202 before the window granted by the root port 230 such that the gates 202 are able to combine multiple burst messages together and burst them in the later original time window. The core 200 processes and broadcasts the input data as broadcast messages to each of the nodes 204, 208 within the central network 206 and subnetworks 210 required to reach the target node 204, 208 of the message at the step 506. The target node 204, 208 converts data of the broadcast message into a format accepted by the device 102 coupled to the node 204, 208 and outputs the data to the device 102 at the step 508. As a result, the method provides the advantage of enabling the bus 104 to maintain high speed despite the use of lower speed network mediums.

Message Retransmission Mechanism

When a node 204, 208 transmits a Burst-PHY-Frame to a root port 230 of the core 200 or vice-versa for a broadcast-PHY-frame (e.g. destined for the core 200 and/or one or more other nodes/devices coupled to the bus 104), there is no guarantee every Burst/broadcast-PHY-Frame will be delivered to the root/nodes successfully. Therefore, the system 100 employs a message retransmission mechanism implemented by the nodes 204, 208 and the root ports 230 and/or core 200 in order to compensate for errors in message transmission.

Figure 18:
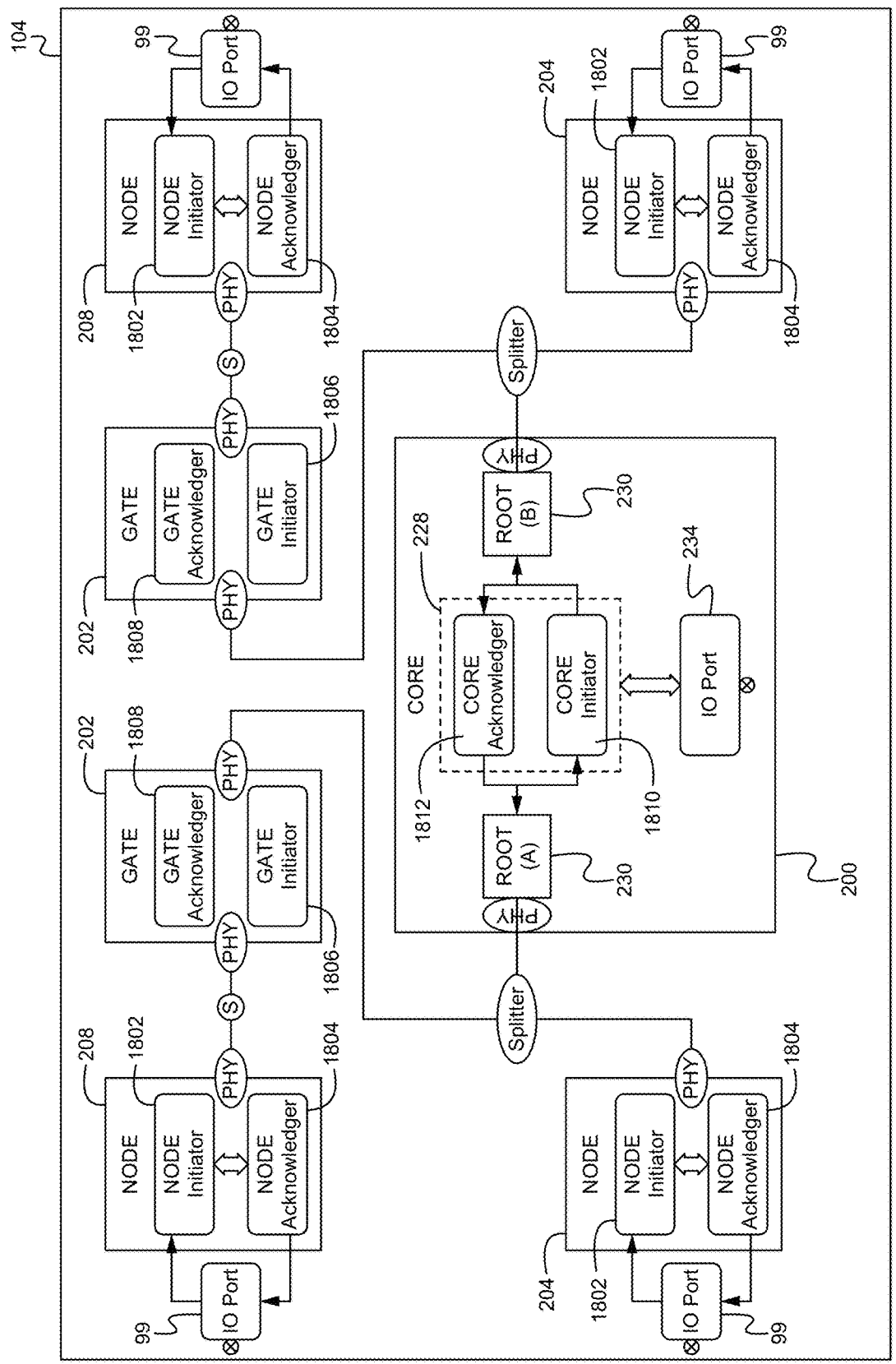
FIG. 18 illustrates a message retransmission mechanism of the bus according to some embodiments.

FIG. 18 illustrates a message retransmission mechanism of the bus 104 according to some embodiments. As shown in FIG. 18, each of the nodes 204, 208 include a node initiator 1802 and a node acknowledger 1804, each of the gates 202 include a gate initiator 1806 and a gate acknowledger 1808 (which are able to implement one or more virtual initiators/acknowledgers for any virtual nodes implemented by the gate 202), and the core 200 includes a core initiator 1810 and a core acknowledger 1812 that is shared by each of the root ports 230 (which is able to implement virtual initiators/acknowledgers for each node 204, 208 coupled with each of the roots 202). In particular, the core acknowledger 1812 is able to implement a virtual acknowledger for each of the nodes 204, 208 that is dedicated to acknowledging messages received from those nodes. Similarly, the core initiator 1810 is able to implement a virtual initiator for each of the nodes 204, 208 that is dedicated to initiating the re-send mechanism for messages (e.g. unicast messages) sent to those nodes. Additionally, the core initiator 1810 is able to also implement a virtual broadcast initiator for each root port 230 that is dedicated to initiating the re-send mechanism for messages (e.g. broadcast messages) broadcast to all the nodes 204, 208 of that root port 230. Alternatively, one or more of the root ports 230 are able to have separate initiators 1810 and/or acknowledgers 1812. Each of the node, gate and root initiators and/or acknowledgers are able to comprise are have access to one or more processors for executing the mechanism described herein and/or one or more memories (e.g. SRAM) for storing a re-send table and local copies of transmitted GEM packets 600.

In node to root transmission operation, as described in the data transmission operation section above, a root port 230 transmits a grant window message (see FIGS. 6D and 6E) to one of the nodes 204, 208 (and/or gates 202) identifying a grant window allocated to that node. Subsequently, the node 204, 208 (and/or gate 202) use the grant window to burst a message to root port 230 of the core (e.g. using burst-PHY-frames), wherein the message includes one or more GEM packets 600. Each packet is able to include a source node identifier 612 (including a transmission sequence group identifier), a GEM identifier 614, a transmission sequence identifier 618, an acknowledgment request, and/or other data as described above. In particular, the node identifier 614 is able to include a portion (e.g. two bits) that identify the sequence group of the packet whereas the remaining portion identifies the source node. For each of the GEM packets 600 in the burst message where acknowledgment is requested (e.g. as indicated via the acknowledgment request field 620), the node initiator 1802 (and/or gate virtual initiator 1806) creates a new re-send flow including a local copy of the packet 600 in the node initiator 1802 local memory as well as a new entry in a re-send table. This data is able to be used to re-send one or more of the packets if necessary.

The new entry in the re-send table is able to comprise one or more of a port identifier, a node identifier, an epoch identifier, a sequence identifier, a sequence group identifier, a GEM packet header, a GEM pointer, a GEM re-send timer, a GEM re-send timeout threshold, a GEM re-send counter and a maximum GEM re-send threshold. The port identifier, for nodes 204, 208, is able to identify the port 99 of the node 204, 208, for gates 202, is able to identify the root 230 and the node identifier, and for the core/root, is able to identify one of the roots 230. The node identifier is able to identify the source node 204, 208 that initiated the message. The epoch identifier is able to identify the GEM-packet (from the port of the source node). The sequence group identifier and sequence identifier identify the sequence group to which the packet 600 was assigned and the sequence number within that group that was assigned to that packet 600. The GEM packet header in able to be a copy of the header of the GEM packet. The GEM pointer is able to point to the associated local copy of the packet within the local memory. The GEM re-send timer is able to count the time that has elapsed since the packet 600 was transmitted and the GEM re-send timeout threshold is able to be a configurable value that indicates what value the re-send timer needs to reach to trigger an automatic re-send of the packet. The GEM re-send counter is able to indicate how many times the packet 600 has needed to be re-sent and the maximum GEM re-send threshold is able to be a configurable value that indicates what value the re-send counter needs to reach to prevent further re-sends of the packet (e.g. by clearing the associated entry and local copy and/or sending an interrupt to the core 200 to identify the transmission issue). Alternatively, the table is able to include more or less fields.

After transmitting the grant window message, the core acknowledger 1812 monitors the grant window for receipt of a burst message from the node 204, 208 to which the window was granted. If no message is received during that time, core acknowledger 1812 transmits a missed burst acknowledgment message to the node 204, 208 that indicates that the root port 230 did not receive a message during the grant window and the root port 230 re-grants the same grant window to the node 204, 208 during the next cycle (e.g. via another grant message indicating the same time slot and/or size). In some embodiments, the missed burst acknowledgment message is broadcast to all of the nodes 204, 208 in the network 206, 210 of the root port 230. Alternatively, the missed burst acknowledgment message is able to be unicast or multi-cast to one or a subset of the network 206, 210. Upon receiving the missed burst acknowledgment message (and subsequently the grant message), the node initiator 1802 recreates the burst message using the re-send table and the stored local copies of the GEM packets 600 and retransmits the reproduced burst message to the root port 230 during the re-granted grant window (optionally at a higher priority). At the same time, the node initiator 1802 resets the re-send timer and increments the re-send counter. However, if incrementing the re-send counter would cause the value to be beyond the re-send threshold value, the node initiator 1802 performs an action to diagnose why the message delivery continues to fail. For example, the initiator 1802 is able to send an interrupt to the core CPU to perform a link diagnostics test, clear the re-send flow including the stored local copies and/or the entry, the root port 230 could extend the length of the preamble of the burst message and select stronger FEC algorithm for future burst messages, and/or other diagnostic actions.

When/if the root port 230 receives the burst message, the root port 230 un-packs the burst-PHY-frame and parses the received GEM packets 600. For each of the GEM packets 600, the core acknowledger 1812 validates the burst message including the packets 600. For example, the core acknowledger 1812 is able to determine if there are any uncorrectable errors in any of the packets 600 including if the source of the packet 600 cannot be determined due to an error in the header of the GEM packet 600. In some embodiments, validating each of the GEM packets 600 includes one or more of performing forward error correction (FEC), cyclic redundancy check (CRC) validation, Bose, Ray-Chaudhuri, Hocquenghem (BCH) code validation and/or other types of packet error correction.

If the packet is to be broadcast or multicast (not unicast) and the destination of the packet is a node 204, 208 in the same network 206, 210 as the source node 204, 208 (e.g. coupled with the core 200 via the same root port 230) and a part of the nodes 204, 208 that will receive the broadcast or multicast, then acknowledgment is not required for those packets 600 (even if acknowledgment is requested according to the request field 620). Instead, after the core 200 processes the packets 600 as necessary, the root 230 broadcasts or multicasts the packets without any uncorrectable errors (e.g. in a broadcast-PHY-frame) to all or the select subset of the nodes 204, 208 on the network 206, 210. As a result, when the source node 204, 208 receives the broadcast/multicast message including the packets, it identifies itself as the source of the packets and the node initiator 1802 removes those packets from the re-send flow. Any packets that are not included in the broadcast/multicast message (e.g. due to uncorrectable errors as described above) are automatically re-sent in a subsequent burst message when their associated re-send timers reach the re-send timer threshold value. These re-sent packets 600 are able to be combined with other packets 600 in a burst message in order to fill the granted transmission window for the node 204, 208. As a result, the message retransmission mechanism provides the advantage of reducing network congestion by not requiring acknowledgment messages when the destination of the packet is a node 204, 208 in the same network 206, 210 as the source node 204, 208.

If the destination of the packet is a node 204, 208 that is not in the same network 206, 210 as the source node 204, 208, then acknowledgment is required for those packets 600 that requested it according to the request field 620. The core acknowledger 1812 constructs and transmits to the source node 204, 208 a received-GEM acknowledgment message (RX-GEM-ACK) that indicates which of the packets 600 are valid and which (if any) of the packets had uncorrectable errors such that they need to be re-sent. The RX-GEM-ACK is able to include a start of sequence identifier, an end of sequence identifier, a sequence group identifier, a source/destination node identifier and/or other fields described herein.

Figure 19:
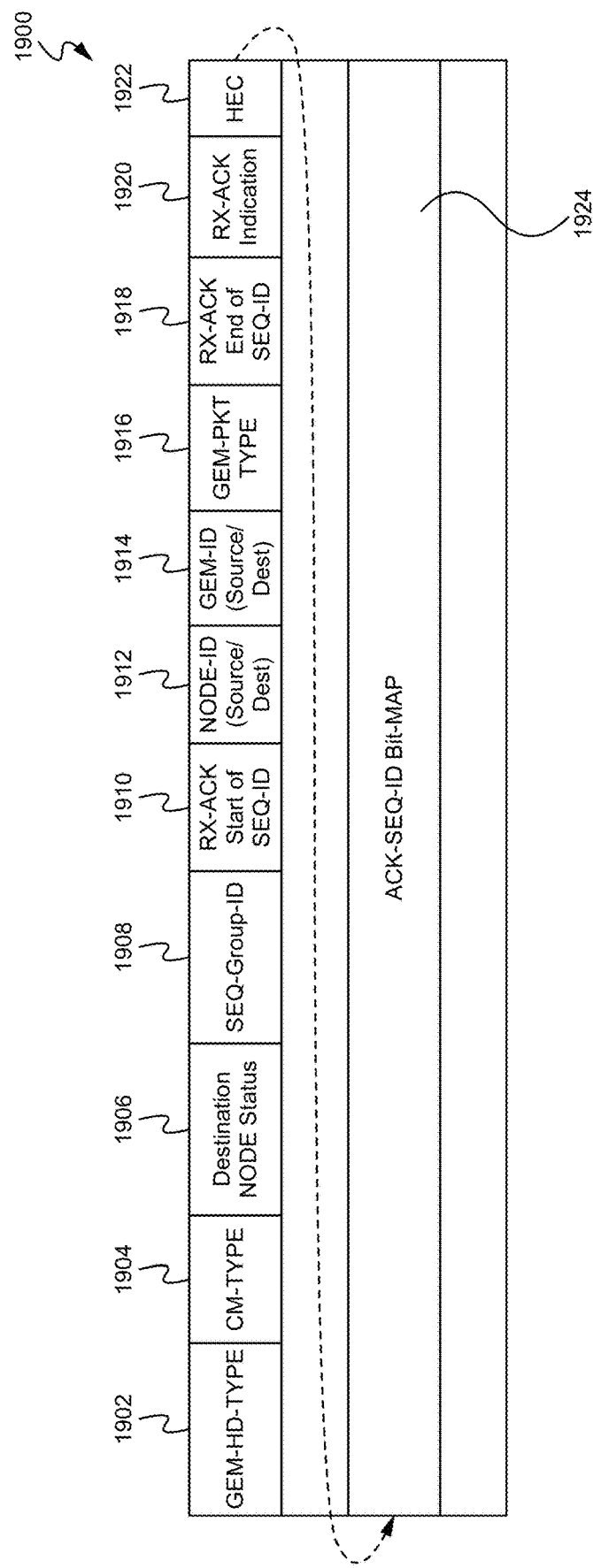
FIG. 19 illustrates an exemplary acknowledgment message according to some embodiments.

For example, as shown in FIG. 19, the RX-GEM-ACK is able to comprise a header type field 1902 (similar to GEM-HD-TYPE 606 as shown in FIGS. 6C-F), a control message type 1904 (similar to control message type 654 in FIG. 6F), a destination node status 1906 that indicates whether the destination node is asleep, powered down or awake, a sequence group identifier 1908 that identifies the which sequence group the packets belong to, a start of sequence identifier 1910 that identifies a first sequence number (of the group), a source/destination node identifier 1912 that identifies the source node or the destination node, a GEM source/destination identifier 1914 (similar to GEM-PKT-ID 614 of FIG. 6B), a GEM-PKT type 1916 (similar to GEM-PKT-TYPE 616 of FIG. 6B), an end of sequence identifier 1918 that identifies a second sequence number (of the group), a received acknowledgment request indicator 1920, an HEC 1922 (similar to HEC 624 of FIGS. 6B-F), and optionally a bit map 1924. In particular, as generated by the core acknowledger 1812, the source/destination node identifier 1912 it able to identify the destination node and the GEM source/destination identifier 1914 identifies the GEM destination.

The received acknowledgment request indicator 1920 is able to indicate whether: the acknowledgment is invalid, the range of sequence numbers from the value of start of sequence identifier 1910 to the value of the end of sequence identifier 1918 are all valid, whether just the sequence numbers of the values of the start and end of sequence identifiers 1910, 1918 are valid (but not necessarily those in between), or the bit map 1924 is included, wherein each bit of the bit map 1924 represents one sequence identifier and indicates whether the packet assigned to that identifier was validated (e.g. received without any uncorrectable errors). Alternatively, more or less fields are able to be used. In some embodiments, the bit map 1924 includes a bit or unit/portion for each sequence number in the sequence group. Alternatively, the bit map 1924 is able to include less than a bit or unit/portion per sequence number. For example, the bit map 1924 is able to only include enough bits/units to identify sequence numbers that are not within the range of sequence numbers from the value of start of sequence identifier 1910 to the value of the end of sequence identifier 1918. As a result, the overhead space required to transmit the bit map 1924 is able to be reduced by utilizing the start/end of sequence identifiers 1910, 1918.

If there were no uncorrectable errors, the RX-GEM-ACK is able to indicate that all the packets identified by the sequence identifier numbers within the start of sequence and the end of sequence identifiers are valid. If there were one or more packets 600 with uncorrectable errors, the RX-GEM-ACK is able to indicate which of the packets in the burst message is valid using the bit map including a bit for each sequence number in the sequence group, where each bit represents one of the packets/sequence numbers and indicates whether that packet/sequence number was valid or invalid. Alternatively or in addition, the RX-GEM-ACK is able to identify a range of the sequence numbers that are all valid or invalid (e.g. using the start of sequence and end of sequence fields as range markers) such that the bit map is able to exclude that range of sequence numbers of the group (such that the bit map and the RX-GEM-ACK is smaller).

When the source node 204, 208 receives the RX-GEM-ACK, the node initiator 1802 identifies which of the packets 600 were validly delivered and remove their associated re-send flows (e.g. remove the re-send table entries and/or local copies). The re-send flows of all the remaining packets (which had uncorrectable errors) remain in the node initiator 1802, which continuously updates their re-send timers and then re-sends them in a subsequent burst message in a subsequent grant window after their re-send timers pass the re-send threshold value (while updating their re-send counter value). This process repeats until all of the packets are validly transmitted (and thus their flows removed) or the re-send counter value reaches the re-send threshold value and an action must be taken as described above. Also, as described above, these re-sent packets 600 are able to be combined with other packets in the subsequent burst messages in order to efficiently fill the grant window.

If for any reason the source node 204, 208 does not receive a missed burst acknowledgment message, a RX-GEM-ACK and a rebroadcast or multicast of the burst message (with the source node 204, 208 as the source), the node initiator 1802 continuously updates the re-send timer (e.g. each cycle) for each of the packets 600 and initiates re-transmission as if a missed burst acknowledgment message was received when the timers reach the threshold value. This process continues until all the packets 600 are validly delivered or the re-send counter value passes the re-send threshold and an action is taken as described above.

If the destination of the message is one or more other nodes (or for messages originating within the core 200), the core 200 needs to process and forward the message from one of the root ports 230 to the destination nodes 204, 208. As described below, this transmission from the root port 230 to the nodes 204, 208 implements its own instance of the message retransmission mechanism that operates in parallel to the mechanism described above.

In this root to node transmission operation, as described in the data transmission operation section above, the core 200 processes the message (e.g. look-ups, header modification, or other packet processing functions), determines the destination node(s) of the message, and passes the message to the root port 230 coupled with those destination node(s). Subsequently, the root port 230 use the next broadcast window to broadcast, multicast or unicast the message to some or all of the nodes 204, 208 within the network 206, 210 coupled to that root port 230 (e.g. using broadcast-PHY-frames), wherein the message includes one or more GEM packets 600. As described above, each packet is able to include a node identifier field 612 (e.g. destination node(s)), a GEM identifier 614, a transmission sequence identifier 618, an acknowledgment request, and/or other data as described above. In particular, the node identifier 614 is able to include a portion (e.g. two bits) that identify the sequence group of the packet whereas the remaining portion identifies the destination node(s).

Like in the node initiator 1802, the core initiator 1810 creates a new re-send flow including a local copy of the packet 600 in the core initiator 1802 local memory as well as a new entry in a re-send table for each of the GEM packets 600 in the broadcast/multicast/unicast message where acknowledgment is requested. As described above, these re-send flows are able to be used to re-send one or more of the packets 600 if necessary. The new entry is able to be the same as the entries of the node/gate initiators 1802, 1806 described above, comprising, for example, one or more of a port identifier, a node identifier, an epoch identifier, a sequence identifier, a sequence group identifier, a GEM packet header, a GEM pointer, a GEM re-send timer, a GEM re-send timeout threshold, a GEM re-send counter and a maximum GEM re-send threshold.

For a unicast message, the re-send flow is able to be operated by virtual initiator (implemented by the core 200) that is dedicated to the node 204, 208 that is the destination of the unicast message/packets 600. As described above, the core initiator 1810 is able to implement a separate virtual initiator for each node 204, 208 that handles re-send flows for packets that are unicast to that node 204, 208. For a broadcast or multicast message, the re-send flow is able to be operated by a broadcast or multicast specific virtual initiator that corresponds to all the nodes 204, 208 included in the broadcast (e.g. all nodes of that network 206, 210) or all the nodes 204, 208 included in the multicast (e.g. a subset of the all the nodes of that network 206, 210). In such embodiments, the root 200 is able to designate one of the nodes 204, 208 of that broadcast or multicast group of nodes as the acknowledging node, wherein that node 204, 208 is configured to acknowledge all messages/packets that are broadcast/multicast on the network 206, 210 (even if the message/packets were not intended for that node), while the other nodes 204, 208 do not respond (even if the message/packets were intended for those nodes). As a result, instead of a plurality of separate virtual initiators for each node creating re-send flows for each of the packets destined for that node, the broadcast or multicast specific virtual initiator is able to create a single re-send flow for the whole broadcast/multicast message that only corresponds to the acknowledging node, but is able to represent the entire broadcast/multicast group of nodes 204, 208. Alternatively, the core 200 is able to designate an acknowledging subset of the nodes 204, 208 of the network 206, 210 as the acknowledging nodes, wherein there is a separate broadcast or multicast specific virtual initiator implemented by the core initiator 1810 for each node of the acknowledging subset (which would still be less than a separate one for all of the nodes in the broadcast/multicast group of nodes).

In some embodiments, the acknowledging node(s) are selected based on the order in which broadcast messages are received by the nodes 204, 208 (e.g. the last node in the order is able to be selected because it is the most likely to receive errors). Alternatively, the broadcast or multicast specific virtual initiators are able to be omitted and for the "unicast" virtual initiator of each node 204, 208 is able to create a re-send flow if that node is a destination of one or more of the packets of the broadcast/multicast message. In such embodiments each node 204, 208 is able to send acknowledgment messages back to the root port 230 (not just a selected one or subset). It should be noted that for the sake of brevity the following discussion describes a single destination or acknowledging node. However, it is understood that in the case of a plurality of destination or acknowledging nodes each destination or acknowledging node would perform the actions described herein.

Subsequently or concurrently, the root port 230 (as notified by the core initiator 1810) is able to transmit a grant window message (see FIGS. 6D and 6E) to the destination or acknowledging node 204, 208 identifying a grant window allocated to the node(s) for acknowledging receipt of the message. After the grant window message is transmitted, the core acknowledger 1812 monitors the grant window for receipt of a burst acknowledge message from the destination or acknowledging node 204, 208.

If it does not receive an acknowledgment message RX-GEM-ACK within the re-send timer period, the core initiator 1810 (via the virtual initiator associated with the packets whose re-send timer has expired) recreates the unicast/broadcast/multicast message using the re-send table and the copies of the GEM packets 600 and retransmits the reproduced message in the same manner and to the same nodes 204, 208 as the original message using the next broadcast window (optionally at a higher priority). At the same time, the core initiator 1810 resets the re-send timer and increments the re-send counter for each of the packets' re-send flows (e.g. in each unicast virtual initiator of the associated nodes or the broadcast/multicast virtual initiator). However, if incrementing the re-send counter would cause the value to be beyond the re-send threshold value, the core initiator 1810 performs an action to diagnose why the message delivery continues to fail. For example, the initiator 1810 is able to send an interrupt to the core CPU to perform a link diagnostics test, clear the re-send flow including the stored local copies and/or the entry, the root port 230 could extend the length of the preamble of the burst message and select stronger FEC algorithm for future burst messages, and/or other diagnostic actions.

For each of the nodes 204, 208 that receive the broadcast/multicast/unicast message, but are not the destination node for unicast or acknowledging node for multicast/broadcast, the nodes 204, 208 may accept the packets if they are intended for the nodes 204, 208, but they will not send an acknowledgment to the root port 230 (because they are not the destination node or acknowledging node).

For each of the nodes 204, 208 that receive the broadcast/multicast/unicast message and are the destination node for unicast or acknowledging node for multicast/broadcast, the nodes 204, 208 may accept the packets if they are intended for the nodes 204, 208, but even if not, they will send an acknowledgment to the root port 230 (because they are the destination node or acknowledging node). Specifically, when/if the destination or acknowledging node 204, 208 receives the broadcast/multicast/unicast message, the destination or acknowledging node 204, 208 un-packs the message (e.g. broadcast-PHY-frame) and parses the received GEM packets 600. For each of the GEM packets 600, the node acknowledger 1802 validates the message including the packets 600. For example, the node acknowledger 1802 is able to determine if there are any uncorrectable errors in any of the packets 600 including if the source of the packet 600 cannot be determined due to an error in the header of the GEM packet 600. In some embodiments, validating each of the GEM packets 600 includes one or more of performing forward error correction (FEC), cyclic redundancy check (CRC) validation, Bose, Ray-Chaudhuri, Hocquenghem (BCH) code validation and/or other types of packet error correction.

If one or more of the packets 600 requested acknowledgment according to the request field 620, the node acknowledger 1804 constructs and transmits to the root port 230 (of that network 206, 210) a received-GEM acknowledgment message (RX-GEM-ACK) that indicates which of the acknowledgment requesting packets 600 are valid and which (if any) of the packets had uncorrectable errors such that they need to be re-sent. The RX-GEM-ACK is able to be substantially similar to the RX-GEM-ACK sent by the core acknowledger 1812 described above with respect to FIG. 19. However, in some embodiments when generated by the node acknowledger 1804, the source/destination node identifier 1912 is able to identify the source node and the GEM source/destination identifier 1914 is able to identify the GEM source.

If there were no uncorrectable errors, the RX-GEM-ACK is able to indicate that all the packets identified by the sequence identifier numbers within the start of sequence and the end of sequence identifiers are valid. Contrarily, if there were one or more packets 600 with uncorrectable errors, the RX-GEM-ACK is able to indicate which of the packets in the broadcast/multicast/unicast message is valid using the bit map including a bit for each sequence number in the sequence group, where each bit represents one of the packets/sequence numbers and indicates whether that packet/sequence number was valid or invalid. Alternatively or in addition, the RX-GEM-ACK is able to identify a range of the sequence numbers that are all valid or invalid (e.g. using the start of sequence and end of sequence fields as range markers) such that the bit map is able to exclude that range of sequence numbers of the group (such that the bit map and the RX-GEM-ACK is smaller).

When the source root port 230 receives the RX-GEM-ACK from the destination or acknowledging nodes, the corresponding virtual initiators of the core initiator 1810 identify which of the packets 600 were validly delivered and remove their associated re-send flows (e.g. remove the re-send table entries and/or local copies). The re-send flows of all the remaining packets (which had uncorrectable errors) remain in the corresponding virtual initiators, which continuously update their re-send timers and then re-sends them in a subsequent broadcast/multicast/unicast message in a subsequent broadcast window after their re-send timers pass the re-send threshold value (while updating their re-send counter value). These re-sent packets 600 are able to be combined with other packets 600 in the subsequent broadcast/multicast/unicast message in order to fill the transmission window for the root port 230.

As described above, if for any reason the root port 230 does not receive a RX-GEM-ACK, the corresponding virtual initiators of the core initiator 1810 continuously updates the re-send timer (e.g. each cycle) for each of the packets 600 and initiates re-transmission when the timers reach the threshold value. This process repeats until all of the packets 600 are validly transmitted (and thus their flows removed) or the re-send counter value reaches the re-send threshold value and an action must be taken as described above. Accordingly, the system 100 provides the advantage that each message transmission (e.g. node to gate; node to root; gate to root; root to gate; root to node) within the bus 104 is able to implement its own parallel message retransmission mechanism such that together the mechanisms provide the advantage of robust message delivery assurance on the bus 104.

Although the description herein focuses on messages directly between nodes 204, 208 and root ports 230, it is understood that the messages are able to be forwarded through one or more gates 202 on their way between the nodes 204, 208 and the root ports 230. In such embodiments, the gates 202 are able to interact with the nodes 204, 208 in the same manner as the root ports 230 when receiving messages from or transmitting messages to the nodes 204, 208. Further, the gates are able to interact with the root ports 230 in the same manner as the nodes 204, 208 when receiving messages from or transmitting messages to the root ports 230. In other words, the gates 202 provide acknowledgments to nodes, receive acknowledgments from root ports 230 and vice versa as the messages are passed from the nodes 204, 208 to the gates 202 to the root ports 230 and back. Thus, the gates 202 provide yet another layer of message retransmission mechanism that ensures that acknowledgment response time is low such that the mechanism does not interfere with the high speed communication across the bus 104. Additionally, one or more of the gates 202 are able to act in the same manner as the nodes 204, 208 when acting on behalf of the virtual nodes represented by the gates 202, wherein the gates 202 implement virtual gate initiators and acknowledgers for each of the virtual nodes.

Further, it should be noted that where the description refers to the functions of the core initiator 1810 and the core acknowledger 1812, these functions are able to be implemented via virtual initiators and acknowledgers operated by the core 200. In particular, each root port 230 has a virtual initiator and acknowledger (implemented by the core 200) for each node 204, 208 within its network 206, 210 that performs the claimed functions when the functions relate to messages where that node 204, 208 is the source and/or destination. Additionally, the core 200 is able to implement an extra virtual initiator for each root port 230 that is dedicated to multicast or broadcast messages to multiple nodes 204, 208 within the network of the root port 230.

Also, instead of acknowledging when messages are received without error, the system 100 is able to acknowledge when messages are received with errors. In such embodiments, the system 100 operates substantially similar to as described herein except that the nodes/root are able to assume that a message has been correctly transmitted and release the stored resend data if no acknowledgment is received within the resend time period and at the same time are configured to send an acknowledge when a message with an uncorrectable error is received (and not when a correct or correctable message is received).

Figure 20:
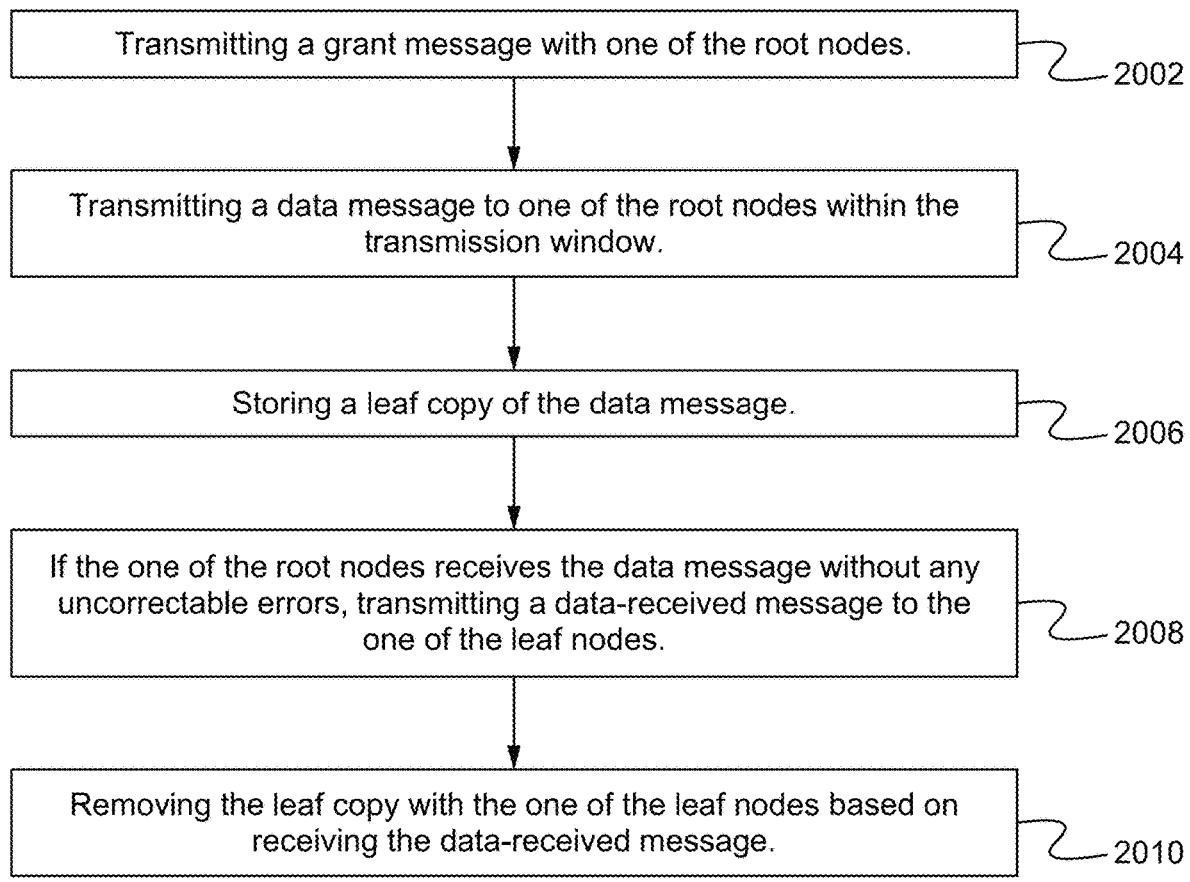
FIG. 20 illustrates a method of implementing a guaranteed message delivery mechanism on a control and sensor bus according to some embodiments.

FIG. 20 illustrates a method of implementing a guaranteed message delivery mechanism on a control and sensor bus according to some embodiments. As shown in FIG. 20, one of the root ports 230 transmits a window grant message to one of the nodes 204, 208 at the step 2002. The one of the nodes 204, 208 bursts a message (e.g. Burst-PHY-frame message) to the root port 230 (either destined for the core 200 or one or more other nodes 204, 208) within the transmission window at the step 2004. As described above, such burst messages are able to include a plurality of GEM packets 600, with each packet including destination information 612 and an acknowledgment request indicator 620 among other data. The one of the nodes 204, 208 stores a copy of the message with its acknowledgment engine at the step 2006. If the root port 230 receives the burst message without any uncorrectable errors (e.g. no errors in the burst PHY header and/or any errors are correctable using FEC data), the root port 230 transmits a data-received acknowledgment message to the one of the leaf nodes 204, 208 at the step 2008. As a result, the one of the nodes 204, 208 is able to remove the local copy of the burst message at the step 2010.

In some embodiments, the root port 230 transmits a missed burst message to the one of the nodes 204, 208 if the root port 230 does not receive the data message within the transmission window. Upon receiving the missed burst message, the one of the nodes 204, 208 is able to resend the burst PHY frame message using the local copy. In some embodiments, if the root port 230 receives the burst PHY frame message with uncorrectable errors in a subset of the GEM packets 600 (e.g. some of the GEM packets 600 have errors that cannot be corrected using the FEC data), the root port 230 transmits a data-partially-received message to the one of the nodes 204, 208. As described above, this data-partially-received message is able to include packet missing/received information that identifies the subset of the packets 600 that need to be re-sent. In some embodiments, in response to receiving the data-partially-received message, the one of the nodes 204, 208 removes the packets 600 that are not a part of the subset (e.g. the packets of the burst message that did not have uncorrectable errors) from the copy based on the missing/received information (as these packets 600 no longer need to be transmitted). As described above, the root port 230 is able to construct one or more of start and end pointers that indicate consecutive packets that are correctable/correct (or uncorrectable/incorrect) and a bit map where each bit corresponds to whether a packet is ok or needs to be re-sent.

In some embodiments, the one of the nodes 204, 208 re-sends the subset (e.g. the packets that had uncorrectable errors) to the root port 230 in a new burst message (e.g. after the timers associated with each of the subset expire) in a subsequent transmission window granted to the one of the nodes 204, 208. In such embodiments, if there is room in the subsequent transmission window, the node 204, 208 is able to add additional data (e.g. new GEM packets 600) to the new burst message in order to increase the throughput of the bus 104. In some embodiments, if the destination of the burst message is a node 204, 208 within the same network 206, 210 (e.g. the broadcast network associated with the root port 230) as the one of the nodes 204, 208 that sent the burst message, the root port 230 is able to omit sending a data-received message because the broadcast of the burst message is able to act as the acknowledgment. Specifically, when the one of the nodes 204, 208 receives the burst message (as broadcast from the root port 230 to all nodes in its broadcast network 206, 210) with itself indicated as the source, the one of the nodes 204, 208 is able to treat this as receiving a data-received message for that burst message and clear the local copy and associated data.

In some embodiments, the root port 230 passes the burst message to another of the root ports 230, which forwards/broadcasts the burst message from the core 200 to the nodes of the network 206/210 of that other root port 230. In doing so, the root port 230 is able to store a local copy of the message (in the same manner as the one of the nodes 204, 208 above) that is able to be used to rebroadcast some or all of the message if its transmission is not acknowledged by the destination node(s) 204, 208. In some embodiments, for each network 206, 210 associated with a root port 230, the core 200 is able to select one or a subset of the nodes 204, 208 as target acknowledgment nodes. As a result, when a message is broadcast to the nodes 204, 208 of one of the networks 206, 210, only the target acknowledgment nodes 204, 208 (not all the nodes in the broadcast or multicast) are configured to respond/acknowledge whether they received the message without any uncorrectable errors (and/or what packets 600 need to be re-sent). Accordingly, the system 100 provides the advantage of lowering the cost/congestion caused by the mechanism by reducing the number of nodes that need to transmit data-received acknowledgment messages back to the root port 230. In some embodiments, the node(s) 204, 208 that are farthest from the root port 230 (such that they are the last to receive any broadcast message) are the nodes 204, 208 that are selected.

In some embodiments, the missed burst acknowledgment message or received-GEM acknowledgment message are able to be combined as a single message with a subsequent grant message for granting a window for re-transmitting that missed data subset and/or missed whole message. In some embodiments, the root ports adjust the size of one or more transmission windows granted to a leaf node for the re-sending of data having uncorrectable errors as received by the root ports (in the original message from that leaf node) based on the size of the data having the uncorrectable errors.

Error Avoidance Mechanism

In some embodiments, the bus 104 is able to implement an error avoidance mechanism in addition to or in lieu of the message retransmission mechanism described above. In particular, in noisy environments where physical link data errors are common, the error avoidance mechanism as implemented by the nodes 204, 208 and the root ports 230 and/or core 200 is able to provide an added layer of data security and bus 104 efficiency in overcoming any data errors. Specifically, the error avoidance mechanism comprises dividing the framing sublayer 704, 714 of each transmitted message (e.g. broadcast-PHY-frame 700 or burst-PHY-frame 710) into one or more virtual mini-frames 2102. These mini-frames 2102 are each divided into one or more FEC blocks 2104 having separate FEC parity data such that errors in each block 2104 (or subsection of the framing sublayer 704, 714) are able to be separately corrected (if possible) using the FEC parity values of that block 2104. The type of FEC used for each sublayer 704, 714 is able to be dynamically selected based on link conditions (e.g. number and/or type of errors on that link within a time period and/or a quantity of the latest messages received on that link) and/or a size of the granted burst window for that node/gate (in which the message is to be transmitted). In some embodiments, each of the mini-frames 2102 (excluding the FEC parity values and the CRC value itself) are further able to be covered by a separate CRC value (with the CRC value being covered by the FEC parity value of the FEC block 2104 that it is in). Alternatively, a single CRC value is able to be used for multiple or all of the mini-frames 2102.

Figure 21A:
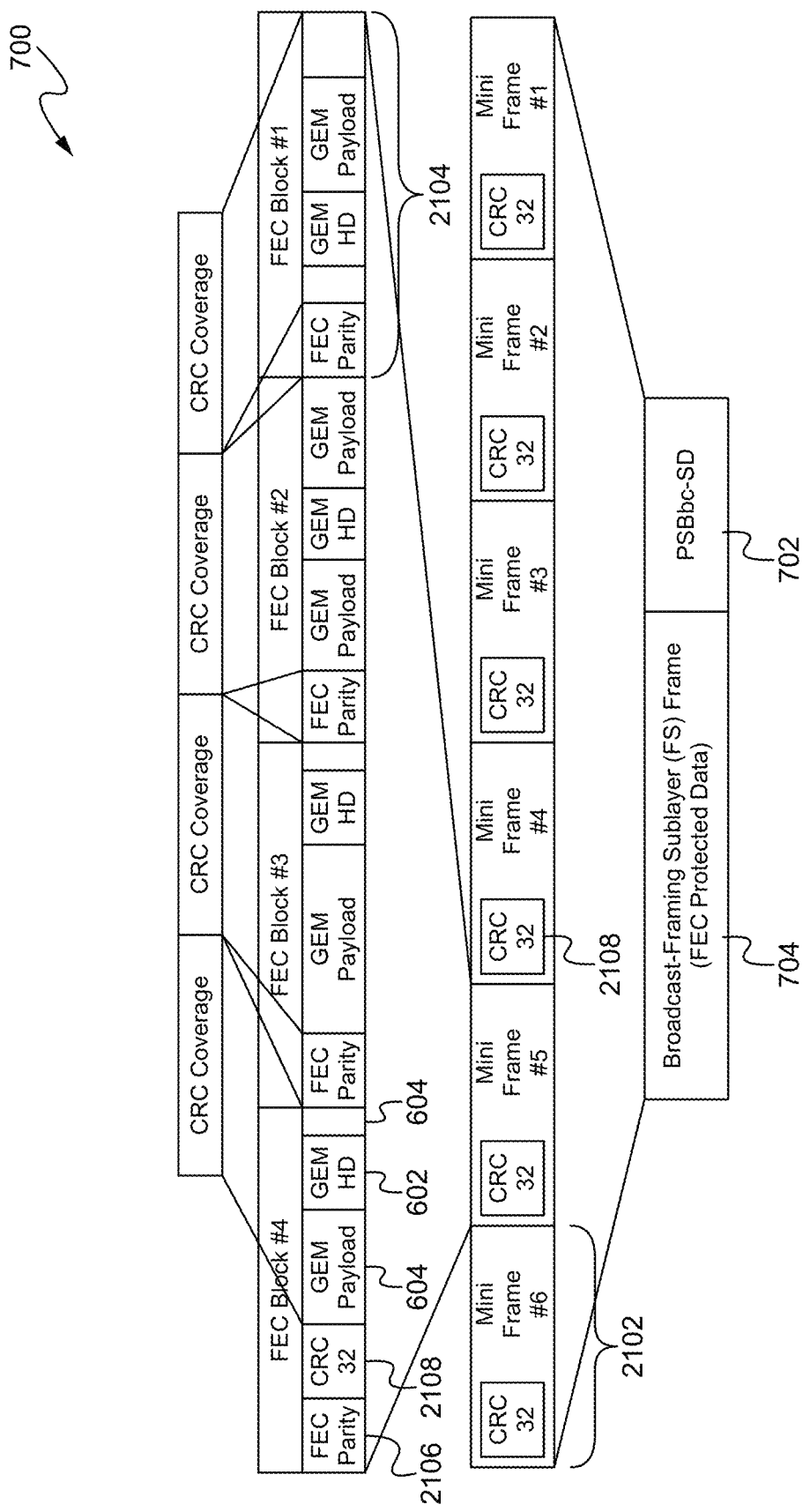
FIGS. 21A and 21B illustrate mini-frames mapped onto a broadcast-PHY-frame and a burst-PHY-frame, respectively, according to some embodiments.
Figure 21B:
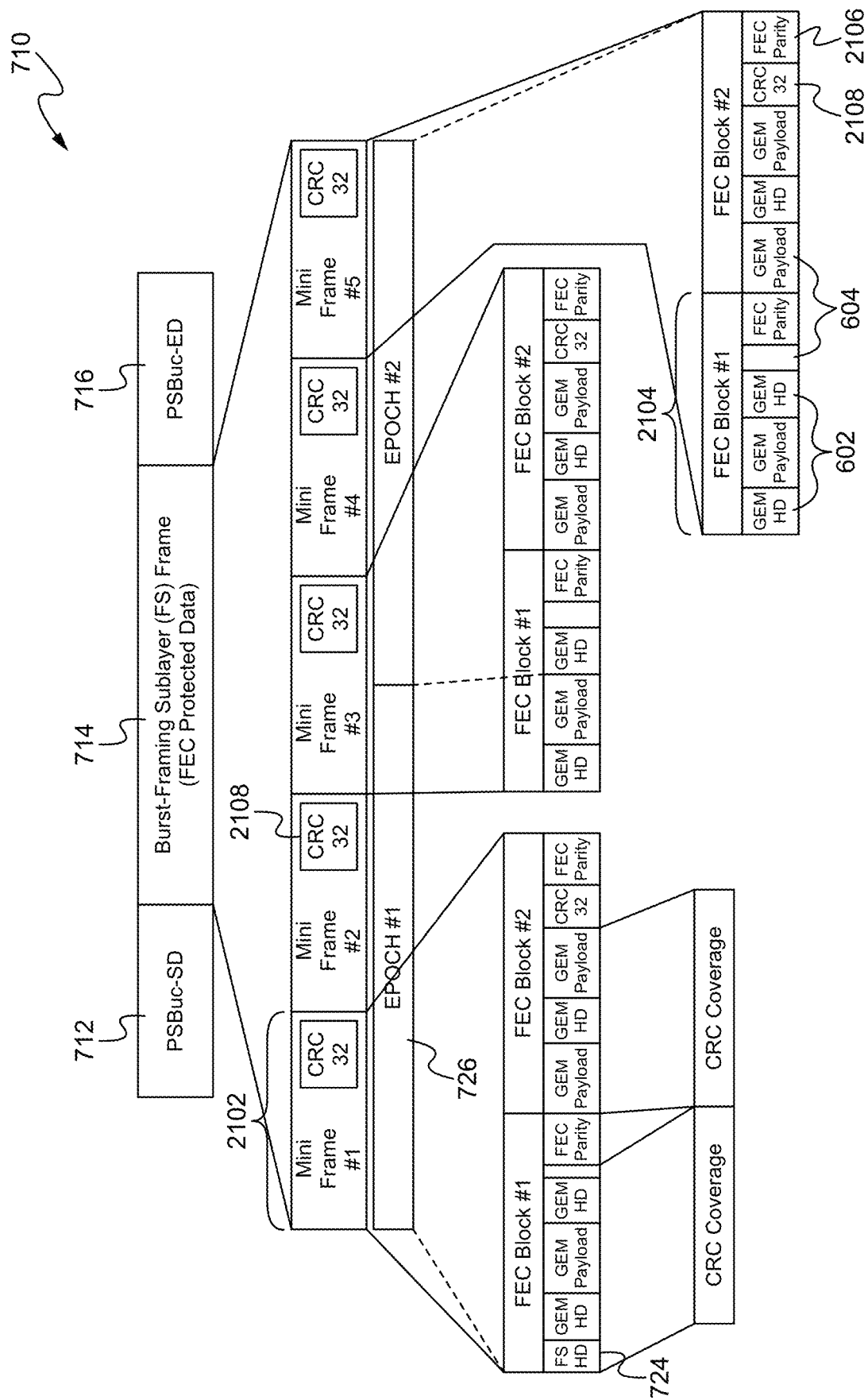

FIGS. 21A and 21B illustrate mini-frames 2102 mapped onto a broadcast-PHY-frame 700 and a burst-PHY-frame 710 according to some embodiments. As shown in FIG. 21A, the broadcast framing sublayer 704 is logically divided into a plurality of mini-frames 2102. Although as shown in FIG. 21A the broadcast framing sublayer 704 is logically divided into six mini-frames 2102 more or less mini-frames 2102 are able to be used. In some embodiments, each mini-frame 2102 is the same size. Alternatively, one or more of the mini-frames 2102 are able to have a different size than one or more of the other mini-frames. As further shown in FIG. 21A, each of the mini-frames 2102 are divided into one or more FEC blocks 2104. Although as shown in FIG. 21A the mini-frames 2102 are logically divided into four blocks 2104 more or less blocks 2104 per mini-frame 2102 are able to be used. Further, different mini-frames 2101 of the same sublayer 704 are able to have the same or different numbers of FEC blocks 2104. In some embodiments, each FEC block 2104 is the same size. Alternatively, one or more of the FEC blocks 2104 are able to have a different size than one or more of the other FEC blocks 2104.

Each of the FEC blocks 2104 are able to comprise FEC parity values 2106, one or more partial or full gem packet payloads (GEM-PKT-payload) 604 and one or more partial or full gem packet headers (GEM-PKT-HD) 602. A gem packet payload 604 is able to extend between two FEC blocks 2104 of the same mini-frame 2102, but if a gem packet payload 604 does not fit in the remaining space of a mini-frame 2102 that includes its header 602, the payload 604 is logically fragmented with the remainder of the payload 604 that did not fit in that mini-frame 2102 and added to the beginning of the next mini-frame 2102. This approach provides the benefit of ensuring a new and good packet starts at the beginning of each mini-frame 2102, and thus when the previous mini-frame 2102 detected uncorrectable FEC errors it will not affect the next mini-frame 2102.

If CRC is implemented, each of the mini-frames 2102 and one of the FEC blocks 2106 of each mini-frame 2102 include a CRC value 2108. As shown in FIG. 21A, the CRC value 2108 is derived from the mini-frame 2102 data excluding the FEC parity values 2106 (and obviously itself 2108 which is added to the mini-frame 2102 after it is calculated). Alternatively, each of the FEC blocks 2106 are able to have a separate CRC applied to them and thus have a separate CRC value 2108 (e.g. derived from the FEC data of that block 2106 excluding any FEC parity values 2106 and itself). As a result, in such embodiments the CRC field 2108 in each FEC block 2106 is able to detect and indicate FEC block data errors even when the FEC algorithm/FEC parity value of that FEC block fails to indicate uncorrectable errors (e.g. due to FEC algorithm limitations or too many data errors in the data link). In some embodiments, the CRC value is derived using CRC-32 algorithm. Alternatively, other algorithms are able to be used and/or the CRC elements are able to be omitted.

As shown in FIG. 21B, the burst framing sublayer 714 is also logically divided into a plurality of mini-frames 2102. These mini-frames 2102 are able to span multiple epochs 726 (e.g. mini-frame #3) or be a portion/all of a single epoch (e.g. mini-frames #1, 2, 4 and 5). Although as shown in FIG. 21B the burst framing sublayer 714 is logically divided into five mini-frames 2102 more or less mini-frames 2102 are able to be used. Similar to above, each mini-frame 2102 is able to be the same size, or one or more of the mini-frames 2102 are able to have a different size than one or more of the other mini-frames. As further shown in FIG. 21B, each of the mini-frames 2102 are divided into one or more FEC blocks 2104. Although as shown in FIG. 21B the mini-frames 2102 are logically divided into two blocks 2104 more or less blocks 2104 per mini-frame 2102 are able to be used. Further, different mini-frames 2101 of the same sublayer 714 are able to have the same or different numbers of FEC blocks 2104. In some embodiments, each FEC block 2104 is the same size. Alternatively, one or more of the FEC blocks 2104 are able to have a different size than one or more of the other FEC blocks 2104.

Each of the FEC blocks 2104 are able to comprise FEC parity values 2106, one or more partial or full gem packet payloads (GEM-PKT-payload) 604 and one or more partial or full gem packet headers (GEM-PKT-HD) 602. Additionally, one of the blocks 2104 includes a framing sublayer header 724 (e.g. the block 2104 covering the portion of the mini-frame 2102 that included the FS header 724 of the burst framing sublayer 714). Similar to above, if a gem packet payload 604 does not fit in the remaining space of the FEC block 2104 that includes its header 602, the payload 604 is logically fragmented with the remainder of the payload 604 that did not fit in that block 2104 added to the beginning of the next block 2104 of the mini-frame 2102. If CRC is implemented, each of the mini-frames 2102 and one of the FEC blocks 2106 of each mini-frame 2102 include a CRC value 2108. As shown in FIG. 21B, the CRC value 2108 is derived from the mini-frame 2102 data excluding the FEC parity values 2106 (and itself 2108). In some embodiments, the CRC value is derived using CRC-32 algorithm. Alternatively, other algorithms are able to be used and/or the CRC elements are able to be omitted.

Figure 22:
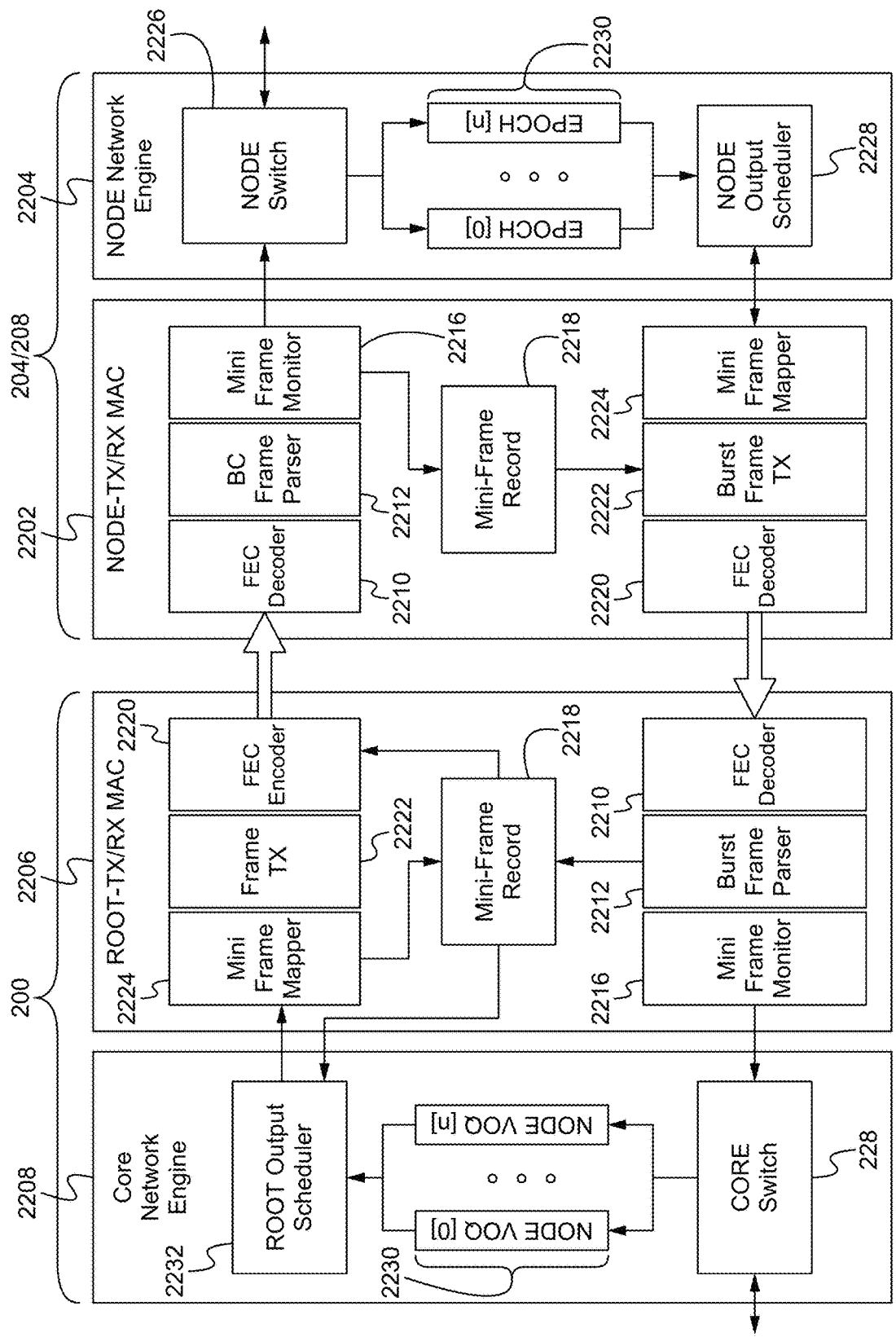
FIG. 22 illustrates the bus including an error avoidance mechanism according to some embodiments.

FIG. 22 illustrates the bus 104 including an error avoidance mechanism according to some embodiments. Although for the sake of clarity FIG. 22 only illustrates a single node 204, 208 coupled with a single root of the core 200, it is understood that each of the nodes 204, 208 are able to operate similarly with each of the root ports 230 to which they are coupled. Further, each of the described error avoidance mechanism components and operations of the node 204, 208 and the root ports/core 200/230 are able to equally applied to any of the gates 202 (except with the gates 202 virtually representing each of the nodes 204, 208 coupled to the gate 202 rather than a single node), but are omitted here for the sake of brevity. In particular, the gates 202 operate as virtual nodes with respect to root ports 230 and operate as root ports/cores with respect to the subnodes 208 coupled to that gate 202 such that the gates 202 implement the functionality of both the root ports/core and the nodes. Moreover, many of the other components of the core 200, root ports 230, gates 202 and/or nodes 204, 208, described in detail elsewhere herein, have been omitted here for the sake of clarity. For example, each of the nodes 204, 208, gates 202, cores 200, and/or root ports 230 are able to comprise or have access to one or more processors/switches for executing the mechanism described herein and/or one or more memories (e.g. SRAM) for storing the tables and other data described herein.

As shown in FIG. 22, each of the nodes 204, 208 include a node media access control transmitter/receiver (node MAC) 2202 and a node network engine 2204, and the core 200 includes a root media access control transmitter/receiver (root MAC) 2206 for each of the root ports 230 and a core network engine 2208. Alternatively, one or more of the root ports 230 are able to have their own network engine 2208 and/or two or more of the root ports 230 are able to share a root MAC 2206. The node MAC 2202 comprises an FEC decoder 2210, a frame parser 2212, a mini-frame monitor 2216, a mini-frame recorder 2218, an FEC encoder 2220, a frame transmitter 2222 and a mini-frame mapper 2224. The node network engine 2204 comprises a node switch 2226, an epoch buffer 2230 and a node output scheduler 2228. Similarly, the root MAC 2206 comprises an FEC decoder 2210, a frame parser 2212, a mini-frame monitor 2216, a mini-frame recorder 2218, an FEC encoder 2220, a frame transmitter 2222 and a mini-frame mapper 2224. The core network engine 2208 comprises a core switch 228, a node virtual output queue (node VOQ) 2230 and a root output scheduler 2232.

Broadcasts from Core/Root Port to Node/Gate

In operation, as GEM packets 600 are received at the core 200 (e.g. from incoming burst-PHY-frames 710), they are processed and put into the node VOQ 2230 by the core switch 228 awaiting broadcast to their destination node(s) 204, 208. Concurrently, the root output scheduler 2232 selects one or more of the GEM packets 600 from the node VOQ 2230 and provides them to the root MAC 2206 of one or more of the root ports 230. Additionally, the root output scheduler 2232 is able to select one or more mini-frame status messages 2300 (previously generated by the root mini-frame monitor 2216 as described below) if any have been generated.

The root MAC 2206 constructs a broadcast message (e.g. broadcast-PHY-frame 700) including the provided GEM packets 600 (and/or the selected mini-frame status messages 2300) and then the root mini-frame mapper 2224 logically maps a plurality of mini-frames 2102 onto the sublayer 704 of the broadcast message. Each mini-frame 2102 starts with a GEM packet header 602 and ends with the end of the payload 604 of the last GEM packet 600 included in the mini-frame 2102 (with the FEC parity 2106 and/or CRC value 2108 subsequently added). If CRC is to be used, the frame transmitter 2222 is able to calculate the CRC value of each mini-frame 2102 of the sublayer 704 and add each of the calculated CRC values 2108 to the mini-frame 2102 to which it applies.

After the mini-frames 2102 have been mapped to the sublayer 704, for each of the mini-frames 2102 of the message 700, the root mini-frame mapper 2224 records in a mini-frame table 2218 a mini-frame identifier of the mini-frame 2102 along with the node identifier of each node 204, 208 that was the source of one of the GEM packets 600 (at least partially) within that mini-frame 2102. Specifically, these pairs of a mini-frame identifier with one or more node identifiers form a transmitted portion of the mini-frame table 2218 in a local memory of the root port/core that can be referenced later if errors occur as described below.

The root frame transmitter 2222 dynamically determines which FEC algorithm (e.g. RS (248, 240), RS (248, 232), RS (248, 215), greater or smaller Reed-Solomon values and/or other error correction code) to apply to the mapped broadcast message and thus the size/overhead of the parity values 2106. Specifically, the root frame transmitter 2222 is able to select an algorithm based on a calculated error total and/or error type with stronger FEC algorithms (with more overhead) being selected the greater the number of and/or greater severity of errors reported from the nodes 204, 208 within a predetermined time period or within a set of a predefined quantity of the latest received error report messages (e.g. mini-frame status messages).

As a result, if the number of errors of any type is below a first threshold value and/or a number of a particular type of error (e.g. uncorrectable FEC error, correctable FEC error, CRC error, a bit interleaved parity error (BIP error) and/or other type of error) is below a type threshold value, the root frame transmitter 2222 is able to select and an FEC algorithm (from a set of stored FEC algorithms) with the lowest overhead cost (e.g. smallest parity value 2106 size). For example, if there were no errors of any type, or there where less than the threshold value of errors for one or more of the types, the root frame transmitter 2222 is able to select a minimum overhead FEC algorithm like RS (248, 240) to improve the link bandwidth throughput. However, if there were a low amount of errors of any type (e.g. a programmable range such as 0-5) or there were less than X FEC correctable errors (e.g. where the value of X is based on the FEC algorithm used), no FEC uncorrectable errors, no CRC errors and no BIP errors, the root frame transmitter 2222 is able to select a medium overhead FEC algorithm like RS (248, 232) to get best tradeoff between FEC overhead and the link bandwidth throughput. Finally, if there were a high amount of errors of any type (e.g. a programmable range such as over 10) or there were more than X FEC correctable errors (e.g. again where the value of X is based on the FEC algorithm used), more than 0 FEC uncorrectable errors, more than X CRC errors (e.g. more than 0 CRC errors), or more the X BIP errors (e.g. more than 0 BIP errors), or a combination thereof, the frame transmitter 2222 is able to select a high overhead FEC algorithm like RS (248,216) or the highest supported FEC algorithm.

In some embodiments, the errors used for the error total and/or error type calculation includes errors reported from all of the nodes 204, 208 coupled to the root port 230 having the root MAC 2206. Alternatively, the errors used for the error total and/or error type calculation is limited to error reported from a subset of all of the nodes 204, 208 coupled to the root port 230 that are the destination(s) of one or more of the GEM packets 600 that will be covered by the FEC algorithm.

Once the FEC algorithm has been selected, the root frame transmitter 2222 adds FEC algorithm flag data to the frame header 702 of the broadcast message 700 (e.g. as a specified start of delimiter pattern), the FEC algorithm flag data indicating what type of FEC algorithm is used in that message 700. Finally, the root FEC encoder 2220 encodes the framing sublayer 704 of the broadcast message 700 using the selected FEC algorithm and broadcasts it to the nodes 204, 208 coupled with the root port 230.

Upon receipt of the message 700 at each of the nodes 204, 208 (e.g. even if they are not the targeted node(s) of the broadcast message), the node FEC decoder 2210 of each of the nodes 204, 208: identifies the selected FEC algorithm based on the FEC algorithm flag; checks each of FEC blocks 2104 of each of the mini-frames 2102 for correctable or uncorrectable FEC errors based on the selected FEC algorithm; and corrects any of the errors that are correctable using the FEC parity value 2106. Then for each of the mini-frames 2102, the node FEC decoder 2210 passes the mini-frame identifier of the mini-frame 2102 and status values of each of the FEC blocks 2104 within the mini-frame 2102 to the node mini-frame monitor 2216. These mini-frame status values indicate a number of correctable FEC errors and a number of uncorrectable FEC errors found by the node decoder 2210 for each one of the blocks 2104 and/or in the mini-frame 2102 as a whole. If CRC is used, the node mini-frame monitor 2216 uses the CRC value 2108 of each of the mini-frames 2102 to identify any CRC errors in each of the mini-frames 2102 and adds that data to the mini-frame status values for the mini-frame 2102. Additionally, in some embodiments the node mini-frame monitory 2216 is able to check each of the mini-frames 2102 for BIP-8 errors and add that data to the mini-frame status values for the mini-frame 2102 as well. In some embodiments, any CRC and/or BIP-8 errors detected are counted as uncorrectable FEC errors within the status values. Alternatively or in addition, the status values are able to indicate a number of CRC and/or BIP-8 errors separate from a number of uncorrectable or correctable FEC errors.

Subsequently, for each of the mini-frames 2102 of the message 700, the node mini-frame monitor 2216 records the mini-frame identifier of the received mini-frame 2102 along with the status values for that mini-frame 2102 in the node's local mini-frame table 2218. Specifically, these pairs of a mini-frame identifier with the mini-frame status values form a received portion of the node mini-frame table 2218 in a local memory of the node that is used to report the errors to the core/root as described below.

At the same time, the node parser 2212 is able to parse and transmit the GEM packets 600 of the broadcast message 700 without any errors (or whose errors where correctable) to the node switch 2226, which processes the packets 600 and distributes them to their target ports 99 and/or devices 102 as described herein.

Similarly, the node parser 2212 is able to parse and transmit any status messages 2300 generated by the root port 230 within the message 700 to the node mini-frame monitor 2216, which accesses the mini-frame identifiers and associated status values from each of the status messages 2300 (see FIG. 23 below). In particular, for each of the mini-frames 2102 without any uncorrectable FEC errors (as indicated by the status values), the node mini-frame monitor 2216 releases the GEM packets 600 mapped within that mini-frame 2102 (and the associated buffer pointers e.g. GEM identifiers) from the retransmission buffer pool (e.g. re-send table) to the free buffer pool (as described in the retransmission section above). Specifically, the node mini-frame mapper 2224 is able to store a table of which transmitted GEM packets 600 were a part of each of the mini-frames 2102, which the node mini-frame monitor 2216 is then able to reference using the mini-frame identifiers parsed from the status message 2300 to determine which of the GEM packets 600 are able to be released (e.g. from the re-send table of the node initiator 1802 by removing their associated re-send flows (e.g. remove the re-send table entries and/or local copies)).

In contrast, for each of the mini-frames 2102 with uncorrectable FEC errors (as indicated by the status values), the node mini-frame monitor 2216 accesses the transmitted portion of the node mini-frame record table 2218, and using the mini-frame identifiers of those frames (parsed from the status message 2300) identifies the epoch identifiers paired with those mini-frame identifiers in the node mini-frame record table 2218. Accordingly, the node mini-frame monitor 2216 issues flow control signals to the node output scheduler 2228, the flow control signals indicating the epoch identifiers that where paired with mini-frames 2102 that had uncorrectable errors and thus need their flows stopped. In response, the node output scheduler 2229 stops further scheduling of packets into the queue 2230 for the identified epochs 726 and/or stops further transmission of packets 600 queued in the queue 2230 for the identified epochs 726 (and/or ports 99 or devices 102 associated therewith). Indeed, this stopping of further queueing and/or transmission from the queue associated with the identified epochs 726 prevents the wasteful further transmission of packets that will need to ultimately be resent due to the previous uncorrectable error in that flow (e.g. the flow for that epoch/port/device).

Additionally, the node output scheduler 2228 is able to send a re-transmission needed message to the node initiator 1802, the message identifying the mini-frames 2102 and/or GEM packets 600 that need to be retransmitted due to the uncorrectable FEC errors indicated in the status values. This causes the node initiator 1802 to initiate retransmission of those mini-frames 2102 and/or packets 600 regardless of whether an acknowledgment (e.g. GEM ACK message) for those packets 600 has been received and/or whether the acknowledgment timer for those packets 600 has expired. Once all of these packets 600 in the re-send table of the node initiator 1802 have been acknowledge/cleared as having been received without error, the node output scheduler 2228 resumes normal operation including restarting the scheduling and/or transmitting of packets 600 for the epoch queue 2230 identified by the epoch identifiers (e.g. including releasing their associated epoch flow control signals, and their associated buffer pointers back to free buffer pool). When GEM packets 600 need to be re-transmitted for reasons other than packet errors (e.g. when an entire message 700, 710 or acknowledgment thereof is not received), the retransmission mechanism described above is able to ensure the re-transmission of the messages/packets.

Bursts from Node/Gate to Core/Root Port

As data is received at network engine 2204 of the node 204, 208 from one or more devices 102 (or from subnodes 208 in the case of a gate 202), the node switch 226 encapsulates/converts the data into a GEM packet 600 (as described above) and puts the packets 600 into the epoch queue 2230 awaiting burst to the core/root port 200/230. Similarly, node mini-frame monitor 2216 accesses the received portion of the node mini-frame table 2218 and generates one or more new mini-frame status messages 2300 (e.g. in the GEM command format) that indicate which of the mini-frames 2102 had uncorrectable FEC, CRC and/or BIP-8 errors as received by the node 204, 208 such that they need to be re-sent. In particular, these mini-frame status GEM packets 2300 are able to include the mini-frame identifiers of a number (e.g. the last 32) of the received mini-frames 2102 identified in the table 2218 whose status has not already been reported to the core/root, a representation of the mini-frame status values that correspond to each of those mini-frame identifiers and/or other fields described herein. In some embodiments, the representation indicates whether any uncorrectable FEC errors (optionally counting CRC and/or BIP-8 errors as uncorrectable FEC errors) were found in that mini-frame 2102. Alternatively, the representation is able to indicate specific quantities and/or types of errors found in that mini-frame 2102.

Figure 23:
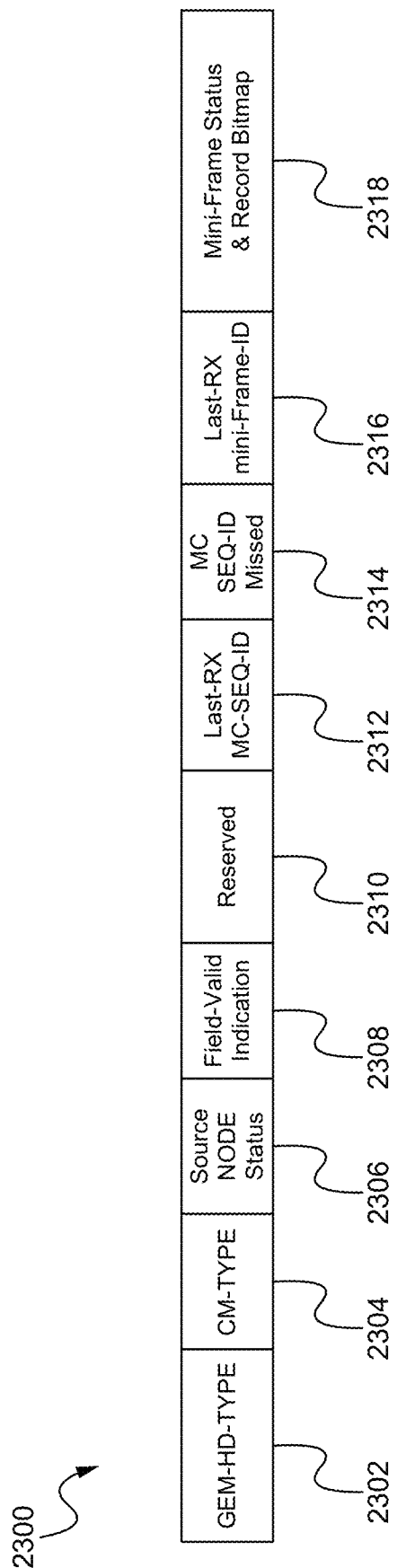
FIG. 23 illustrates a mini-frame status GEM packet according to some embodiments.

FIG. 23 illustrates a mini-frame status GEM packet 2300 according to some embodiments. As shown in FIG. 23, the mini-frame status packet 2300 comprises a header type field 2302 (similar to GEM-HD-TYPE 606 as shown in FIGS. 6C-F), a control message type field 2304 (similar to control message type 654 in FIG. 6F) and a source node status field 2306 that indicates whether the source node is asleep, powered down or awake, a field-valid indication 2308, a reserved field 2310, a last received multicast message sequence identifier field 2312, a multicast sequence identifier missed field 2314, a last received mini-frame identifier field 2316 and a mini-frame status and record bitmap field 2318. The field-valid indication 2308 indicates either that the last received multicast message sequence identifier field 2312 and the multicast sequence identifier missed field 2314 are valid (and to be used for processing) or that the last received mini-frame identifier field 2316 and the mini-frame status and record bitmap field 2318 are valid (and to be used for processing). The reserved field 2310 is reserved for future use. The last received multicast message sequence identifier field 2312 identifies the multicast sequence identifier of the multicast GEM packet 600 that was last received by the node 204, 20. The multicast sequence identifier missed field 2314 indicates whether a multicast sequence identifier error was detected and the last received mini-frame identifier field 2316 indicates the mini-frame identifier of the latest mini-field 2102 that has been fully received by the node 204, 208. Lastly, the mini-frame status and record bitmap field 2318 indicates whether there were any errors in a number of the latest recorded/received mini-frames 2102. For example, the bits of the field are able to represent a sequence of the latest received mini-frames 2102 with each bit representing a single mini-frame 2102 and having a first value (e.g. 0) if the mini-frame 2102 did not have any uncorrectable FEC errors (and/or CRC/BIP-8 errors) and a second value (e.g. 1) if the mini-frame 2102 did have one or more uncorrectable FEC errors (and/or CRC/BIP-8 errors). As a result, in such an embodiment the mini-frame status and record bitmap field 2318 is able to represent the error status of a large sequence of mini-frames 2102 using minimal memory space. Alternatively, one or more of the fields are able to be omitted and/or one or more additional fields are able to be added. In some embodiments, a header type field 2302 is 2 bits, the control message type field 2304 is 4 bits, the source node status field 2306 is 2 bits, the field-valid indication 2308 is 3 bits, the reserved field 2310 is 9 bits, the last received multicast message sequence identifier field 2312 is 8 bits, the multicast sequence identifier missed field 2314 is 1 bit, the last received mini-frame identifier field 2316 is 6 bits and the mini-frame status and record bitmap field 2318 is 29 bits. Alternatively, one or more of the fields are able to be larger or smaller.

Subsequently, the node output scheduler 2228 selects the new mini-frame status messages 2300 and one or more of the GEM packets 600 of one or more epochs 726 from the epoch queue 2230 (e.g. based on the size of the next granted burst window) and provides them to the node MAC 2202. The node MAC 2202 then constructs a burst message (e.g. burst-PHY-frame 710) including the provided GEM packets 600 and messages 2300 for bursting to the core/root. The node mini-frame mapper 2224 logically maps a plurality of mini-frames 2102 onto the burst framing sublayer 714 of the burst message 710. Each mini-frame 2102 starts with a GEM packet header 602 and ends with the end of the payload 604 of the last GEM packet 600 included in the mini-frame 2102 (with the FEC parity 2106 and/or CRC value 2108 subsequently added). The mini-frames 2102 are able to span two different epochs 726 or fit within a single epoch 726. If CRC is to be used, the node frame transmitter 2222 is able to calculate the CRC value of each mini-frame 2102 of the sublayer 714 and add each of the calculated CRC values 2108 to the mini-frame 2102 to which it applies.

After the mini-frames 2102 have been mapped to the sublayer 714, for each of the mini-frames 2102 of the burst message 710, the node mini-frame mapper 2224 records in the node mini-frame table 2218 a mini-frame identifier of the mini-frame 2102 along with the epoch identifier of each port(s) 99 (and/or device(s) 102) that was the source of one of the GEM packets 600 (at least partially) within that mini-frame 2102. Specifically, these pairs of a mini-frame identifier with one or more epoch identifiers form a transmitted portion of the node mini-frame table 2218 in a local memory of the node 204, 208 that can be referenced later if errors occur as described below.

Further, the node frame transmitter 2222 is able to dynamically determine which FEC algorithm to apply to the mapped burst message 710 in the same manner as the root frame transmitter 2222 described above. Alternatively or in addition, the node frame transmitter 2222 dynamically determines which FEC algorithm to apply to the mapped burst message 710 based on a size of the next burst window granted by the root port 230 and/or a size of the payload (e.g. framing sublayer 714) of the burst message 710 with stronger FEC algorithms (with more overhead) being selected the greater the size of the next burst window granted by the root port 230 and/or the size of the payload.

As a result, if the granted burst window and/or payload size is below a first threshold value, the node frame transmitter 2222 is able to select and an FEC algorithm (from a set of stored FEC algorithms) with the lowest overhead cost. For example, if the granted burst window and/or payload size is equal to or less than 64 bytes, the node frame transmitter 2222 is able to select a minimum overhead FEC algorithm like RS (248, 240) to improve the link bandwidth throughput. If the window and/or payload is between 64 and 129 bytes, the node frame transmitter 2222 is able to select a medium overhead FEC algorithm like RS (248, 232) to get best tradeoff between FEC overhead and the link bandwidth throughput. Finally, if the window and/or payload is greater than 128 bytes, the node frame transmitter 2222 is able to select a high overhead FEC algorithm like RS (248,216) or the highest/strongest supported FEC algorithm In some embodiments, the node frame transmitter 2222 is able to factor in both the number of errors and the size of the window and/or payload by determining what FEC algorithm it would select using each method individually and then selecting the highest/strongest of those two FEC algorithms.

Once the FEC algorithm has been selected, the node frame transmitter 2222 adds FEC algorithm flag data to the frame header 712 of the burst message 710 (e.g. as a specified start of delimiter pattern), the FEC algorithm flag data indicating what type of FEC algorithm is used in that message 710. Finally, the node FEC encoder 2220 encodes the framing sublayer 714 of the burst message 710 using the selected FEC algorithm and bursts it to the root port 230 coupled with the node 204, 208.

Upon receipt of the message 710 at the root port 230, the root FEC decoder 2210: identifies the selected FEC algorithm based on the FEC algorithm flag; checks each of FEC blocks 2104 of each of the mini-frames 2102 for correctable or uncorrectable FEC errors based on the selected FEC algorithm; and corrects any of the errors that are correctable using the FEC parity value 2106.

Then for each of the mini-frames 2102, the root FEC decoder 2210 passes the mini-frame identifier of the mini-frame 2102 and status values of each of the FEC blocks 2104 within the mini-frame 2102 of the burst message 710 to the root mini-frame monitor 2216. If CRC is used, the root mini-frame monitor 2216 uses the CRC value 2108 of each of the mini-frames 2102 to identify any CRC errors in each of the mini-frames 2102 and adds that data to the mini-frame status values for the mini-frame 2102 of the burst message 710. Additionally, in some embodiments the root mini-frame monitor 2216 is able to check each of the mini-frames 2102 for BIP-8 errors and add that data to the mini-frame status values for the mini-frame 2102 as well. Again, in some embodiments any CRC and/or BIP-8 errors detected are counted as uncorrectable FEC errors within the status values. Alternatively or in addition, the status values are able to indicate a number of CRC and/or BIP-8 errors separate from a number of uncorrectable or correctable FEC errors.

Subsequently, for each of the mini-frames 2102 of the burst message 710, the root mini-frame monitor 2216 records the mini-frame identifier of the received mini-frame 2102 along with the status values for that mini-frame 2102 in the root's local mini-frame table 2218. Specifically, these pairs of a mini-frame identifier with the mini-frame status values form a received portion of the root mini-frame table 2218 in a local memory of the root that is used to report the errors to the source nodes 204, 208. At the same time, the root mini-frame monitor 2216 generates one or more new mini-frame status messages 2300 that indicate which of the mini-frames 2102 of the burst message 710 had uncorrectable FEC, CRC and/or BIP-8 errors as received by the root port 230 such that they need to be re-sent. Like in the nodes 204, 208, these mini-frame status GEM packets 2300 are able to include the mini-frame identifiers of a number (e.g. the last 32) of the received mini-frames 2102 identified in the root table 2218 whose status has not already been reported to the source nodes 204, 208, a representation of the mini-frame status values that correspond to each of those mini-frame identifiers and/or other fields described herein. In some embodiments, the representation indicates whether any uncorrectable FEC errors (optionally counting CRC and/or BIP-8 errors as uncorrectable FEC errors) were found in that mini-frame 2102. Alternatively, the representation is able to indicate specific quantities and/or types of errors found in that mini-frame 2102.

At the same time, the root parser 2212 parses the mini-frame status messages 2300 and the regular GEM packets 600 from the burst message 710. For the regular GEM packets 600, the root parser 2212 transmits the packets 600 (that do not have any errors or whose errors where correctable) to the core switch 228, which processes the packets 600 and distributes them to their target ports 99 and/or devices 102 via the root ports 230 coupled to those target ports 99/devices 102 as described herein. For the mini-frame status messages 2300, the root parser 2212 transmits the status messages 2300 to the root mini-frame monitor 2216, which accesses the mini-frame identifiers and associated status values from each of the status messages 2300.

For each of the mini-frames 2102 without any uncorrectable FEC errors (as indicated by the status values), the root mini-frame monitor 2216 releases the GEM packets 600 mapped within that mini-frame 2102 (and the associated buffer pointers e.g. GEM identifiers) from the retransmission buffer pool (e.g. re-send table) to the free buffer pool (as described in the retransmission section above). Specifically, the root mini-frame mapper 2224 is able to store a table of which transmitted GEM packets 600 were a part of each of the mini-frames, which the root mini-frame monitor 2216 is able to reference using the mini-frame identifiers parsed from the status message 2300 to determine which of the GEM packets 600 are able to be released (e.g. from the re-send table of the core initiator 1810 by removing their associated re-send flows (e.g. remove the re-send table entries and/or local copies)).

For each of the mini-frames 2102 with uncorrectable FEC errors (as indicated by the status values), the root mini-frame monitor 2216 access the transmitted portion of the root mini-frame record table 2218, and using the mini-frame identifiers of those frames (parsed from the status message 2300) identifies the node identifiers paired with those mini-frame identifiers in the root mini-frame record table 2218. Accordingly, the root mini-frame monitor 2216 issues flow control signals to the root output scheduler 2232, the flow control signals indicating the node identifiers that where paired with mini-frames 2102 that had uncorrectable errors and thus need their flows stopped. In response, the root output scheduler 2232 stops further scheduling of packets into the VOQ 2230 for the identified nodes 204, 208 and/or stops further transmission of packets 600 queued in the VOQ 2230 for the identified nodes 204, 208. Indeed, this stopping of further queueing and/or transmission from the queue associated with the identified nodes 204, 208 prevents the wasteful further transmission of packets that will need to ultimately be resent due to the previous uncorrectable error in that flow (e.g. the flow for that node/node VOQ).

Additionally, the root output scheduler 2232 is able to send a re-transmission needed message to the core initiator 1810, the message identifying the mini-frames 2102 and/or GEM packets 600 that need to be retransmitted due to the uncorrectable FEC errors indicated in the status values. This causes the core initiator 1810 to initiate retransmission of those mini-frames 2102 and/or packets 600 regardless of whether an acknowledgment (e.g. GEM ACK message) for those packets 600 has been received and/or whether the acknowledgment timer for those packets 600 has expired. Once all of these packets 600 in the re-send table of the node initiator 1810 have been acknowledge/cleared as having been received without error, the root output scheduler 2232 resumes normal operation including restarting the scheduling and/or transmitting of packets 600 for the node VOQs 2230 identified by the node identifiers (e.g. including releasing their associated virtual NODE VOQ flow control signals, and their associated buffer pointers back to free buffer pool). When GEM packets 600 need to be re-transmitted for reasons other than packet errors (e.g. when an entire message 700, 710 or acknowledgment thereof is not received), the retransmission mechanism described above is able to ensure the re-transmission of the messages/packets.

In some embodiments, the root mini-frame monitor 2216 records all of the errors indicated by the status values along with the node identifiers paired with the mini-frame identifiers where there errors occurred in a broadcast link error table. As a result, the root-mini-frame monitor 2216 is able to use the broadcast link error table to determine faulty links of the networks 206, 210 based on collected errors. Specifically, the root-mini-frame monitor 2216 is able to use this "Big Data" to pin point the root cause of errors and weak point between root ports 230, splitters 214 and nodes 204, 208. For example, if a number of errors detected within a period on a same link between a root port 230 and one or more nodes 204, 208 equals or exceeds a threshold value, the root mini-frame monitor 2216 is able to issue a link error message to a user indicating that the link may be faulty.

Figure 24:
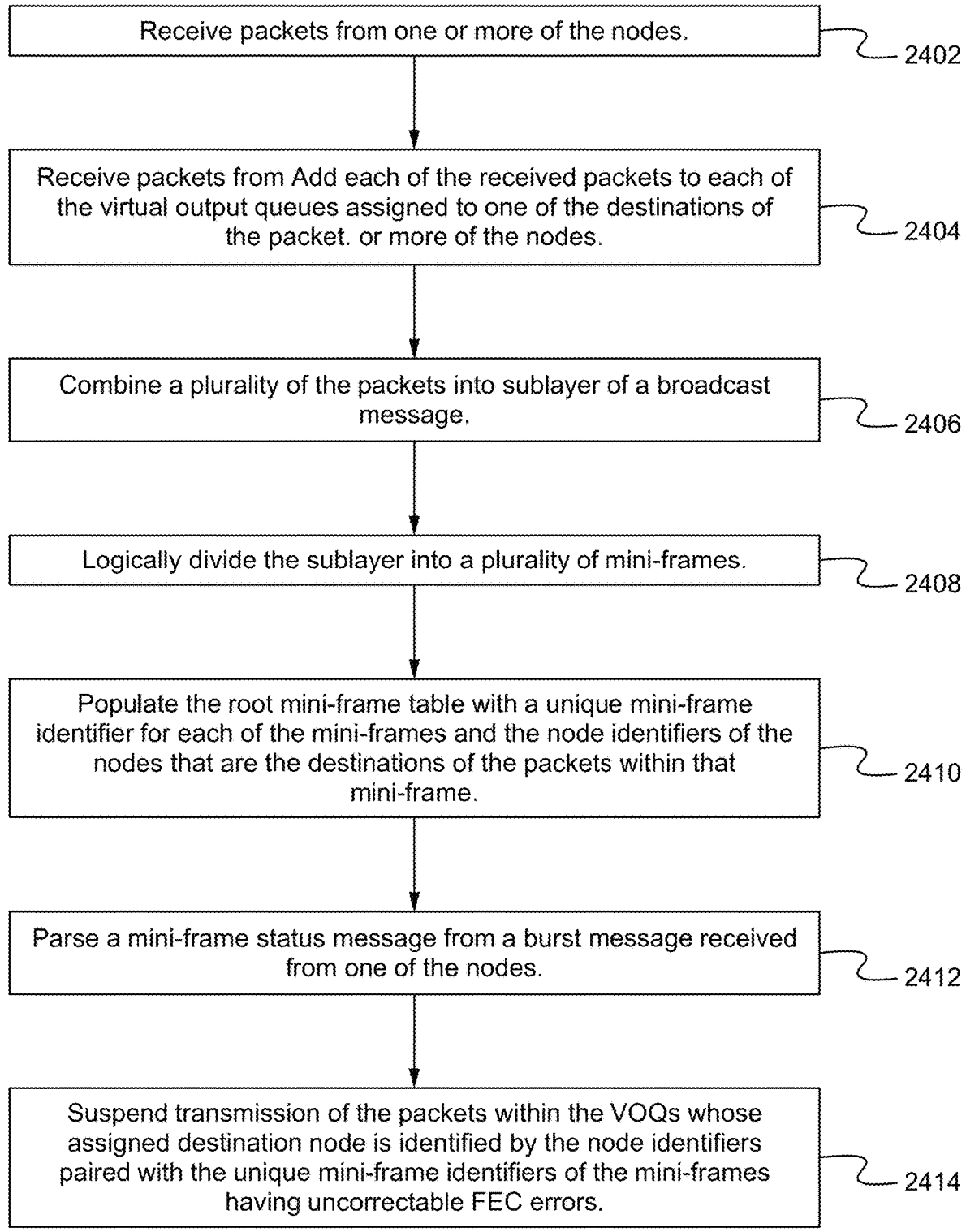
FIG. 24 illustrates a method of operating a controller and sensor bus having an error avoidance mechanism according to some embodiments.

FIG. 24 illustrates a method of operating a controller and sensor bus 104 having an error avoidance mechanism according to some embodiments. As shown in FIG. 24, the root ports 230 receive packets from one or more of the nodes 204, 208 at the step 2402. The core switch 228 adds each of the received packets to each of the virtual output queues 2230 assigned to one of the destinations of the packet at the step 2404. The root MAC 2206 combines a plurality of the packets into sublayer 704 of a broadcast message 700 at the step 2406. The root MAC 2206 logically divides the sublayer 704 into a plurality of mini-frames 2102 at the step 2408. The root MAC 2206 populates the root mini-frame table 2218 with a unique mini-frame identifier for each of the mini-frames 2102 paired the node identifiers of the nodes 204, 208 that are the destinations of the packets within that mini-frame 2102 at the step 2410. The root MAC 2206 parses a mini-frame status message 2300 from a burst message 710 received from one of the nodes 204, 208 at the step 2412. The root MAC 2206 suspends transmission of the packets within the VOQs 2230 (and/or population of the VOQs 2230) whose assigned destination node 204, 208 is one of the nodes 204, 208 identified by the node identifiers paired with the unique mini-frame identifiers that identify one of the mini-frames 2102 having uncorrectable FEC errors (as indicated in the status message 2300) at the step 2414.

In some embodiments, the root MAC 2206 also suspends the adding of more received packets to the VOQs 2230 whose assigned destination node 204, 208 is one of the nodes 204, 208 identified by the node identifiers paired with the unique mini-frame identifiers that identify one of the mini-frames 2102 having uncorrectable FEC errors. In some embodiments, the method further comprises the root MAC 2206 logically dividing each of the mini-frames 2102 into a plurality of FEC blocks 2104; applying an FEC algorithm to each of the FEC blocks 2108; and adding an FEC parity value 2106 to each of the FEC blocks 2104 resulting from the application of the FEC algorithm to that FEC block. In such embodiments, the root MAC 2206 is able to select the FEC algorithm applied to the FEC blocks 2104 from a plurality of stored FEC algorithms based on a quantity of packet data errors reported to the one of the root ports by the nodes 204, 208 during a predetermined period. In some embodiments, the method further comprises the root MAC 2206 applying a Cyclic Redundancy Check (CRC) algorithm to each of the mini-frames 2102 and adding a CRC value 2108 resulting from the application of the CRC algorithm to that mini-frame 2102.

In some embodiments, the method further comprises the node MAC 2202 combining packets input from the devices 102 (e.g. via ports 99) into the sublayer 714 of a burst message 710; logically dividing the sublayer 714 into a plurality of mini-frames 2102; logically dividing each of the mini-frames 2102 into a plurality of FEC blocks 2104; applies an FEC algorithm to each of the FEC blocks 2104; and adding an FEC parity value 2106 to each of the FEC blocks 2104 resulting from the application of the FEC algorithm to that FEC block 2104. In such embodiments, the node MAC 2202 is able to select the FEC algorithm from the plurality of stored FEC algorithms based on a size of a burst window granted to the node 204, 208. Accordingly, the error avoidance mechanism provides the benefit of reducing message errors while still maximizing bandwidth, efficiency and throughput.

Multi-Layer Security

Figure 13:
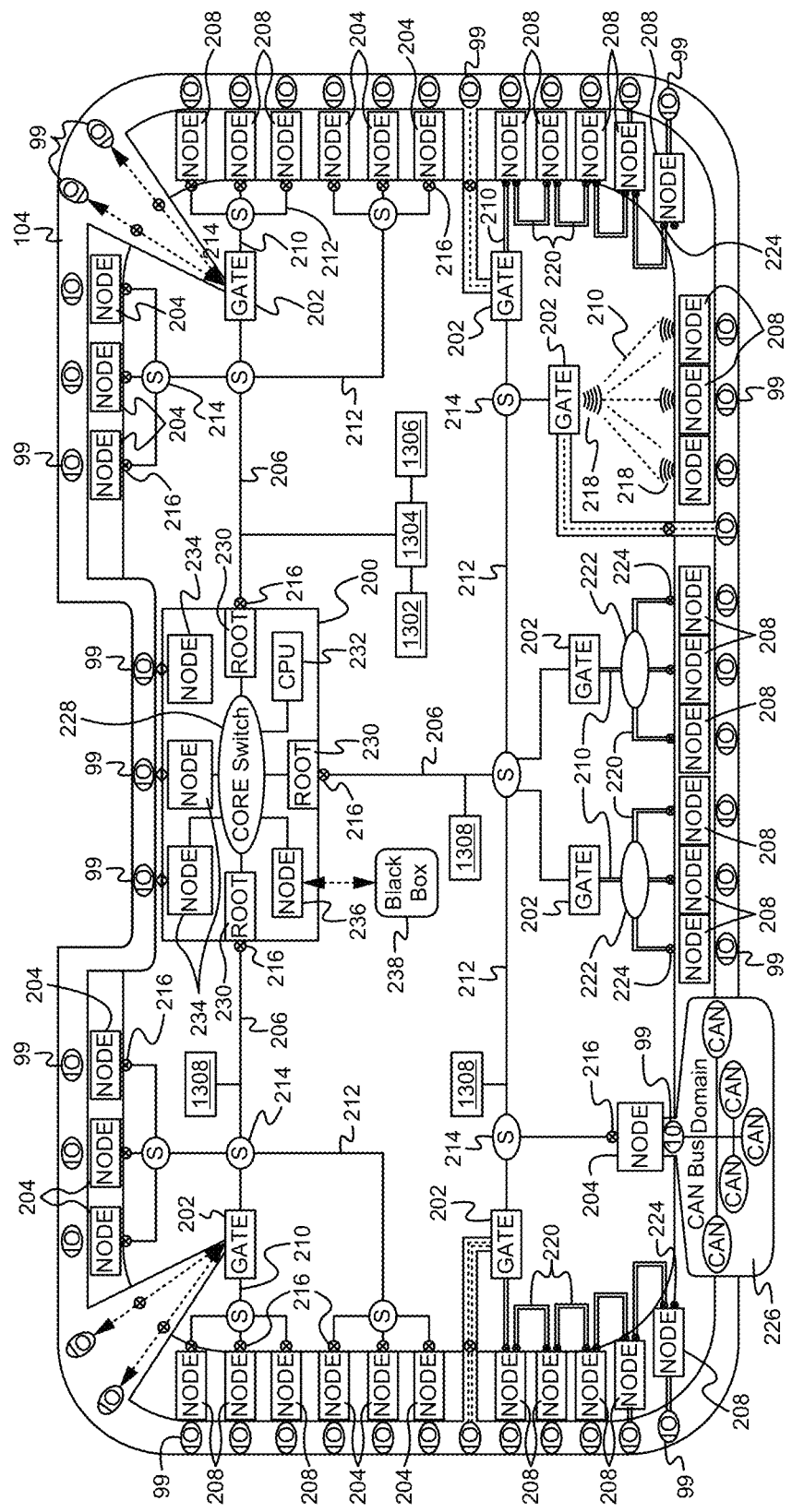
FIG. 13 illustrates a bus including a multi-layer security architecture according to some embodiments.

FIG. 13 illustrates the bus 104 including a multi-layer security architecture including a component layer, a network layer and a behavior layer according to some embodiments. Alternatively, one or more of the layers are able to be omitted. Thus bus 104 of FIG. 13 is able to be substantially similar to the bus of FIG. 2 except for the differences described herein. As shown in FIG. 13, the bus 104 is able to comprise a security module 1302, a dedicated security module management central processing unit (CPU) 1304 and one or more behavior monitoring nodes 1306. In some embodiments, there is one or more separate behavior monitoring nodes 1306 in each of the networks 206 and/or subnetworks 210 for monitoring the behavior of the nodes 204, 208, 234 of those networks 206/210. Alternatively, one or more of the behavior monitoring nodes 1306 is able to monitor the behavior of the nodes 204, 208, 234 of a plurality or all of the networks 206 and/or subnetworks 210. In some embodiments, each core 200 includes a separate security module 1302 and dedicated security module management CPU 1304 within the core 200. Alternatively, one or more of the cores 200 are able to not have a separate security module 1302 and dedicated security module management CPU 1304 and/or the security module 1302 and the dedicated security module management CPU 1304 are able to be external to the cores 200 within the bus 104. In some embodiments, each security module 1302 has a separate dedicated security module management CPU 1304 that operates with the security module 1302. Alternatively, one or more of the dedicated security module management CPUs 1304 are able to operate with a plurality of different security modules 1302.

Figure 14:
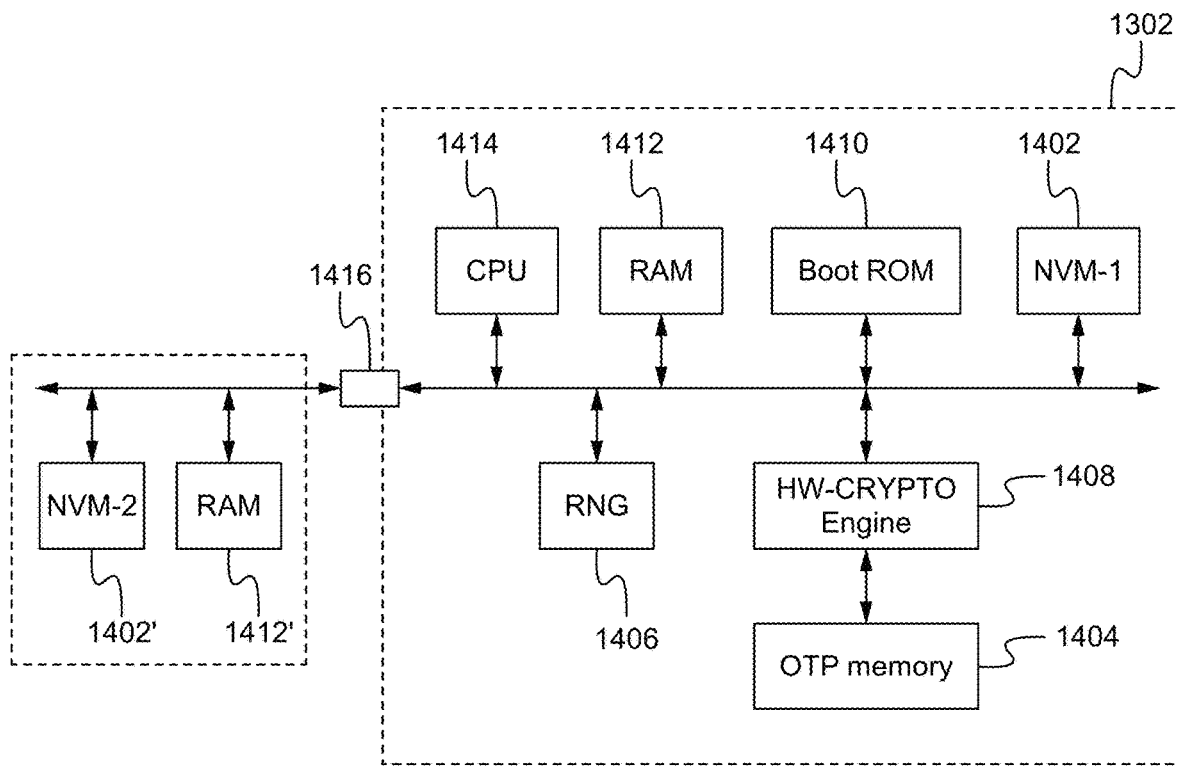
FIG. 14 illustrates a security module of a bus according to some embodiments.

The component layer is able to comprise the security module 1302, the dedicated security module management CPU 1304 and a debug element 1306. As shown in FIG. 14, the security module 1302 is able to comprise a memory 1402 (e.g. non-volatile memory), a one-time programmable (OTP) memory 1404, a random number generator 1406 (e.g. true random number generator (TRNG)), a key generator 1408 (e.g. hardware cryptographic key generation engine), a boot read-only memory (ROM) 1410, a random access memory (RAM), one or more CPUs 1414 and a security module interface 1416. In some embodiments, the module 1302 is able to include external memory via additional memory 1402' (e.g. additional non-volatile memory) and/or additional RAM 1412'. In such embodiments, the module 1302 is able to access, read, or write to the external memory via the interface 1416. The external memory is able to be located in one or more of the cores 200 and/or elsewhere on the bus 104. In some embodiments, only the key generator 1408 has access to the OTP memory 1404 such that OTP memory 1404 is insulated from outside access. In some embodiments, one or more of the elements of the module 1302 are able to be omitted or duplicated and/or different elements are able to be added.

The OTP memory 1402 is memory that cannot be reprogrammed or read without damaging the memory such that the memory is only able to be programmed a single instance. Within the module 1302, the OTP memory 1402 is programmed to store one or more primary seeds and/or a unique primary key (e.g. endorsement primary key), storage key and platform key derived from one or more of the primary seeds for each core 200 and node 204, 208, 234 of the bus 104. These primary seeds and primary keys are never shared outside the module 1302 and within the module 1302 are able to be used to derive all other security keys for the nodes/cores to which they have been assigned/associated (e.g. forming a hierarchical tree of keys). Specifically, the key generator 1408 is able to access the primary keys in order to generate secondary keys for one or more of the nodes and/or cores, which are then able to be stored in the memory 1402 (and in additional memory 1402' if memory 1402 is full). In some embodiments, the primary platform key is used to derive one or more of each node/core's platform key (for network certificates) and each node/core's network encryption keys (e.g. AES encryption) for encrypting messages on the bus 104. In some embodiments, the network encryption keys are able to begin in each core 200 (and distributed to nodes coupled with that core). Theses keys are able to be changed during after a core's 200 reboot. Further, during core 200 operation, the core 200 and/or system 100 is able to change the network encryption keys and distribute the new keys to the nodes (optionally excluding nodes that exhibit suspicious behavior as indicated by the behavior module described below). In some embodiments, the network encryption keys are in an ephemeral key hierarchy in the module 1302. In some embodiments, the primary storage key is able to be used to derive one or more of each node/core's memory 1402, 1402' encryption keys and each node/core's file system encryption keys. In some embodiments, the primary birth/endorsement key is able to be used to derive one or more of each node/core's identity key for use in identification/authentication processes.

For example, a root security key (RSK) of a node/core is able to be an RSA key generated for the node/core (e.g. by the key generator 1408) based on one or more of the primary keys (e.g. birth keys) for that node/core; a storage key (SK) for the node/core is able to be an RSA key generated for the node/core (e.g. by the key generator 1408) based on the RSK of the node/core; the sign key (SignK) used for digitally signing messages of the node/core is able to be an RSA key generated for the node/core (e.g. by the key generator 1408) based on the SK of the node/core; the root network key (RNK) of the node/core is able to be an RSA key generated for the node/core (e.g. by the key generator 1408) based on the RSK of the node/core; and the network AES key (NAK)

used for encrypting/decrypting messages for the node/core is able to be transported to the node/core along with the RNK. Alternatively, other types of secondary keys are able to be used and/or derived from the primary keys. Each of the secondary keys for each node/core are able to be stored in the memory 1402, 1402' of the module 1302 in encrypted forms along with their hierarchical relationship to each other and/or their primary key(s). One or more of these keys of each node/core (except for the primary seeds and/or primary keys) are able to be reset, reassigned and/or recalculated by the dedicated security module 1302 periodically and/or in response to a current status (e.g. a detected behavior status determined by the behavior layer as described below). In some embodiments, one or more of the primary and secondary keys are only able to be used inside the security module 1302. In some embodiments, the encrypted keys are able to be loaded into the module 1302, decrypted and saved for later use.

Additionally, the primary and/or secondary keys are able to be used to provide certificates to each of the nodes and/or cores. In particular, each core is able to be provided with a certificate authority (e.g. saved in the memory 1402, 1402') for use in verification/authentication of valid cores that the node can connect to (see the two-way authentication process below). Similarly, each node is able to be provided a network certificate and a birth certificate (e.g. saved in the memory 1402, 1402') for use in joining one of the networks 206, 210 of the bus 104 and in proving the node's identity on the bus 104, respectively. Also, an original software certificate authority is able to be stored in the OTP memory 1404. This certificate authority's authorization code and its complete self is able to be provided (e.g. along with the seeds) by the original owner of the system 100 and is able to be used to authenticate software that can be loaded and used on the bus 104 (see trust boot process below).

The random number generator 1406 is able to generate random numbers and/or strings that are able to be used by the key generator 1408 along with the primary seeds and/or keys to generate the secondary keys of the key tree for each node 204, 208, 234 and/or core 200. In some embodiments, the key generator 1408 is also able to generate authentication codes for messages for enabling the secure communication within the networks 206, 210 and/or is able to be used to generate hash based keys for the nodes and/or cores. The security module interface 1416 is able to provide an interface for communicating with the dedicated security module management CPU 1304 for receiving and responding to system 100 requests.

In some embodiments, the module 1302 includes a reset function that is able to reset the settings of the security module such that all of the memory 1402, 1402' is deleted thereby removing all the security keys stored there. However, even during a reset, the data stored in the OTP memory 1404 (e.g. primary seeds/keys) is not affected. In some embodiments, the reset function 1416 is not able to be activated remotely such that a physical presence of an administrator is required to reset the security module 1302.

The dedicated security module management CPU 1304 is able to be isolated from all other CPU subsystems within the network 100 and is dedicated to operating with the security module 1302. As a result, the dedicated security module management CPU 1304 provides the only access to the security module 1302 within the system 100. In order for any of the operating elements of the bus 102 to access the security module 1302 they must interface with the security module management CPU 1304 which then communicates with the module 1302 in order to retrieve the desired data.

Figure 15:
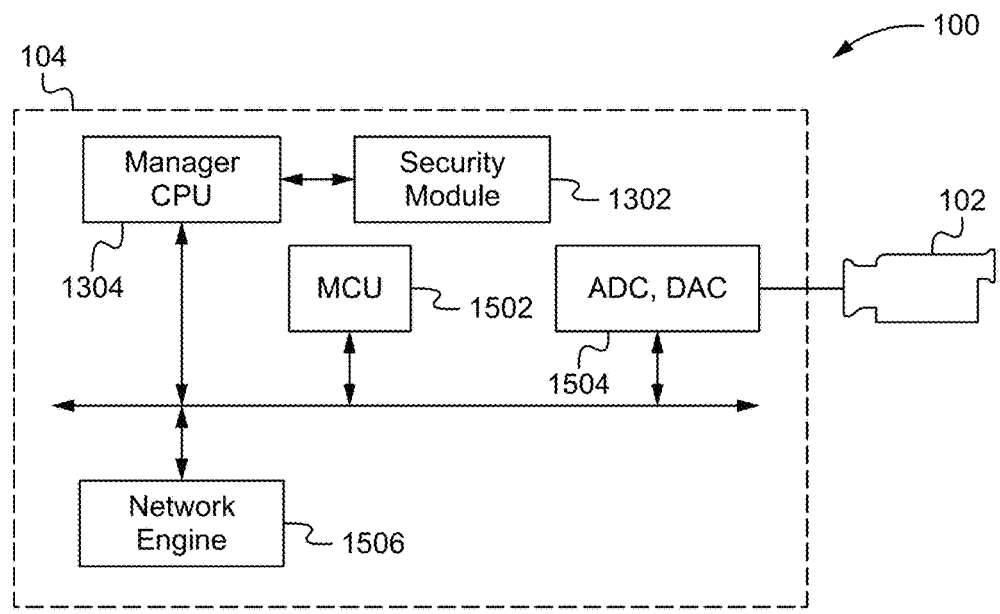
FIG. 15 illustrates a bus comprising a plurality of subsystems divided into a plurality of cascade supervisor levels according to some embodiments.

The component layer is also able to implement a cascade supervisor infrastructure and a trust boot process. Specifically, FIG. 15 illustrates the bus 104 comprising a plurality of subsystems divided into a plurality of cascade supervisor levels according to some embodiments. As shown in FIG. 15, a highest level is able to include one or more of the dedicated security module management CPU 1304, the security module 1302, one or more controllers (e.g. microcontroller units (MCU)) 1502 for executing real-time control over devices 102 and one or more converters 1504 (e.g. analog to digital converter (ADC), digital to analog converter (DAC)). In some embodiments, the controller units 1502 are able to incorporate one or more computer system applications or user applications. A second level is able to include one or more network engines 1506. In some embodiments, one or more additional levels are able to be added. Each component of each level is provided access to lower layer resources/services, but each lower layer component is not able to direct access/use to upper level resources/services. Instead, if an upper layer resource/service is required, the lower level component is able to send a request (e.g. interrupt signal) to the higher level component for the desired resources/services. As a result, the upper level components are able to enforce security protocols on the lower level components by enforcing these protocols in granting, performing or denying the lower level component requests. At the same time, only the dedicated security module management CPU 1304 has access to the security module 1302 (where encryption keys and certificates are stored). Alternatively, more or less levels and/or components are able to be used.

The trust boot process is a secure boot process wherein each booted program (e.g. boot loaders of nodes or other elements of the system 100 and/or operating system images of management CPU 1304, controllers 1502, drivers, user applications and/or other programs) is authenticated before booting the next level of the system such that programs that are unable to be authenticated are prevented from operating until authentication is able to be established. Specifically, the memory 1402 of the security module 1302 is able to store a measurement set (e.g. hash or other measurement metric) for each program to be booted on the system 100 (e.g. each image and/or boot loader of the program) and an original certificate authority that is able to verify the certificates of the booted programs. The original certificate authority (e.g. as provided by the original owner) is able to be stored in the OTP memory 1404 during manufacture or startup of the bus 104. The measurement set for each program is able to include: a golden set of measurements (e.g. factory/initial settings); a last set of measurements recorded from the most recent boot attempt; and a current set of measurements recorded from the booting of the program as it is currently running on the system 100. Further, each time a program is updated, rather than overwriting the existing entry of measurements, a new entry of golden, last and current sets of measurements is able to be stored (such that the system is able to return to previous measurements sets if they wish to revert back from a subsequent update). In some embodiments, each booted program comprises a certificate (e g manufacturer's certificate), the boot program itself, and a measurement of the boot program (e.g. signed code hash). As described below, each boot program's certificate and measurements need to be verified before the program is able to be executed/booted.

In operation, while halting the booting of all other programs, the system 100 first uses the certificate authority stored in the OTP memory 1404 to determine if the bootloader certificate of the bootloader software of the dedicated security module management CPU 1304 is authentic. For example, the certificate is able to be the signature of a key that is able to be decrypted using a key verifiable by the certificate authority. If it is not authentic, the boot is aborted and corrective action is taken (e.g. using a previous stored version, issuing an administrative alert, etc.). If it is authentic, the system measures the boot software image of the dedicated security module management CPU 1304, store the results as the last measurement set for the associated entry in the security module 1302 and compares the results with the stored golden measurement set for that entry. If the measurements match (or substantially match within a defined range of inconsistency), the system boots the security module management CPU 1304 and records the results as the current measurements for the associated entry. The system then is able to repeat this pattern for booting each subsequent program (while halting the booting of other programs) and in the same manner measure the program, store the results, compare them with the stored golden measurement set and boot the program if the results match (or substantially match within a defined range of inconsistency). If the measurement results of any of the programs do not match (or substantially match within a defined range of inconsistency), the measurement is able to be recalculated and/or the booting of those programs is able to be halted and/or skipped until an administrator approves the inconsistencies or approves boot from a previous stored entry (e.g. a previous version).

In some embodiments, if subsequent user's want to add additional software that does not have a certificate from the original certificate authority, there can be multiple stages of bootloaders that each use a subsequent certificate authority (granted by the previous certificate authority) in order to authenticate the certificate of their boot software. Specifically, in such multi-stage boot processes, after the stage 1 bootloader software certificate and software measurements (e.g. hash) are authenticated as described above, the stage 1 bootloader software is executed and the stage 1 certificate authority (e.g. provided by the original bus 104 owner and stored in the OTP memory 1404) generates a new certificate authority and loads it into the RAM 1412, 1412' of the security module 1302. This new certificate authority is signed by the original certificate authority and issues a stage 2 bootloader software certificate. This stage 2 bootloader software certificate is able to be used along with the stage 2 bootloader software so it can be authenticated by the security module 1302 (using the new certificate authority instead of the original certificate authority) in the same manner that the stage 1 bootloader software certificate was verified as described above.

If the stage 2 bootloader software certificate is authenticated, then software measurements (e.g. hash) are taken of the stage 2 bootloader software to determine if they substantially match with the golden measurements for stage 2 (or if this is the first time, the measurements are stored as the golden measurements). If the measurements substantially match, the stage 2 bootloader software is executed. If any of the authentications fail, then the booting of that bootloader software is able to be aborted or retried. This pattern is then able to continue for any subsequent stages with, the previous stage generating the new certificate authority and software certificate for each subsequent stage in the chain. As a result, the system is able to ensure that each program running on the bus 104 is authenticated.

The debug element 1306 is able to be implemented via one or more debug access ports (e.g. joint test action group (JTAG) ports) and/or remotely via the network 210 along with a debug control interface (IF) and a debug controller. The debugging element requires authentication before it enables access to the bus 102. Specifically, the debug element requires a debug certificate issued by a network component (e.g. a node manufacturer is required to enable debug control interface (IF) inside the SoC (e.g. core 200)). Regarding the debugging of the security module 1302, the debug control IF is able to be enabled via the dedicated security module management CPU 1304 and is able to only be valid for a predetermined time period and/or other specific preprogrammed states. In some embodiments, the debug element 1306 is disabled at runtime (e.g. to prevent runtime hacking).

As a result, the component layer provides the advantage of preventing unknown or unauthorized components from communicating or otherwise disrupting operation of the bus 104 including preventing both physical and software corruption attempts. Additionally, the component layer is able to stop power rail attacks by screening power consumption from being used to deceive security keys.

The network layer comprises the implementation of a two-way node/core authentication and/or a message encryption protocol. The two-way node/core authentication is able to be implemented on the bus 104 each time a node 204, 208, 234 joins the bus 104 (e.g. a device 102 couples to the node 204, 208, 234), periodically thereafter, upon demand, and/or in response to a behavior pattern detected by the behavior layer. Before the process begins, the new node's identifier (e.g. networking certificate) is stored in a database of the memory of the core(s) 200 to which the node 204, 208, 234 wishes to communicate and the identifier(s) and/or certificate(s) (e.g. certificate authority) of those core(s) 200 are stored on the node 204, 208, 234. After the node/core are authenticated, the certificate of the core(s) 200 are stored on the node 204, 208, 234 for future communications/authentication. These certificates are able to be core/node manufacturer certificates that are provided to the security module 1302, which is then able to provide them (or a derivative thereof using one or more of the primary seeds and/or keys of the core/node) to the core/node. Specifically, each core 200 is able to store the identifiers and/or certificates of all the nodes 204, 208, 234 within networks 206, 210 to which the core 200 belongs and each node 204, 208, 234 is able to store the identifiers and/or certificates of all the cores 200 within networks 206, 210 to which the node 204, 208, 234 belongs.

Figure 16:
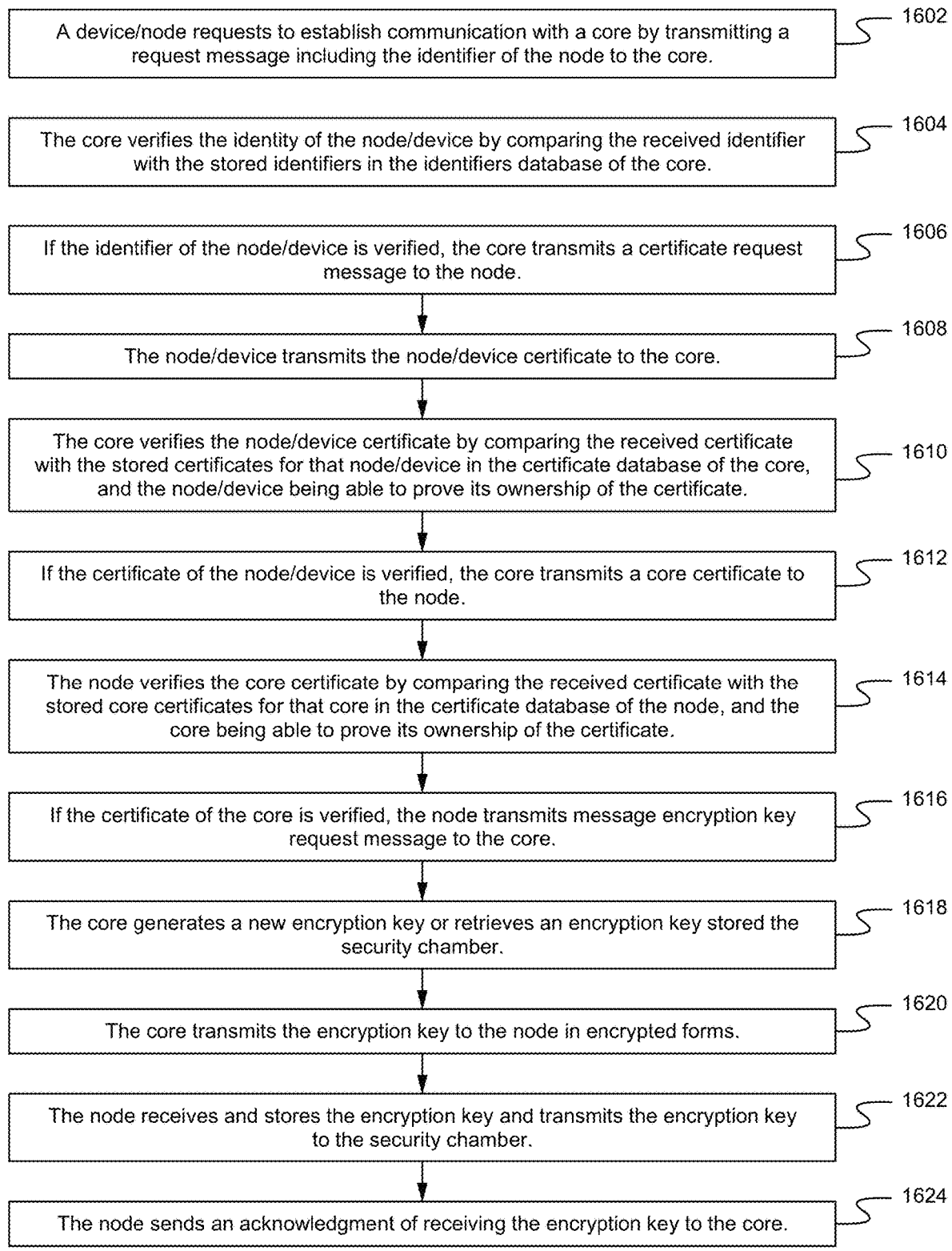
FIG. 16 illustrates a method of implementing the two-way node/core authentication protocol according to some embodiments.

FIG. 16 illustrates a method of implementing the two-way node/core authentication protocol according to some embodiments. As shown in FIG. 16, the node 204, 208, 234 requests to join (or reestablish) communication with a core 200 under a policy (e.g. public, private or other) by transmitting a request message including the identifier of the node 204, 208, 234 to the core 200 at the step 1602. The policy is able to define a privilege level to be afforded to the node 204, 208, 234 and/or a level of encryption required for communications by the node 204, 208, 234. The core 200 verifies the identity of the node 204, 208, 234 by comparing the received identifier with the stored identifiers in the identifier database of the core 200 at the step 1604. If the identifier of the node 204, 208, 234 is verified, the core 200 transmits a certificate request message to the node 204, 208, 234 at the step 1606. The node 204, 208, 234 transmits the node certificate to the core 200 at the step 1608. In some embodiments, the node 204, 208, 234 selects which of the stored certificates to transmit based on the policy requested in the request message of step 1602.

The core 200 verifies the node certificate by comparing the received certificate with the stored certificates for that node in the certificate database of the core 200 (and the node being able to prove its ownership of the certificate) at the step 1610. If the certificate of the node 204, 208, 234 is verified, the core 200 transmits a core certificate to the node 204, 208, 234 at the step 1612. In some embodiments, the core 200 selects which of the stored certificates to transmit based on the policy requested in the request message of step 1602. The node 204, 208, 234 verifies the core certificate by comparing the received certificate with the stored core certificates for that core 200 in the certificate database of the node 204, 208, 234 (and the core being able to prove its ownership of the certificate) at the step 1614. If the certificate of the core 200 is verified, the node 204, 208, 234 transmits message encryption key request message to the core 200 at the step 1616. In some embodiments, the certificate request messages and verification thereof is based on the policy such that different policies are associated with different certificates and authentication thereof requires that the certificate associated with the correct policy be submitted.

The core 200 generates a new encryption key or retrieves an encryption key (e.g. NAK) stored the security module 1302 (e.g. via a request to the security module management CPU 1304) at the step 1618. The core 200 transmits the encryption key to the node 204, 208, 234 at the step 1620. The node 204, 208, 234 receives and stores the encryption key and transmits the encryption key to the security module 1302 at the step 1622. In some embodiments, the core 200 encrypts the encryption key before transmitting it to the node 204, 208, 234 (via the security module management CPU 1304) using the root network keys (RNK) of the core 200 and the node 204, 208, 234 so that it cannot be read by the other nodes during transport. The node 204, 208, 234 sends an acknowledgment of receiving the encryption key to the core 200 at the step 1624. As a result, the system 100 enables each core/node pair to establish (and reestablish) an encryption key (either only used by that pair or shared by a set of one or more of the nodes and/or cores) for encrypting/decrypting communication between the core 200 and the node 204, 208, 234 on the bus 104.

Before this authentication process, new nodes 204, 208, 234 joining the bus 104 are able to listen to broadcast messages from the core 200, but are restricted from transmitting/bursting messages onto the bus 104 until they are authenticated. When listening, the new nodes 204, 208, 234 will be unable to decrypt secure policy (SP) messages that are encrypted (e.g. via AES), but are able to understand public policy (PP) message that are unencrypted. Additionally, the authentication process described above is able to require system administrator privileges to execute.

The message encryption protocol causes the nodes 204, 208, 234 and/or cores 200 of the system 100 to encrypt all communications through the bus 104 (if subject to a secure policy) using an encryption key (e.g. AES key) assigned to the node 204, 208, 234 and/or core 200 by the management CPU 1304 and/or security module 1302 during the two-way authentication process. Alternatively, if the communications are not sensitive, they are subject to a public policy where the encryption is able to be omitted. The encryption keys used for encrypting messages are able to be unique to each node/core pair communicating such that different node/core pairs are able to use different encryption keys for encrypting their communications. Thus, a core 200 is able to store multiple encryption keys each associated with one or more different nodes 204, 208, 234 and used to encrypt/decrypt the messages from those one or more nodes 204, 208, 234. Similarly, a node 204, 208, 234 is able to store multiple encryption keys each associated with one or more different cores 200 and used to encrypt/decrypt the messages from those one or more cores 200. As a result, even if a decryption key is compromised, the intruder is only able to decrypt messages from the nodes 204, 208, 234 and/or cores 200 using that key and not the messages encrypted using other keys. Thus, the network layer of the system 100 provides the benefit of enabling a separate key is to be used for each node/core communication combination and/or for encryption keys to be shared by some or all of the node/cores such that the level of security of the system 100 is customized. Further, the network layer provides the advantage of two-way authentication ensuring that both nodes and cores are authenticated before joining the network and that subsequent communications are encrypted from unwanted listening.

The behavior layer includes one or more behavior monitoring nodes (or cores) 1308 that are able to monitor the behavior of the nodes 204, 208, 234 and/or cores 200 within the bus 104 (or a subset thereof) in order to detect and/or respond to anomalous behavior. In some embodiments, the monitoring nodes 1308 are located within one or more of the nodes 204, 208, 234 and/or the cores 200. Alternatively or in addition, the monitoring nodes 1308 are able to be separate from the nodes 204, 208, 234 and/or the cores 200.

In operation, the monitoring nodes 1308 monitor and store the behavior of one or more of the nodes 204, 208, 234 (and thus the devices 102 coupled to them) and/or cores 200 within the bus 104. The monitoring nodes 1308 then compare periods of this monitored behavior to a set of stored behavior parameters or patterns to determine if the period of monitored behavior is within the acceptable values of the behavior parameters (for that node/core). If the monitored behavior is not within the acceptable values of the behavior parameters, the monitoring node 1308 is able to take one or more security actions with respect to the node/core. These actions are able to include sending a warning or error message indicating the detected behavior, suspending operation of the node/core, requiring the node/core to re-authenticate with the system (e.g. via the authentication process of FIG. 16), changing the encryption keys used by all the other nodes/cores (such that the "misbehaving" node/core can no longer encrypt/decrypt messages on the system) and suspend operation of the all or portions of the bus 104, devices 102 and/or system. The monitoring node 1308 is able to include a table that associates one or more of the actions with the nodes/cores and their behavior parameters such that the action taken by the monitoring nodes 1308 is able to be based on how the monitored behavior deviates from the behavior parameters as indicated by the table. In some embodiments, one or more of the actions are only taken if a predetermined number or percentage of the monitoring nodes 1308 all indicate that the behavior of the subject node/core (as separately monitored by those individual monitoring nodes 1308) is outside the behavior parameters for that node/core.

The monitored behavior is able to comprise message frequency, message type, power usage, message destinations, message times, message size, congestion levels and/or other characteristics of behavior of nodes and/or cores described herein. Correspondingly, the stored behavior parameters are able to comprise values, ranges, thresholds, ratios or other metrics of one or more of the monitored behavior characteristics and/or combinations thereof. The stored behavior parameters are able to be preprogrammed for each monitoring node 1308 (or shared by a plurality of monitoring nodes 1308) such that each type of the nodes 204, 208, 234 and/or cores 200 that it monitors has an associated set of behavior parameters. Alternatively or in addition, one or more of the monitoring nodes 1308 is able to include an artificial intelligence or self-learning function where the nodes 1308 generate and/or adjust the behavior parameters for each type of the nodes 204, 208, 234 and/or cores 200 that it monitors based on its behavior. For example, a default behavior parameter is able to be preprogrammed and then adjusted periodically based on the monitored behavior during that period.

As a result, the behavior layer provides the advantage of detecting when nodes and/or cores are hacked due to key/certificate leaks (e.g. illegal software running on them using a legal certificate) as well as errors or other malfunctions causing misbehavior.

Figure 17:
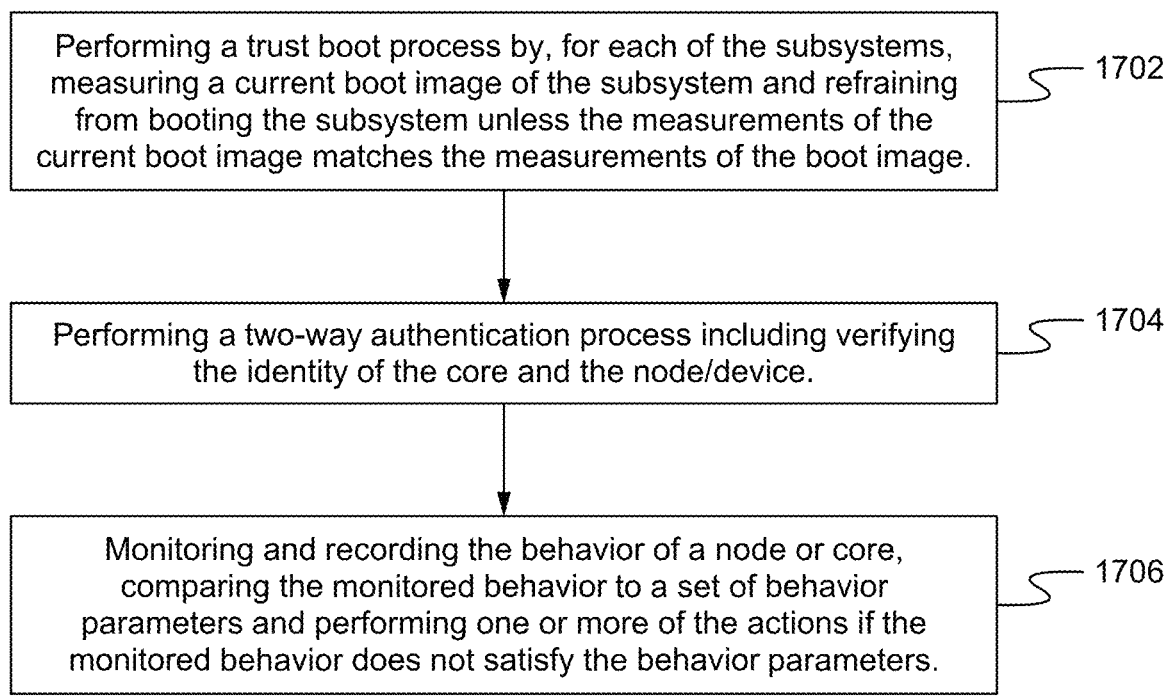
FIG. 17 illustrates a method of operating the intelligent controller and sensor intranet bus according to some embodiments.

FIG. 17 illustrates a method of operating the intelligent controller and sensor intranet bus according to some embodiments. As shown in FIG. 17, the bus 104 performs a trust boot process comprising for each of the subsystems of the bus 104: measuring a current boot image of the subsystem and refraining from booting the subsystem unless the measurements of the current boot image matches the measurements of the boot image of the subsystem stored in the security module at the step 1702. The nodes 204, 208, 234 and the core 200 perform a two-way authentication process by verifying the identity of the core 200 with the one of the nodes 204, 208, 234 based on a derivative of one or more of the primary seeds and/or keys of the core 200 and verifying the identity of the one of the devices 102 coupled to the one of the nodes 204, 208, 234 with the core 200 based on a derivative of one or more of the primary seeds and/or keys of the one of the nodes 204, 208, 234 at the step 1704. The behavior monitoring nodes 1308 stores sets of behavior parameters and actions that correspond to a group of one or more of the nodes 204, 208, 234 and the core 200 and for each one of the group: monitors and records the behavior of the one of the group; compares the monitored behavior to the behavior parameters of one of the sets of behavior parameters and actions that corresponds to the one of the group; and if the monitored behavior does not satisfy the behavior parameters, performs one or more of the actions of the one of the sets of behavior parameters and actions at the step 1706. As a result, the method provides the benefit of ensuring security of the system 100 on component, network and behavior levels.

In some embodiments, after enabling the one of the devices 102 to communicate messages, the node/core periodically re-perform the two-way authentication process and disabling the operation of the one of the devices 102 on the bus 104 if the two-way authentication process fails. In some embodiments, if the two-way authentication process is successful, the core 200 determines an encryption key for the one of the devices 102 and the one of the nodes and the core and node/device encrypt and decrypt messages using the encryption key. In some embodiments, each time the periodical re-performance of the two-way authentication process is successful, the core 200 determines a new encryption key for the one of the devices/node and encrypts and decrypts messages using the new encryption key.

Device Modules

Figure 9:
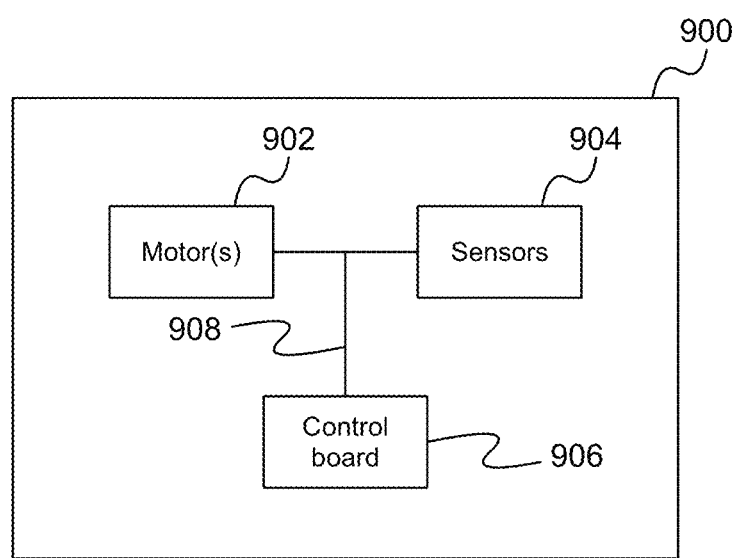
FIG. 9 illustrates a smart compliant actuator (SCA) and sensor module according to some embodiments.

In some embodiments, the devices 102 are able to be device modules. FIG. 9 illustrates a smart compliant actuator (SCA) and sensor module 900 according to some embodiments. The SCA and sensor module 900 is able to be one or more of the devices 102 of the machine automation system 100 described herein. In some embodiments, the smart compliant actuator (SCA) and sensor module 900 allows deviations from its own equilibrium position, depending on the applied external force, wherein the equilibrium position of the compliant actuator is defined as the position of the actuator where the actuator generates zero force or zero torque. As shown in FIG. 9, the SCA and sensor module is able to comprise one or more motors 902, one or more sensors 904 and/or a control board 906 (for controlling the motors 902 and/or sensors 904) coupled together via a device network 908. In particular this type of module 900 is able to perform high-bandwidth and/or low-latency required machine automation tasks (e.g. coupled with one or more controller devices 102 via the bus 104). The motors 902 are able to include actuator motors to control the actuation of the module 900 (e.g. movement of a robot arm) and the sensors 904 are able to include image and/or magnetic sensors to input image data and/or detect the position of the module 900 (e.g. a current position of the robot arm, a position of the image sensor, sensed images from the front of a self-driving car, or other sensed data).

Figure 10A:
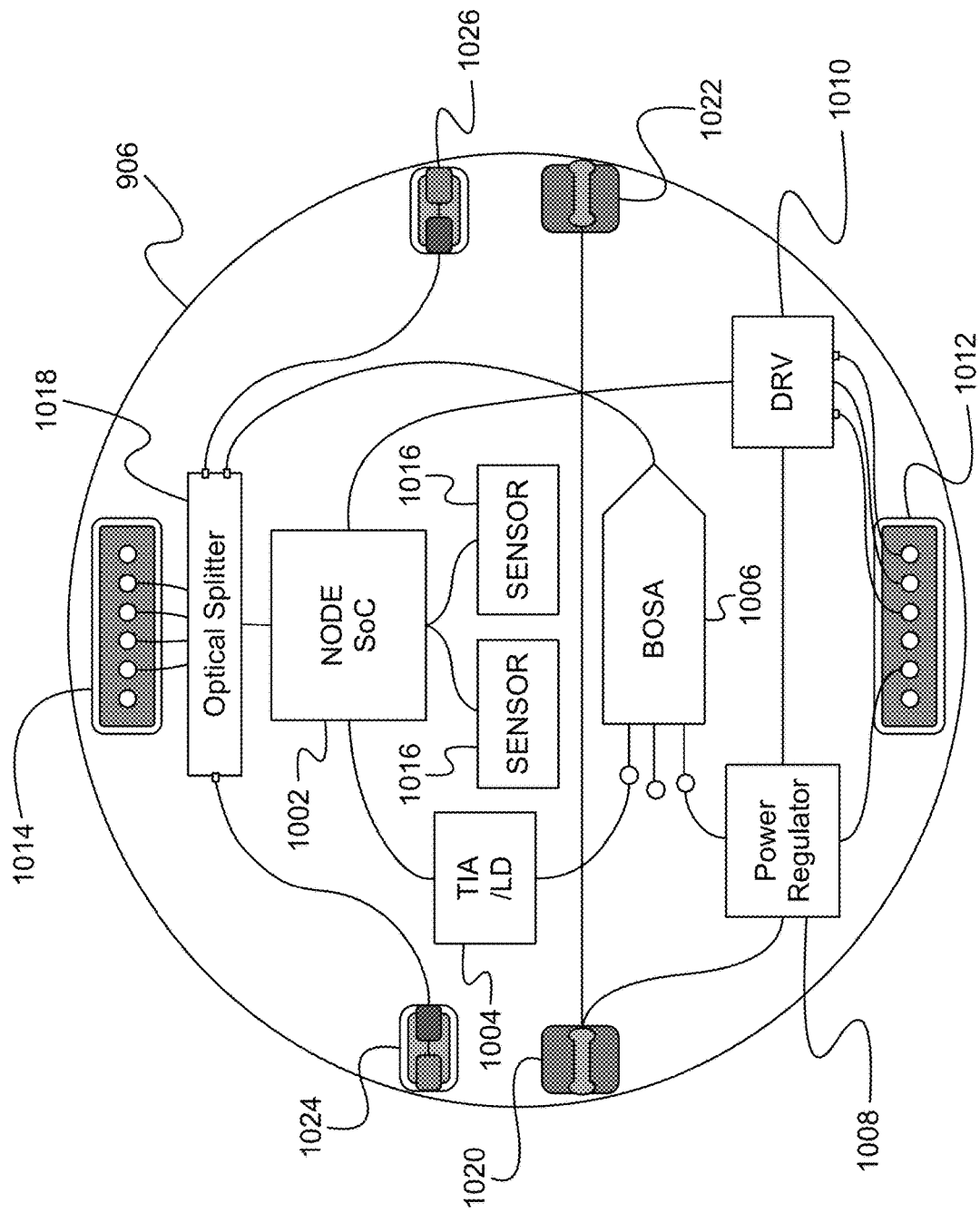
FIG. 10A illustrates a first variant of a control board of SCA and sensor module according to some embodiments.
Figure 10B:
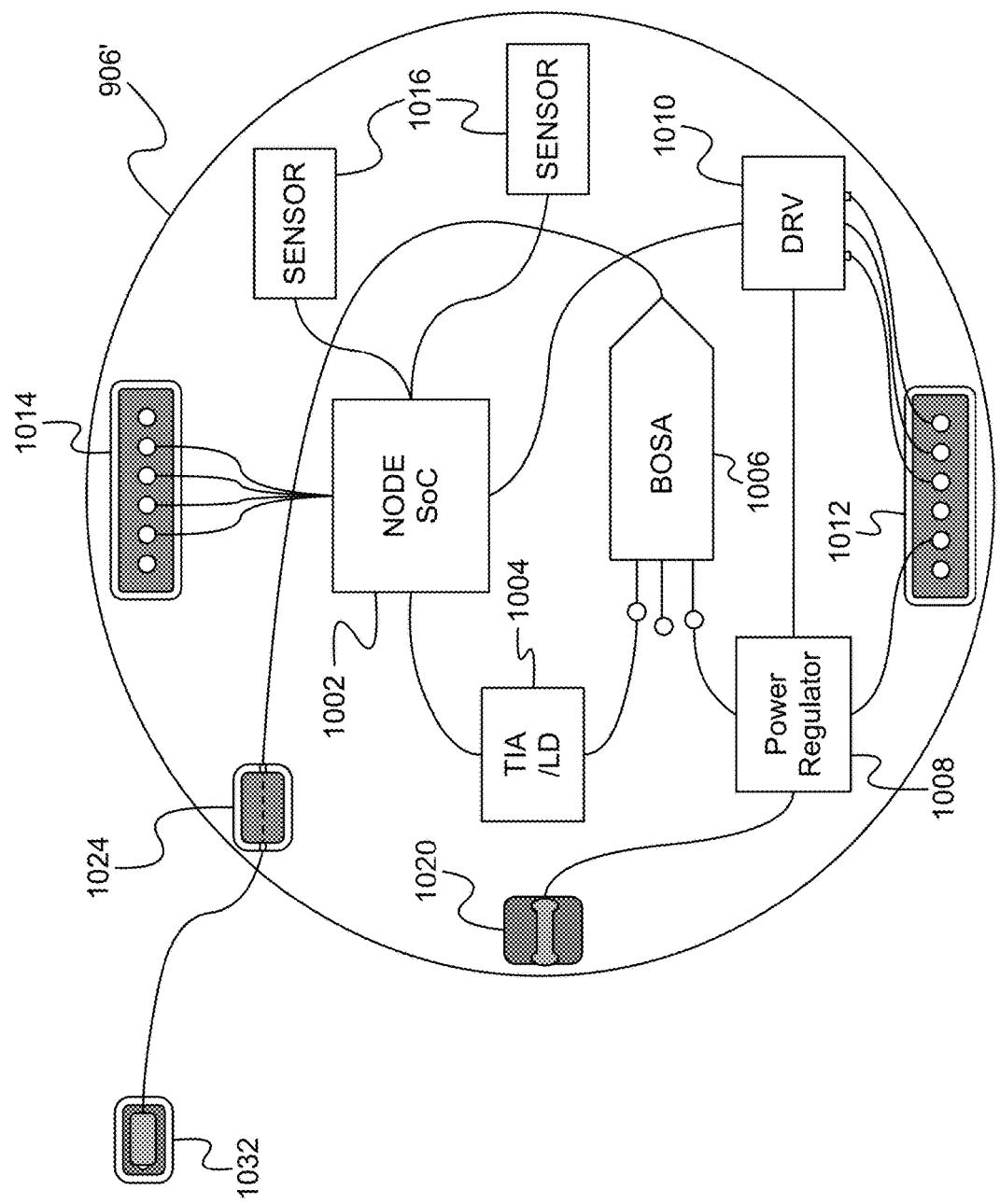
FIG. 10B illustrates a second variant of a control board of SCA and sensor module according to some embodiments.
Figure 10C:
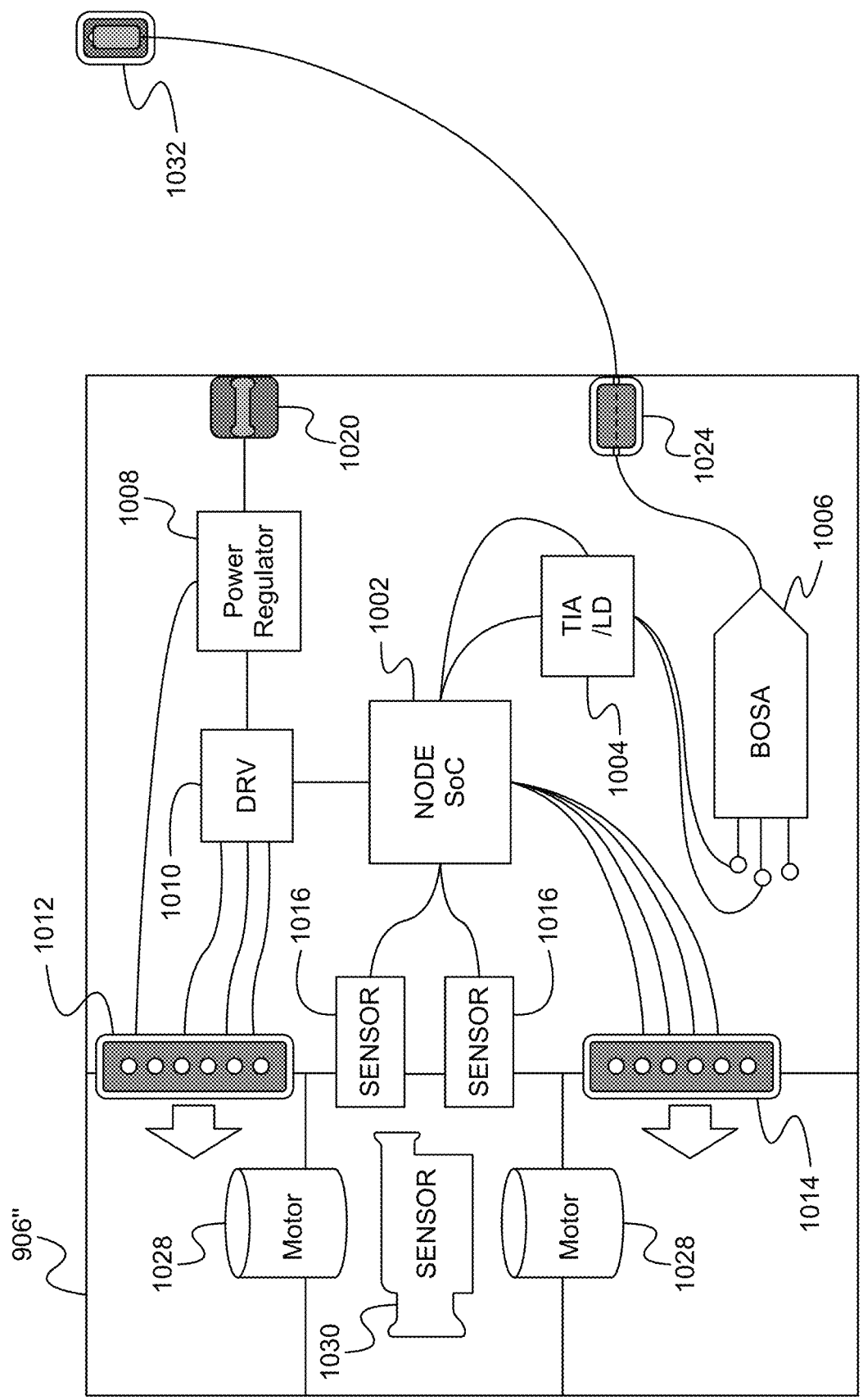
FIG. 10C illustrates a third variant of a control board of SCA and sensor module according to some embodiments.

FIGS. 10A-C illustrate variants of the control board 906, 906', 906" according to some embodiments. As shown in FIG. 10A, the control board 906 for a multi-connection mode module 900 is able to comprise a node system on chip (SoC) 1002, a transimpedance amplifier (TIA) and/or laser driver (LD) 1004, a bidirectional optical subassembly (BOSA) 1006, a power regulator 1008, a motor driver 1010, a compliant actuator motor and power control connector 1012, a motor control signal transceiver 1014, one or more sensors 1016, an optical splitter 1018, an input power connector 1020, one or more output power connectors 1022, a first fiber optic connector 1024 and one or more second fiber optic connectors 1026 all operatively coupled together. In particular, the BOSA 1006, splitter 1018 and fiber optic connectors 1024, 1026 are coupled together via fiber optic cable. Alternatively, one or more of the above elements are able to be omitted, their quantity increased or decreased and/or other elements are able to be added.

The control board 906 is able to be a flexible printed circuit board. The BOSA 1006 is able to comprise a transmitter optical sub-assembly (TOSA), a receiver optical sub-assembly (ROSA) and a wave division multiplexing (WDM) filter so that it can use bidirectional technology to support two wavelengths on each fiber. In some embodiments, the BOSA 1006 is a hybrid silicon photonics BOSA. The motor driver 1010 is able to be a pre-driver, gate driver or other type of driver. The compliant actuator motor and power control connector 1012 is able to transmit control and/or power signals to the motors 902. The motor control signal transceiver 1014 is able to receive motor control signals and/or transmit motor, sensor and/or other data to one or more controller devices 102 via the bus 104. The sensors 1016 are able to comprise magnetic sensors and/or other types of sensors. For example, the sensors 1016 are able to sense a position and/or orientation of the module 900 and provide the positional data as feedback to the SoC 1002 and/or a controller device 102 coupled with the module 900 via the bus 104. The optical splitter 1018 is able to be built-in to the control board 906. The input power connector 1020 receives power for the control board 906. The output power connectors 1022 are configured to supply, transfer and/or forward power to one or more other boards/modules 900.

The first fiber optic connector 1024 is coupled with the fiber optic splitter 1018 which splits the cable into two or more cables. One cable couples with the BOSA 1006 for transmitting signals to and from the other elements of the board 906 and the remainder each couple with a different one of the one or more second fiber optic connectors 1026. The first fiber optic connector 1024 and/or second fiber optic connectors 1026 are able to be a pigtail fiber optic connection points and/or connectors 1024. Specifically, the pigtail fiber optical connection point and/or connector is able to comprise a single, short, usually tight-buffered, optical fiber that has an optical connector pre-installed on one end and a length of exposed fiber at the other end. The end of the pigtail is able to be stripped and fusion spliced to a single fiber of a multi-fiber trunk. Alternatively, other types of optical connection points and/or connectors 1024 are able to be used.

In operation within the control boards 906, 906', 906", the motor driver 1010 is able to receive pulse width modulated (PWM) control signals generated by the SoC 1002 (and/or the controller devices 102 via the SoC 1002) for controlling the torque, speed and/or other operations of the motors 902 of the SCA module 900 (via the compliant actuator motor and power control connector 1012). Additionally, the sensors 1016, the sensors 904 and/or the driver 1010 are able to provide motor and/or sensor status feedback to the SoC 1002 such that the SoC 1002 (and/or the controller devices 102 via the SoC 1002) are able to adjust the control signals based on the feedback in order to control the operation of the motors 902 and/or sensors 904. For example, the driver 1010 is able to provide motor current sensor feedback comprising phase-A current values, phase-B current values and phase-C current values, wherein an internal analog to digital converter (ADC) of the SoC 1002 converts the values to digital values and the SoC 1002 (and/or the controller devices 102 via the SoC 1002) adjusts the PWM control signals transmitted to the driver 1010 based on the motor current sensor feedback received from the driver 1010 thereby adjusting the speed, torque and/or other characteristics of the motors 902.

Figure 11A:
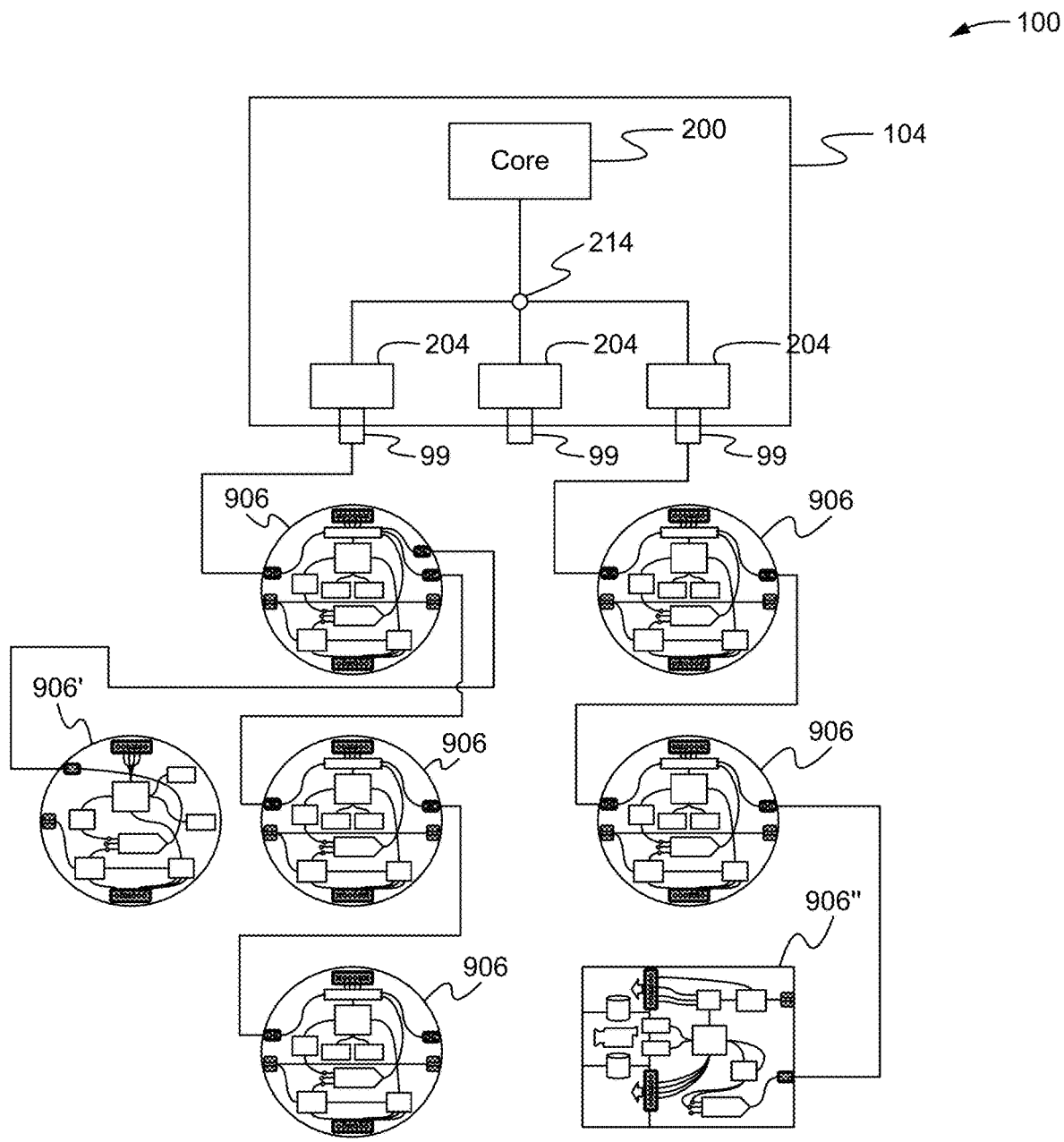
FIGS. 11A and 11B illustrate a machine automation system including coupled SCA and sensor modules according to some embodiments.

In operation within the system 100, the first fiber optic connector 1024 enables the board/module 900 to couple to the bus 104 via an optical fiber cable, while the splitter 1018 and the second fiber optic connectors 1026 enable the board/module 900 to couple to one or more additional boards/modules 900 via additional optical fiber cable (e.g. for receiving control signals from and/or sending data signals to one or more controller devices 102 coupled to other ports 99 of the bus 104. As a result, as shown in FIG. 11A, the boards/modules 900 are able to couple to ports 99 of the bus 104 as a serial cascade wherein only a single port 99 is able to couple to a plurality of boards/modules 900. Specifically, as shown in FIG. 11A, one board 906 is optically coupled to the port 99 from the first fiber optic connector 1024 (via a fiber optic cable) and each subsequent board 906 has its first fiber optic connector 1024 coupled to the second fiber optic connector 1026 of another one of the boards 906 (all via fiber optic cables). Indeed, as shown in FIG. 11A, if the boards 906 include a plurality of second fiber optic connectors 1026, the cascade is able to branch into a tree structure where single boards/modules 900 are optically coupled to a plurality of other boards/modules 900. At the same time, the boards/modules 900 are able to share power in the same manner in which they are optically coupled via the input power connector 1020 of one or more of the module 900 receiving power from a power source and one or more of the other modules 900 receiving power by coupling their input power connector 1020 to the output power connector 1022 of another one of the modules 900.

Figure 11B:
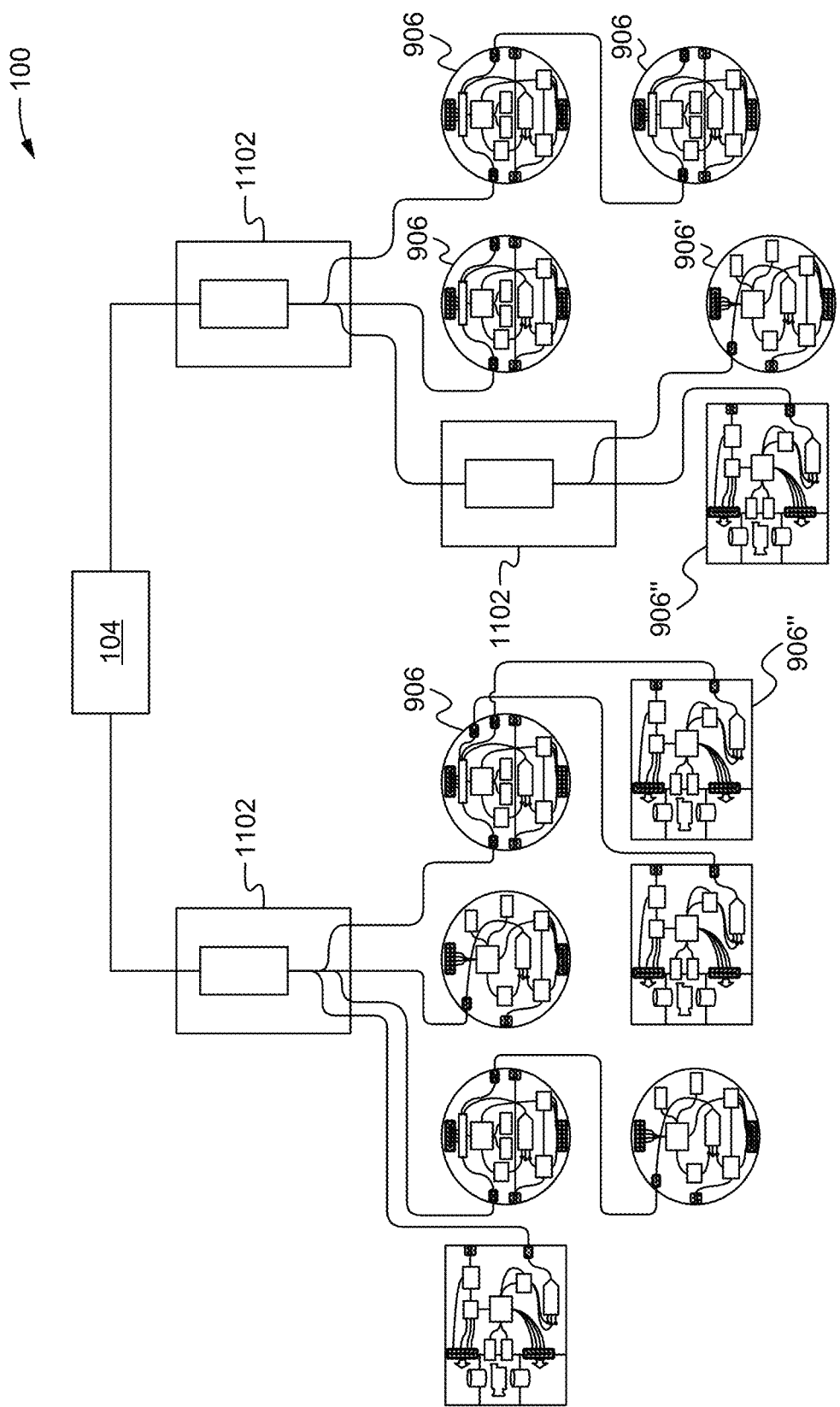

Alternatively, as shown in FIG. 11B, the control board 906' for a single-connection mode module 900 is able to not include the one or more second fiber optic connectors 1026 and/or the one or more output power connectors 1022. In some embodiments, as shown in FIG. 10C, the control board 906" for a single-connection mode image sensor module 900 is able to further comprise one or more compliant actuator motors 1028 along with one or more image or other types of sensors 1030 (e.g. cameras, LIDAR, magnetic, ultrasound, infrared, radio frequency). In such embodiments, the motors 1028 are able to control the movement of the sensors 1030 while the sensors 1016 detect the position and/or orientation of the motors 1028 and/or sensors 1030. Alternatively, the control board 906" is able to be a multi-connection mode image sensor module 900 further comprising the one or more second fiber optic connectors 1026 and/or the one or more output power connectors 1022.

As shown in FIG. 11A, these single-connection mode modules 900 and/or boards 906' and 906" are able to couple to the cascades or trees formed by the multi-connection mode modules 900 and/or couple in parallel to the bus 104. Additionally, as shown in FIG. 11B, the system 100 is able to comprise one or more external optical splitters 1102, wherein one or more of the boards/modules 906, 906', 906" configured into serial cascades, trees and/or in parallel are able to be further parallelized and/or serialized in the coupling to the bus 104 using the external optical splitter 1102. For example, as shown in FIG. 11B, an optical splitter 1102 is used to couple to a single port 99, the output of a cascade of modules 900, one or more individual modules 900 and another splitter 1102. Although as shown in FIG. 11B, the splitters 1102 are 1 to 4 splitters, they are able to be any ratio 1 to N as desired. Also although as shown in FIGS. 11A and 11B, only the modules 906, 906', 906" are shown as being coupled to the bus 104, it is understood that any combination of other devices 102 are also able to be coupled to the bus 104 along with the modules. For example, one or more controller devices 102 are able to be coupled to the bus 104 for receiving data and issuing commands to the modules.

As a result, the modules 900 provide the benefit of enabling super high throughput and data bandwidth and can support up to 10× to 100× of bandwidth and long distance compared to other modules. In particular, the ability to utilize optical communication along with serial cascading coupling allows the modules 900 to provide fast data transmission speed and super low latency without being disrupted by electromagnetic interference (EMI). Further, the modules 900 are particularly advantages in the field of robotics, industrial automation and self-driving vehicles due to its ability to handle their high bandwidth and low latency demands for sensor data.

Figure 12:
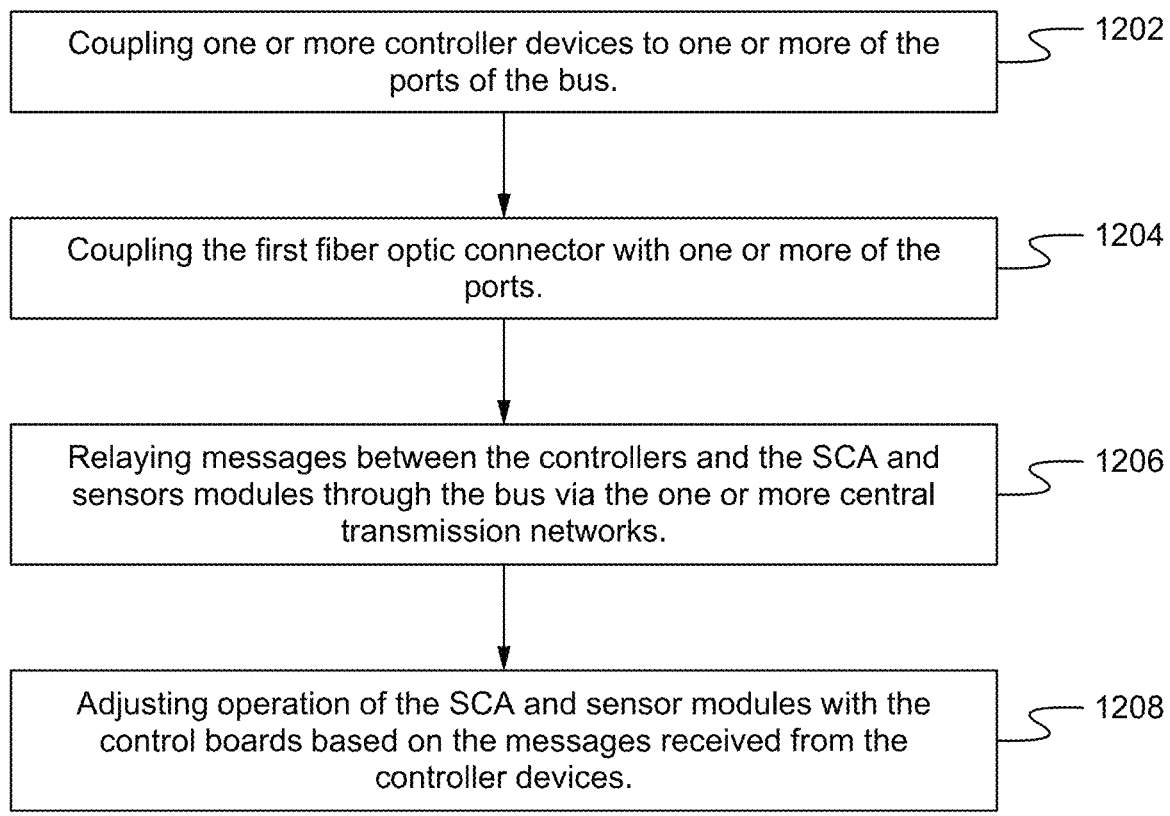
FIG. 12 illustrates a method of operating a controller and sensor bus according to some embodiments.

FIG. 12 illustrates a method of operating a controller and sensor bus including a plurality of ports for coupling with a plurality of external machine automation devices of a machine automation system according to some embodiments. As shown in FIG. 12, one or more controller devices 102 are coupled to one or more of the ports 99 of the bus 104 at the step 1202. The first fiber optic connector 1024 of one or more SCA and sensor modules 900 are coupled with one or more of the ports 99 at the step 1204. Messages are relayed between the controllers 104 and the SCA and sensor modules 900 through the bus 104 via the one or more central transmission networks 206 at the step 1206. The control boards 906 adjust operation of the SCA and sensor modules 900 based on the messages received from the controller devices 102 at the step 1208. In some embodiments, each of the SCA and sensor modules 900 is directly coupled in parallel to one of the ports 99 via the fiber optic cable. In some embodiments, coupling the SCA and sensor modules 900 includes coupling the SCA and sensor modules 900 in parallel to an optical splitter 1102 and coupling the optical splitter 1102 to the ports 99 via the fiber optic cable. In some embodiments, coupling the SCA and sensor modules 900 includes coupling the first fiber optic connector 1024 of a first of the SCA and sensor modules 900 to one of the ports 99 via the fiber optic cable and coupling the second fiber optic connector 1026 of the first of the SCA and sensor modules 900 to the first fiber optic connector 1024 of a second of the SCA and sensor modules 900.

The system 100 and machine automation controller and sensor bus 104 implementing a dynamic burst to broadcast transmission network has numerous advantages. Specifically, it provides the benefit of a simple cable system and connection; the elimination of significant EMI impacts due to the user of optical fiber cable; guaranteed low latency for node-to-node communication; high throughput bandwidth from node to node transmission (10, 25, 100 or greater Gbps); can extend and reach up to 20 km from node to node devices; low power consumption due to passive-optical-network architecture; industry grade QoS without traffic congestion due to centralized DBA scheduling mechanism; built-in HARQ mechanism to guarantee node-to-node and GEM transmission successful; and one unified software image for full intranet system including all gate, node and root ports enabling simplified software architecture, shorter product development cycle, and easier system level debug, monitoring and troubleshooting remotely.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims. For example, although as described herein the bus is described as operating within a machine automation system, it is understood that the bus is able to operate with other types of systems and devices thereof for facilitating the communication between the devices. Additionally, the discussion herein with regard to a particular type of node is able to refer to any of the types of nodes discussed herein including virtual nodes and gates acting on behalf as nodes. Further, it is understood that as described herein, operations performed by or for the nodes 204, 208, 234 are able to be operations performed by or for the devices 102 coupled to the nodes 204, 208, 234 (e.g. in concert with the nodes 204, 208, 234). Also, it is understood that operations are described herein with respect to a node 204 are able to apply to the other types of nodes 208, 234. Although described separately, it is understood that one or more of the elements of the core 200, root ports 230 and/or nodes 204, 208 of the error correction mechanism are able to be a part of an error correction engine of the core 200, the root ports 230 and/or the nodes 204, 208 that performs each of the functions of the individual elements.

What is claimed is:

1. A machine automation system for controlling and operating an automated machine including transmitting packets each having one or more destinations, the system comprising:
 a controller and sensor bus including:
  one or more transmission networks each including a plurality of leaf nodes, the leaf nodes each including a node forward error correction (FEC) engine and a node memory, wherein each of the one or more destinations is one of the leaf nodes;
  at least one central processing core including one or more root ports and a plurality of virtual output queues that are each assigned to a different assigned one of the destinations, each of the root ports having a root FEC engine and a root memory storing a mini-frame table; and
  a plurality of input/output ports each coupled with one of the leaf nodes; and
 a plurality of external machine automation devices each coupled to one of the leaf nodes via one or more of the ports coupled with the one of the leaf nodes, wherein the central processing core receives the packets from the leaf nodes and adds the packets to the virtual output queues whose assigned one of the destinations matches one of the destinations of the packet, and further wherein the root FEC engine of one of the root ports:
  combines a plurality of the packets into a payload of a single broadcast message;
  logically divides the payload into a plurality of mini-frames, each of the mini-frames including at least a portion of one or more of the plurality of the packets;
  populates the mini-frame table of the root port by, for each of the mini-frames, storing in the mini-frame table a unique mini-frame identifier paired with one or more node identifiers of the leaf nodes that are the destinations of the one or more of the plurality of the packets within the mini-frame;
  receives a mini-frame status message from at least one of the leaf nodes indicating which of the mini-frames had one or more uncorrectable FEC errors as received by the at least one of the nodes; and
  suspends transmission of the packets within the virtual output queues whose assigned destination is one of the leaf nodes identified by the node identifiers paired with the unique mini-frame identifiers that identify one of the mini-frames having at least one of the uncorrectable FEC errors.

2. The system of claim 1, wherein the root FEC engine of the one of the root ports suspends filling with more packets of the virtual output queues whose assigned destination is the one of the leaf nodes identified by the node identifiers paired with the unique mini-frame identifiers that identify the one of the mini-frames having the at least one of the uncorrectable FEC errors.

3. The system of claim 1, wherein the root FEC engine of the one of the root ports logically divides each of the mini-frames into a plurality of FEC blocks, applies an FEC algorithm to each of the FEC blocks and adds an FEC parity value to each of the FEC blocks resulting from the application of the FEC algorithm to that FEC block.

4. The system of claim 1, wherein the node FEC engine of one of the leaf nodes: combines a set of additional packets into another payload of a single burst message; logically divides the another payload into a plurality of additional mini-frames, each of the additional mini-frames including at least a portion of one or more of the set of the additional packets; logically divides each of the additional mini-frames into a plurality of additional FEC blocks; applies another FEC algorithm to each of the additional FEC blocks; and adds another FEC parity value to each of the additional FEC blocks resulting from the application of the another FEC algorithm to that additional FEC block.

5. The system of claim 1, wherein the uncorrectable FEC errors are errors indicated by one of the FEC parity values that cannot be corrected using the one of the FEC parity values.

6. The system of claim 1, wherein a payload of at least one of the packets is divided between two or more of the mini-frames.

7. The system of claim 1, wherein a payload of at least one of the packets is divided between two or more of the FEC blocks of one of the mini-frames.

8. The system of claim 3, wherein the root FEC engine of the one of the root ports selects the FEC algorithm from a plurality of stored FEC algorithms based on a quantity of packet data errors reported to the one of the root ports by the leaf nodes during a predetermined period.

9. The system of claim 4, wherein the node FEC engine of the one of the leaf nodes selects the another FEC algorithm from the plurality of stored FEC algorithms based on a size of a burst window granted to the one of the leaf nodes by the core, the burst window being a time period within which the single burst message is able to be transmitted to the core.

10. The system of claim 8, wherein the root FEC engine of the one of the root ports applies an Cyclic Redundancy Check (CRC) algorithm to each of the mini-frames and adds a CRC value resulting from the application of the CRC algorithm to that mini-frame.

11. The system of claim 10, wherein, for each of the mini-frames, one of the FEC blocks to which the FEC algorithm was applied includes the CRC value such that errors in the CRC value are indicated by the FEC parity value of the one of the FEC blocks.

12. A controller and sensor bus for receiving and transmitting packets each having one or more destinations, the bus comprising:
one or more transmission networks each including a plurality of leaf nodes, the leaf nodes each including a node forward error correction (FEC) engine and a node memory, wherein each of the one or more destinations is one of the leaf nodes; and
at least one central processing core including one or more root ports and a plurality of virtual output queues that are each assigned to a different assigned one of the destinations, each of the root ports having a root FEC engine and a root memory storing a mini-frame table;
wherein the central processing core receives the packets from the leaf nodes and adds the packets to the virtual output queues whose assigned one of the destinations matches one of the destinations of the packet, and further wherein the root FEC engine of one of the root ports:
combines a plurality of the packets into a payload of a single broadcast message;
logically divides the payload into a plurality of mini-frames, each of the mini-frames including at least a portion of one or more of the plurality of the packets;
populates the mini-frame table of the root port by, for each of the mini-frames, storing in the mini-frame table a unique mini-frame identifier paired with one or more node identifiers of the leaf nodes that are the destinations of the one or more of the plurality of the packets within the mini-frame;
receives a mini-frame status message from at least one of the leaf nodes indicating which of the mini-frames had one or more uncorrectable FEC errors as received by the at least one of the nodes; and
suspends transmission of the packets within the virtual output queues whose assigned destination is one of the leaf nodes identified by the node identifiers paired with the unique mini-frame identifiers that identify one of the mini-frames having at least one of the uncorrectable FEC errors.

13. The bus of claim 12, wherein the root FEC engine of the one of the root ports suspends filling with more packets of the virtual output queues whose assigned destination is the one of the leaf nodes identified by the node identifiers paired with the unique mini-frame identifiers that identify the one of the mini-frames having the at least one of the uncorrectable FEC errors.

14. The bus of claim 12, wherein the root FEC engine of the one of the root ports logically divides each of the mini-frames into a plurality of FEC blocks, applies an FEC algorithm to each of the FEC blocks and adds an FEC parity value to each of the FEC blocks resulting from the application of the FEC algorithm to that FEC block.

15. The bus of claim 12, wherein the node FEC engine of one of the leaf nodes: combines a set of additional packets into another payload of a single burst message; logically divides the another payload into a plurality of additional mini-frames, each of the additional mini-frames including at least a portion of one or more of the set of the additional packets; logically divides each of the additional mini-frames into a plurality of additional FEC blocks; applies another FEC algorithm to each of the additional FEC blocks; and adds another FEC parity value to each of the additional FEC blocks resulting from the application of the another FEC algorithm to that additional FEC block.

16. The bus of claim 12, wherein the uncorrectable FEC errors are errors indicated by one of the FEC parity values that cannot be corrected using the one of the FEC parity values.

17. The bus of claim 12, wherein a payload of at least one of the packets is divided between two or more of the mini-frames.

18. The bus of claim 12, wherein a payload of at least one of the packets is divided between two or more of the FEC blocks of one of the mini-frames.

19. The bus of claim 14, wherein the root FEC engine of the one of the root ports selects the FEC algorithm from a plurality of stored FEC algorithms based on a quantity of packet data errors reported to the one of the root ports by the leaf nodes during a predetermined period.

20. The bus of claim 15, wherein the node FEC engine of the one of the leaf nodes selects the another FEC algorithm from the plurality of stored FEC algorithms based on a size of a burst window granted to the one of the leaf nodes by the core, the burst window being a time period within which the single burst message is able to be transmitted to the core.

21. The bus of claim 19, wherein the root FEC engine of the one of the root ports applies an Cyclic Redundancy Check (CRC) algorithm to each of the mini-frames and adds a CRC value resulting from the application of the CRC algorithm to that mini-frame.

22. The bus of claim 21, wherein, for each of the mini-frames, one of the FEC blocks to which the FEC algorithm was applied includes the CRC value such that errors in the CRC value are indicated by the FEC parity value of the one of the FEC blocks.

23. A central processing core of a controller and sensor bus for receiving and transmitting packets each having one or more destinations and including one or more transmission networks each including a plurality of leaf nodes, the central core comprising:

at least one central processing unit; and
a non-transitory computer readable memory storing one or more root ports and a plurality of virtual output queues that are each assigned to a different assigned one of the destinations, each of the root ports having a root forward error correction (FEC) engine and a mini-frame table, wherein when executed by the central processing unit the root FEC engine:
receives the packets from the leaf nodes;
adds the packets to the virtual output queues whose assigned one of the destinations matches one of the destinations of the packet;
combines a plurality of the packets into a payload of a single broadcast message;
logically divides the payload into a plurality of mini-frames, each of the mini-frames including at least a portion of one or more of the plurality of the packets;
populates the mini-frame table by, for each of the mini-frames, storing in the mini-frame table a unique mini-frame identifier paired with one or more node identifiers of the leaf nodes that are the destinations of the one or more of the plurality of the packets within the mini-frame;
receives a mini-frame status message from at least one of the leaf nodes indicating which of the mini-frames had one or more uncorrectable FEC errors as received by the at least one of the nodes; and
suspends transmission of the packets within the virtual output queues whose assigned destination is one of the leaf nodes identified by the node identifiers paired with the unique mini-frame identifiers that identify one of the mini-frames having at least one of the uncorrectable FEC errors.

24. The central processing core of claim 23, wherein the root FEC engine of the one of the root ports suspends filling with more packets of the virtual output queues whose assigned destination is the one of the leaf nodes identified by the node identifiers paired with the unique mini-frame identifiers that identify the one of the mini-frames having the at least one of the uncorrectable FEC errors.

25. The bus of claim 23, wherein the root FEC engine of the one of the root ports logically divides each of the mini-frames into a plurality of FEC blocks, applies an FEC algorithm to each of the FEC blocks and adds an FEC parity value to each of the FEC blocks resulting from the application of the FEC algorithm to that FEC block.

26. The central processing core of claim 23, wherein the uncorrectable FEC errors are errors indicated by one of the FEC parity values that cannot be corrected using the one of the FEC parity values.

27. The central processing core of claim 23, wherein a payload of at least one of the packets is divided between two or more of the mini-frames.

28. The central processing core of claim 23, wherein a payload of at least one of the packets is divided between two or more of the FEC blocks of one of the mini-frames.

29. The central processing core of claim 25, wherein the root FEC engine of the one of the root ports selects the FEC algorithm from a plurality of stored FEC algorithms based on a quantity of packet data errors reported to the one of the root ports by the leaf nodes during a predetermined period.

30. The central processing core of claim 29, wherein the root FEC engine of the one of the root ports applies an Cyclic Redundancy Check (CRC) algorithm to each of the mini-frames and adds a CRC value resulting from the application of the CRC algorithm to that mini-frame.

31. The central processing core of claim 30, wherein, for each of the mini-frames, one of the FEC blocks to which the FEC algorithm was applied includes the CRC value such that errors in the CRC value are indicated by the FEC parity value of the one of the FEC blocks.

32. A leaf node of a controller and sensor bus for transmitting packets each having one or more destinations and including one or more transmission networks coupling a central processing core with a plurality of input/output (IO) ports, the leaf node comprising:
at least one node switch; and
a non-transitory computer readable memory storing a node forward error correction (FEC) engine, wherein when executed by the node switch the node FEC engine:
receives the packets from the IO ports;
combines a plurality of the packets into a payload of a single burst message;
logically divides the payload into a plurality of FEC blocks;
applies an FEC algorithm to each of the FEC blocks; and
adds an FEC parity value to each of the FEC blocks resulting from the application of the FEC algorithm to that FEC block.

33. The leaf node of claim 32, wherein when executed by the node switch the node FEC engine:
receives a burst window from the central processing core indicating time period within which the single burst message is able to be transmitted to the core; and
selects the FEC algorithm from the plurality of stored FEC algorithms based on a size of the burst window.

34. The leaf node of claim 32, wherein when executed by the node switch the node FEC engine selects the FEC algorithm from a plurality of stored FEC algorithms based on a quantity of packet data errors reported to the node FEC engine by the central processing core during a predetermined period.

35. The leaf node of claim 34, wherein when executed by the node switch the node FEC engine:
logically divides the payload into a plurality of mini-frames, each of the mini-frames including at least a portion of one or more of the plurality of the packets; and
applies an Cyclic Redundancy Check (CRC) algorithm to each of the mini-frames and adds a CRC value resulting from the application of the CRC algorithm to that mini-frame.

36. The leaf node of claim 35, wherein, for each of the mini-frames, one of the FEC blocks to which the FEC algorithm was applied includes the CRC value such that errors in the CRC value are indicated by the FEC parity value of the one of the FEC blocks.

37. The leaf node of claim 36, wherein a payload of at least one of the packets is divided between two or more of the mini-frames.

38. The leaf node of claim 37, wherein a payload of at least one of the packets is divided between two or more of the FEC blocks of one of the mini-frames.

39. A method of operating a controller and sensor bus for transmitting packets each having one or more destinations, the bus including a central processing core and one or more transmission networks, the networks each including a plurality of leaf nodes having a node forward error correction (FEC) engine and a node memory, the core including one or more root ports and a plurality of virtual output queues that are each assigned to a different assigned one of the destinations, wherein each of the root ports having a root FEC engine and a root memory storing a mini-frame table and each of the one or more destinations is one of the leaf nodes, the method comprising:

receiving the packets from the leaf nodes and adding the packets to the virtual output queues whose assigned one of the destinations matches one of the destinations of the packet with the central processing core; and with the root FEC engine of one of the root ports:
combining a plurality of the packets into a payload of a single broadcast message;
logically dividing the payload into a plurality of mini-frames, each of the mini-frames including at least a portion of one or more of the plurality of the packets;
populating the mini-frame table of the root port by, for each of the mini-frames, storing in the mini-frame table a unique mini-frame identifier paired with one or more node identifiers of the leaf nodes that are the destinations of the one or more of the plurality of the packets within the mini-frame;
receiving a mini-frame status message from at least one of the leaf nodes indicating which of the mini-frames had one or more uncorrectable FEC errors as received by the at least one of the nodes; and
suspending transmission of the packets within the virtual output queues whose assigned destination is one of the leaf nodes identified by the node identifiers paired with the unique mini-frame identifiers that identify one of the mini-frames having at least one of the uncorrectable FEC errors.

40. The method of claim 39, further comprising, with the root FEC engine of the one of the root ports, suspending filling with more packets of the virtual output queues whose assigned destination is the one of the leaf nodes identified by the node identifiers paired with the unique mini-frame identifiers that identify the one of the mini-frames having the at least one of the uncorrectable FEC errors.

41. The method of claim 39, further comprising, with the root FEC engine of the one of the root ports:
logically dividing each of the mini-frames into a plurality of FEC blocks;
applying an FEC algorithm to each of the FEC blocks; and
adding an FEC parity value to each of the FEC blocks resulting from the application of the FEC algorithm to that FEC block.

42. The method of claim 39, further comprising, with the node FEC engine of one of the leaf nodes:
combining a set of additional packets into another payload of a single burst message;
logically dividing the another payload into a plurality of additional mini-frames, each of the additional mini-frames including at least a portion of one or more of the set of the additional packets;
logically dividing each of the additional mini-frames into a plurality of additional FEC blocks; applies another FEC algorithm to each of the additional FEC blocks; and
adding another FEC parity value to each of the additional FEC blocks resulting from the application of the another FEC algorithm to that additional FEC block.

43. The method of claim 41, further comprising, with the root FEC engine of the one of the root ports, selecting the FEC algorithm from a plurality of stored FEC algorithms based on a quantity of packet data errors reported to the one of the root ports by the leaf nodes during a predetermined period.

44. The method of claim 42, further comprising, with the node FEC engine of one of the leaf nodes, selecting the another FEC algorithm from the plurality of stored FEC algorithms based on a size of a burst window granted to the one of the leaf nodes by the core, the burst window being a time period within which the single burst message is able to be transmitted to the core.

45. The method of claim 43, further comprising, with the root FEC engine of the one of the root ports, applying a Cyclic Redundancy Check (CRC) algorithm to each of the mini-frames and adds a CRC value resulting from the application of the CRC algorithm to that mini-frame.

46. The method of claim 45, wherein, for each of the mini-frames, one of the FEC blocks to which the FEC algorithm was applied includes the CRC value such that errors in the CRC value are indicated by the FEC parity value of the one of the FEC blocks.

* * * * *